US009948087B2

(12) United States Patent
Haines et al.

(10) Patent No.: US 9,948,087 B2
(45) Date of Patent: Apr. 17, 2018

(54) PROTECTIVE DEVICE FOR AN ELECTRICAL SUPPLY FACILITY

(71) Applicant: Pass & Seymour, Inc., Syracuse, NY (US)

(72) Inventors: Joshua Paul Haines, Marcellus, NY (US); Kent R. Morgan, Groton, NY (US); Brian Mueller, Cortland, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 444 days.

(21) Appl. No.: 13/793,135

(22) Filed: Mar. 11, 2013

(65) Prior Publication Data

US 2014/0254050 A1   Sep. 11, 2014
US 2017/0054286 A9   Feb. 23, 2017

Related U.S. Application Data

(63) Continuation of application No. 12/719,416, filed on Mar. 8, 2010, now Pat. No. 8,405,939.

(51) Int. Cl.
| H02H 3/00 | (2006.01) |
| H02H 3/16 | (2006.01) |
| G01R 31/327 | (2006.01) |
| G01R 31/02 | (2006.01) |
| H02H 5/10 | (2006.01) |

(52) U.S. Cl.
CPC ........... *H02H 3/162* (2013.01); *G01R 31/026* (2013.01); *G01R 31/3277* (2013.01); *H02H 3/16* (2013.01); *H02H 5/105* (2013.01)

(58) Field of Classification Search
USPC ...................................................... 361/42, 46
See application file for complete search history.

(56) References Cited

U.S. PATENT DOCUMENTS

| 3,555,360 A | 1/1971 | Lee et al. |
| 3,558,980 A | 1/1971 | Florance et al. |
| 3,697,808 A * | 10/1972 | Lee ..................... A61B 5/0424 |
| | | 361/46 |

(Continued)

FOREIGN PATENT DOCUMENTS

FR    2701176 A1    1/1993

*Primary Examiner* — Ronald W Leja
(74) *Attorney, Agent, or Firm* — Bond Schoeneck & King, PLLC; George McGuire; Frederick Price

(57) ABSTRACT

The present invention is directed to a protective device configured to be coupled between an AC power source and an electrical load. A ground continuity monitor is coupled to the ground conductor, the ground continuity monitor being configured to detect a ground discontinuity condition in the ground conductor. A circuit interrupter mechanism is configured to interrupt electrical continuity in a tripped state and establish electrical continuity in a reset state. A self-test circuit is coupled to the ground continuity monitor and configured to perform a simulated ground continuity test that simulates the ground discontinuity condition. The self-test circuit provides a test failure signal when the ground continuity monitor fails to provide an output signal in response to the simulated ground continuity test. The test failure signal is configured to trip the circuit interrupter mechanism.

45 Claims, 24 Drawing Sheets

(56) References Cited

U.S. PATENT DOCUMENTS

| | | | |
|---|---|---|---|
| 3,995,200 A * | 11/1976 | Stolarczyk | H02H 11/001 361/113 |
| 4,138,707 A | 2/1979 | Gross | |
| 4,685,022 A | 8/1987 | Nichols, III et al. | |
| 5,051,732 A | 9/1991 | Robitaille | |
| 5,426,552 A | 6/1995 | Avitan | |
| 5,659,237 A | 8/1997 | Divan et al. | |
| 5,659,240 A | 8/1997 | King | |
| 5,726,900 A | 3/1998 | Walter et al. | |
| 5,747,980 A | 5/1998 | Gershen | |
| 5,754,114 A | 5/1998 | Gnadt | |
| 5,847,523 A * | 12/1998 | Rappenecker | H02H 7/0855 318/400.11 |
| 5,926,004 A | 7/1999 | Henze | |
| 5,949,197 A | 9/1999 | Kastner | |
| 6,031,354 A | 2/2000 | Wiley et al. | |
| 6,040,967 A | 3/2000 | DiSalvo | |
| 6,278,596 B1 | 8/2001 | Simpson | |
| 6,304,089 B1 | 10/2001 | Paulson et al. | |
| 6,310,465 B2 | 10/2001 | Najima | |
| 6,356,049 B2 | 3/2002 | Oguri | |
| 6,381,113 B1 | 4/2002 | Legatti | |
| 6,437,951 B1 | 8/2002 | Ahlstrom et al. | |
| 6,538,420 B2 | 3/2003 | Bald et al. | |
| 6,594,129 B1 | 7/2003 | Baba et al. | |
| 6,631,063 B2 | 10/2003 | Ortiz et al. | |
| 6,678,132 B1 | 1/2004 | Carruthers et al. | |
| 6,807,035 B1 | 10/2004 | Baldwin et al. | |
| 6,833,708 B2 | 12/2004 | Furukawa | |
| 6,917,180 B2 | 7/2005 | Harrison et al. | |
| 6,937,452 B2 | 8/2005 | Chan et al. | |
| 6,963,186 B2 | 11/2005 | Hobbs | |
| 6,970,807 B2 | 11/2005 | Kito et al. | |
| 6,984,988 B2 | 1/2006 | Yamamoto | |
| 7,031,126 B2 | 4/2006 | Bonilla et al. | |
| 7,075,311 B1 | 7/2006 | Oshiro et al. | |
| 7,149,065 B2 | 12/2006 | Baldwin et al. | |
| 7,161,355 B1 | 1/2007 | Kawamura | |
| 7,184,250 B2 | 2/2007 | Bonilla et al. | |
| 7,292,042 B2 | 11/2007 | Morita et al. | |
| 7,315,227 B2 | 1/2008 | Huang et al. | |
| 7,315,437 B2 | 1/2008 | Bonilla et al. | |
| 7,317,600 B2 | 1/2008 | Huang et al. | |
| 7,336,457 B2 | 2/2008 | Liscinsky, III | |
| 7,362,551 B2 | 4/2008 | Bax et al. | |
| 7,375,940 B1 | 5/2008 | Bertrand | |
| 7,408,432 B2 | 8/2008 | Shi | |
| 7,411,371 B2 | 8/2008 | Hobbs | |
| 7,414,818 B2 | 8/2008 | Shi | |
| 7,434,636 B2 | 10/2008 | Sutherland | |
| 7,443,309 B2 | 10/2008 | Baldwin et al. | |
| 7,443,645 B2 | 10/2008 | Ohshima | |
| 7,504,743 B2 | 3/2009 | Matsumoto et al. | |
| 7,551,412 B2 | 6/2009 | Winch | |
| 7,558,034 B2 | 7/2009 | Bonasia et al. | |
| 7,560,935 B2 | 7/2009 | Morimoto | |
| 7,576,519 B2 | 8/2009 | Basic et al. | |
| 8,289,664 B2 * | 10/2012 | Haines | B60L 3/0069 361/42 |
| 8,335,062 B2 * | 12/2012 | Haines | H02H 3/00 320/109 |
| 8,405,939 B2 * | 3/2013 | Haines | H02H 9/00 361/42 |
| 2005/0002213 A1 | 1/2005 | Komori et al. | |
| 2006/0103390 A1 | 5/2006 | Simmons et al. | |
| 2007/0030608 A1 | 2/2007 | Baldwin et al. | |
| 2007/0035898 A1 | 2/2007 | Baldwin et al. | |
| 2007/0146945 A1 | 6/2007 | Zhang et al. | |
| 2007/0146946 A1 | 6/2007 | Chen et al. | |
| 2007/0146947 A1 | 6/2007 | Zhang et al. | |
| 2007/0164750 A1 | 7/2007 | Chen et al. | |
| 2007/0188949 A1 | 8/2007 | Bonilla et al. | |
| 2007/0201170 A1 * | 8/2007 | Hooper | 361/42 |
| 2007/0210651 A1 | 9/2007 | Ichinose et al. | |
| 2007/0210805 A1 | 9/2007 | Kawamura | |
| 2007/0262780 A1 | 11/2007 | Mernyk et al. | |
| 2008/0002314 A1 | 1/2008 | Batko et al. | |
| 2009/0015976 A1 | 1/2009 | Hara et al. | |
| 2009/0160663 A1 | 6/2009 | Silverman et al. | |
| 2009/0167537 A1 | 7/2009 | Feliss et al. | |
| 2009/0179655 A1 | 7/2009 | Trenchs Magana et al. | |
| 2009/0204268 A1 | 8/2009 | Eaves | |
| 2009/0251148 A1 | 10/2009 | Finlay, Sr. et al. | |
| 2009/0287578 A1 | 11/2009 | Paluszek et al. | |
| 2009/0301801 A1 | 12/2009 | Fujitake | |
| 2009/0323239 A1 | 12/2009 | Markyvech | |
| 2011/0216451 A1 * | 9/2011 | Haines et al. | 361/42 |
| 2014/0254050 A1 * | 9/2014 | Haines | G01R 31/3277 361/42 |

* cited by examiner

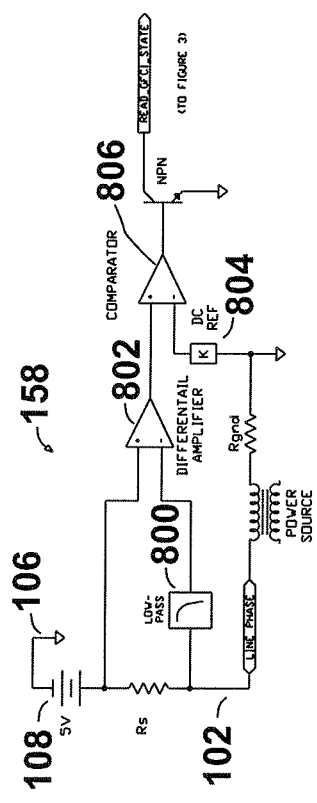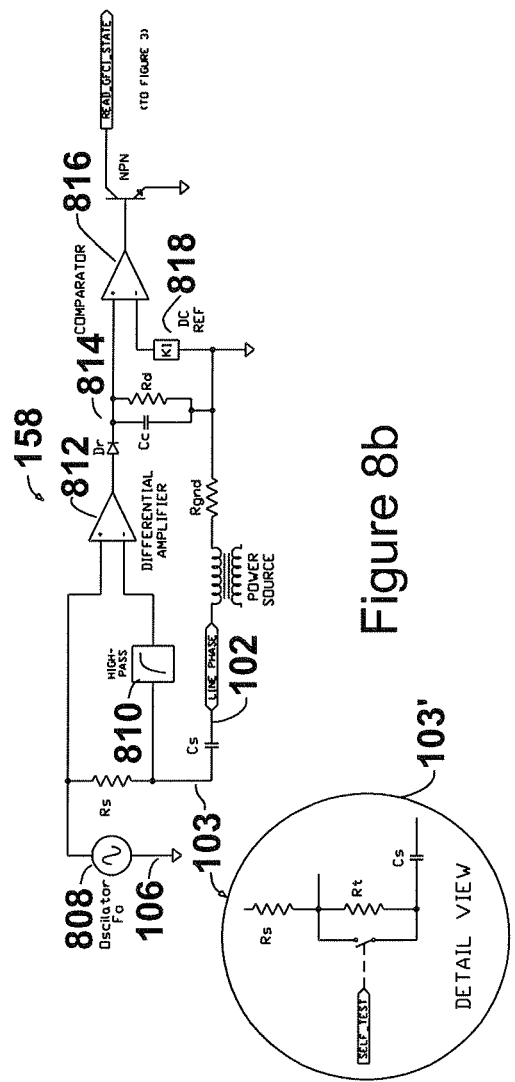
Figure 8a
Figure 8b

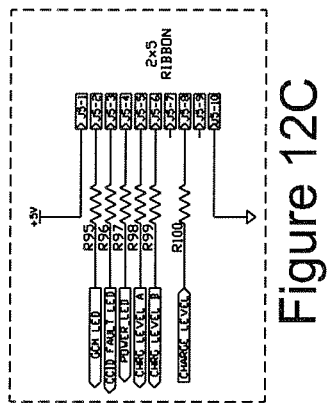
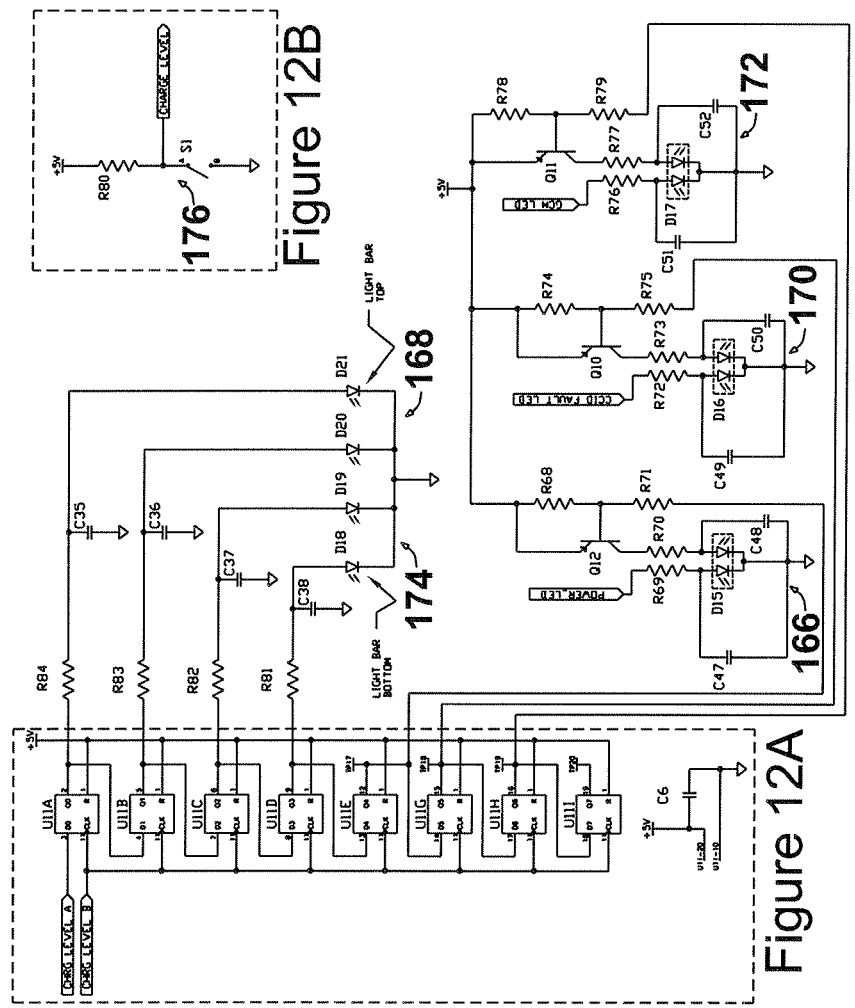

PROTECTIVE DEVICE FOR AN ELECTRICAL SUPPLY FACILITY

RELATED APPLICATIONS

This is a continuation of U.S. patent application Ser. No. 12/719,416 filed on Mar. 8, 2010, the content of which is relied upon and incorporated herein by reference in its entirety

BACKGROUND OF THE INVENTION

1. Field of the Invention

The present invention relates generally to a system for charging electric vehicles, and particularly to a safe electric vehicle supply station with fault protection features.

2. Technical Background

Electric vehicles are becoming increasingly popular due to the rising cost of petroleum, the air pollution related to the use of petroleum based fuels, and the growing awareness that the supply of oil and gas is limited. In fact, there are some projections that indicate that the supply of oil and gas could be depleted in the near term. The advantages, therefore, of an electric vehicle over a conventional gas-powered vehicle are plainly recognized. On the other hand, there are difficulties associated with the electric vehicle that must be overcome before they become an efficient and effective replacement for conventional gas-powered vehicles. For example, conventional gas-powered vehicle are easily refueled within a few minutes. Electric vehicles typically employ batteries that may take hours to recharge. What is needed, therefore, is an infrastructure that includes readily available electric vehicle charging stations that may be accessed when the vehicle is at a parking location, e.g., at home, work, shopping, or at other such locations.

Electric vehicle (EV) charging stations may be configured to conform to a variety of form factors resembling known devices such as parking meters, filling station dispensers, residential charging units, etc. In each of these contemplated embodiments, the EV charging station provides the EV with electricity via an existing electrical distribution system. Accordingly, what is needed is an EV charging station that includes protective circuitry that prevents a user from experiencing shock or electrocution in the event of a fault condition.

The term electrical distribution system refers to the system employed to deliver AC power to a user from an AC power source (e.g., a utility company access point). An electrical distribution system typically includes at least one phase (hot) wire, a neutral wire and a ground wire. For example, a 120 VAC electrical distribution system typically includes a phase wire, a neutral wire, and a ground wire. A distribution system may also be configured as 240 VAC and 277 VAC systems. A 240 VAC system includes two phase (hot) conductors. Electrical distribution systems may include up to three phase conductors. In this case, the electrical power signals propagating on the conductors are 120° out of phase with respect to the signals propagating on the other phase conductors. From a mechanical perspective, the electrical distribution system may be implemented using a cable that bundles the wires together within exterior sheathing. The wires may also be disposed in rigid or flexible conduits. The ground conductor is connected to earth ground at the origin of the electrical distribution system, typically near an electrical distribution panel. The neutral wire, if provided, is very often also connected to earth ground at this point.

As an initial point, the terms "upstream" and "downstream" are defined as follows. Progressing through a branch circuit in a direction from the main breaker panel to a load is referred to as the "downstream" direction. The opposite direction, i.e., from a point in a branch circuit toward the main breaker panel, is referred to as the "upstream" direction.

The ground wire is an important safety feature in the system. The phase and neutral wires provide electrical power to motors, circuitry, lighting and various appliance loads. The ground wire and grounded portions of an appliance, on the other hand, are electrically isolated from the phase and neutral conductors such that little or no current normally flows in the ground wire. The grounding circuit is implemented by electrically connecting the ground wire to the appliance's metallic sheathing (if provided) or to one or more conductive surfaces within the appliance. The grounding circuit keeps the metallic appliance enclosure, or other such connected portions of the appliance, at or near ground potential to prevent the user from being electrocuted or from receiving an electrical shock. The grounding circuit comes into play in several scenarios. For example, the phase circuit wire insulation may become damaged such that the phase conductor contacts the grounded circuit. As another example, a miswiring condition may occur such that the phase conductor is improperly connected to the ground wire. In each of these cases, the ground path safely directs the resulting and potentially harmful currents to ground to eliminate any shock hazard.

The grounding circuit may also be safeguarded by the use of various types of protective devices such as over-current devices, ground fault circuit interrupters (GFCIs), arc fault circuit interrupters (AFCIs) and combination GFCIs/AFCIs. These devices may be disposed in the electrical distribution system at various locations. For example, protective devices may be employed in the distribution panel, electrical receptacles, wall outlets, portable housings, power interconnect devices, or electrical plugs.

An overcurrent device is responsive to the amount of phase current propagating in the circuit. This type of device limits the amount of current (amperage) being directed to a load, or multiple loads in combination. Many overcurrent devices are typically configured to interrupt a current that is greater than 15 Amperes. Other devices may have a 20 Ampere rating. Of course, overcurrent devices are configured to detect currents propagating to ground.

AFCIs have a different function. Unlike overcurrent devices, AFCIs are adept at detecting intermittent currents that arise from sputtering arc fault conditions. An arc fault is a discharge of electricity between two or more conductors and may be caused by damaged insulation on a hot line conductor or a neutral line conductor, or on both a hot line conductor and a neutral line conductor. The damaged insulation may cause a low power arc between the two conductors and a fire may result. An arc fault usually manifests itself as a high frequency current signal characterized by a particular signature. An arc fault signal typically includes a concentration of energy in certain frequency bands. Thus, an arc fault circuit interrupter (AFCI) protects the electric circuit in the event of an arc fault. Accordingly, an AFCI may be configured to detect various high frequency signals, i.e., the signature, and de-energize the electrical circuit in response thereto.

A ground fault is a condition that occurs when a current carrying (hot) conductor contacts ground to create an unintended current path. The unintended current path represents an electrical shock hazard. A ground fault may also result in fire. A ground fault may occur for several reasons. If the wiring insulation within a load circuit becomes damaged, the hot conductor may contact ground, creating a shock hazard for a user. A ground fault may also occur when equipment comes in contact with water. A ground fault may also be caused by damaged insulation within the electrical distribution system. A ground fault circuit interrupter (GFCI) is specifically designed to detect currents to ground. GFCIs differ from overcurrent devices because they detect much smaller currents. GFCIs are typically rated to interrupt leakages to ground that are greater than 6 mA. A charging circuit interrupting device (CCID) is a GFCI that trips at a predetermined threshold, 20 mA being typical. There are other devices, e.g., Ground Fault Equipment Protectors (GFEPs), which are configured to interrupt the circuit (to remove the fault) when the ground fault is greater than 30 mA. All of these devices serve to interrupt fault currents propagating in the ground circuit before the ground wire becomes overheated, or is compromised by an open circuit condition. An open circuit in the ground path, therefore, represents an electrical shock hazard because the current flowing in the ground wire cannot flow to ground when the ground wire is broken. Instead, the current will seek the best available path to ground and, unfortunately, the best available path to ground might include a human being. Accordingly, a device commonly referred to as a ground continuity monitor (GCM) may be employed to determine if the ground conductor is intact.

In one approach that has been considered, a GCM is configured to provide an indication means that communicates to the user whether the circuit is grounded or not. One drawback to the considered approach is that the GCM allows power to be provided to a load in the presence of a miswired condition or absence of a ground conductor.

In another approach that has been considered, GCM circuitry may be connected to the hot, neutral and ground conductors for various reasons. One drawback to this approach is that the interconnected circuitry may provide a leakage path. As noted above, conductive portions of appliances (such as metallic outer sheathing) are typically connected to the ground prong of the corded plug set to provide a path to ground. If the ground prong of a corded appliance is inserted into the ground terminal of a receptacle and the ground conductor is not present, or is compromised in some way, a leakage current is able to flow through a person contacting the conductive portions of the appliance. Of course, this represents a shock hazard. Clearly, overcurrent issues, ground fault and/or ground continuity issues must be taken into account in EV charging stations.

There is an additional layer of complexity when one considers that each branch circuit in an electrical distribution system may be protected by a plurality of protective devices (e.g., overcurrent devices, GFCIs, AFCIs, etc.). When multiple protective devices are connected in series, it is preferable that the device furthest downstream from the main breaker panel perform the protective task. With respect to overcurrent devices, each branch circuit in the electrical distribution system is commonly protected by a plurality of overcurrent devices (e.g., fuses, breakers, etc.). For example, a main breaker panel includes a main breaker that may be employed to interrupt the main AC power source provided by the utility company. The breaker panel, of course, divides the AC power source into a plurality of branch circuits. Each branch circuit is provided with its own individual circuit breaker or fuse. The branch circuit breaker is also located in the main breaker panel. In some applications, a branch circuit may be configured to provide power to a remotely located subpanel. In this case, the circuit splits into sub-circuits at the sub-panel by way of additional circuit breakers. In any event, the branch circuit provides power to wiring devices, power taps, power strips, appliances and dedicated loads. Some of these devices may include additional over-current capability. Similar issues arise with GFCIs in that they are also commonly located throughout the electrical distribution system in panels, wiring device wall boxes, attachment plugs, and appliance cords. Accordingly, there may be circuits that include multiple GFCIs disposed in series. In the event of a fault condition, the GFCIs could be detecting the same ground fault condition.

One reason for the strategy of using the device furthest downstream is that it is usually the one closest to the user. Resetting a device in the room where the user is located in preferable to walking down to the basement where the main panel is typically located. Furthermore, the downstream device limits power interruption to a relatively smaller portion of the branch circuit where the fault hazard is located. This means that only a small part of the circuit is interrupted; AC power continues to be provided to the majority of electrical distribution system.

In one approach that has been considered for implementing this strategy, the time-current curves of the devices in the circuit are coordinated. Regarding overcurrent devices, the main breaker is chosen to have a higher trip threshold ($I_1$) when compared to the downstream circuit breakers ($I_2$), i.e., $I_1 > I_2$. The downstream device is the only one that responds to overcurrents less than ($I_1$) Amperes. Thus, the downstream device would have a faster interruption time than the upstream device. The downstream device could also interrupt certain overcurrents that are greater than ($I_1$) Amperes. A downstream ground fault device is usually implemented using a GFCI that trips at 6 mA. Thus, the downstream GFCI trips when the differential current is between 6 mA and the trip threshold of the upstream device and the upstream device would not trip. The 6 mA GFCI device may be chosen to have faster interruption times than the upstream device, in which case, the GFCI could also interrupt some currents that are greater than the trip threshold of the upstream device before the upstream device had the ability to react. An upstream GFEP device would be selected, therefore, to have a comparatively greater differential current interruption threshold, typically a value within the range of about 30 mA to several amperes. This device is intended to interrupt ground faults that have high energy; if faults of this type are allowed to persist, they would cause damage to equipment or wiring, and could lead to a fire.

Proposed EV charging stations must be equipped with attachment wires that are terminated to the branch circuit wiring inside a junction box. Alternatively, the charging station may include an attachment plug that plugs into an electrical receptacle disposed in the branch circuit. These have been referred to as "traveler sets." At the same time, electric vehicles (EVs) include a battery assembly that is configured to provide power to the vehicle's drive train. When the stored energy in the battery is depleted, the battery must be recharged. Thus, the EV may be equipped with a power cord that is coupled to the battery assembly inside the vehicle. The other end of the power cord includes a user accessible attachment plug that mates with the EV recharging station, and, by extension, to the electrical distribution system. Like traditional vehicles powered by internal combustion engines, an EV is enclosed and shaped by a metallic body that is connected to a metallic frame. The EV frame and body are substantially isolated from ground by rubber tires. Should there be a discontinuity in the ground circuit, the risk of shock or electrocution from contacting an energized EV body or frame is considerably greater than the risks associated with an ordinary appliance by virtue of the extensive surface area of the EV body.

In light of the ground continuity issues, ground fault and arc fault issues, and the presence of multiple protective devices in a given circuit, the introduction of electrical vehicles into the market will place new safety demands on the traditional electrical distribution system. What is needed, therefore, are EV charging stations that are configured to safely provide electricity to electrical vehicles from existing electrical distribution systems.

For example, it should be expected that EV users will attempt to repair or replace the EV's power cord or attachment plug because of the wear and tear on the power cord after repeated usage. In the process, it is possible to transpose the neutral and ground conductors or transpose the phase and ground conductors. Thus, the grounding path from an EV charging station to the electrical distribution system must be reliable.

Another issue relates to protecting the EV user from the risk of shock during the recharging cycle. One must keep in mind that the EV body represents a very large conductive surface that is in contact with both the driver and passengers on a daily basis. Further, the body is electrically isolated from ground by the vehicle's tires. The EV, as well as the high frequency circuitry associated with the on-board battery charging circuit, is constantly being exposed to mechanical shock, vibration, moisture and dirt. These factors may increase the risk of discontinuity in the ground connection. On the other hand, during normal operation of the electric vehicle there is high frequency noise generated by the switch mode power supply, and currents may be directed to ground via electronic noise filters or other such circuitry. Accordingly, Underwriters Laboratories has established a new category of personnel protection equipment known as the charging circuit interrupting device (CCID) whose trip threshold is 20 mA, if a ground circuit is verified to be present (by a ground continuity monitor). Even though these currents are safe, they will cause an ordinary 6 mA GFCI to nuisance trip, i.e., an interruption of the charging cycle for non-fault related reasons. UL has included other stipulations in the construction of the charging station and the electric vehicle to compensate for what would otherwise represent a loss in safety.

One of the drawbacks associated with the CCID relates to the aforementioned fact that when multiple protective devices are connected in series, it is preferable that the furthest downstream device perform the protective task. The furthest downstream GFCIs are rated at 6 mA, and are disposed upstream of the EV charging station. This represents an inherent mismatch for an EV charging station protected at 20 mA. To be clear, one should understand that the National Electrical Code (NEC) has established safety requirements for the electrical distribution system that cannot be ignored. The NEC has a requirement that at least some receptacles in the electrical distribution system be provided with GFCI protection. Thus, the presence of EV charging station violates the established device coordination protocol of placing less sensitive protective devices upstream of the relatively sensitive 6 mA GFCIs. Because these GFCIs are upstream of the EV charging station they would have a propensity to nuisance trip. There is also the aforementioned inconvenience of having to walk down to the basement to reset the tripped device before recommencing the charging cycle. Obviously for this type of scenario the traditional coordination of devices is not an option.

What is needed is a protected EV charging station, or a protection device for use with an EV charging station that addresses the needs described above. An EV protection device is needed, whether it is incorporated into the EV charging station or used in conjunction with it, which is configured to interrupt a fault condition proximate the downstream charging stating before an upstream protective device trips. In doing so, it must have a predetermined trip threshold above the comparatively lower trip threshold of an upstream protective device. An EV protection device is needed to selectively prevent an upstream protective device from being able to detect a predetermined fault condition in a branch circuit if the predetermined fault condition is in a load downstream of the downstream protective device. Alternatively, an EV protection device is needed such that it is configured to allow an upstream device to trip in response to a fault condition in a load that is not parallel to the downstream device. EV charging stations are also subject to end of life conditions in which the failure of a component or system impairs the protective function. What is also needed, therefore, is a protected EV charging station that does not provide unprotected power when an end of life condition occurs.

SUMMARY OF THE INVENTION

The present invention addresses the needs described above by providing a protected EV charging station, or a protection device for use with an EV charging station. The present invention is configured to interrupt a fault condition proximate the downstream charging stating before an upstream protective device trips. In doing so, the present invention is configured to have a predetermined trip threshold above the comparatively lower trip threshold of an upstream protective device. The present invention is configured to selectively prevent an upstream protective device from being able to detect a predetermined fault condition in a branch circuit if the predetermined fault condition is in a load downstream of the downstream protective device. Alternatively, the present invention is configured to allow an upstream device to trip in response to a fault condition in a load that is not parallel to the downstream device.

One aspect of the present invention is directed to a protective device configured to be coupled between an AC power source and an electrical load, the AC power source including at least one hot conductor and a ground conductor connected to earth ground. The device includes an input device configured to be coupled to the AC power source, the input device having a plurality of line contacts including at least one hot line contact configured to be coupled to the at least one hot conductor and a line-side ground contact configured to be coupled to the ground conductor. An output device includes a plurality of load contacts configured to be coupled to the electrical load, the plurality of load contacts including at least one hot load contact and a load-side ground contact. The output device is configured to provide the electrical load with AC electric power received via the input device from the AC power source. A ground continuity monitor is coupled to the ground conductor, the ground continuity monitor being configured to detect a ground discontinuity condition in the ground conductor. A circuit interrupter mechanism is coupled to the ground continuity monitor. The circuit interrupter mechanism is configured to interrupt electrical continuity between the at least one hot line contact and the at least one hot load contact in a tripped state and establish electrical continuity between the at least one hot line contact and the at least one hot load contact in a reset state. A self-test circuit is coupled to the ground continuity monitor and configured to perform a simulated ground continuity test that simulates the ground discontinuity condition. The self-test circuit provides a test failure signal when the ground continuity monitor fails to provide an output signal in response to the simulated ground continuity test, the test failure signal being configured to trip the circuit interrupter mechanism.

In another aspect, the present invention is directed to a protective device configured to be coupled between an AC power source and an electrical load, the AC power source including at least one hot conductor and a ground conductor connected to earth ground. The device includes an input device configured to be coupled to the AC power source, the input device having a plurality of line contacts including at least one hot line contact configured to be coupled to the at least one hot conductor and a line-side ground contact configured to be coupled to the ground conductor. An output device includes a plurality of load contacts configured to be coupled to the electrical load, the plurality of load contacts including at least one hot load contact and a load-side ground contact. The output device is configured to provide the electrical load with AC electric power received via the input device from the AC power source. At least one fault detection circuit is coupled between the input device and the output device. The at least one fault detection circuit includes a ground continuity monitor coupled to the ground conductor, the ground continuity monitor being configured to detect a ground discontinuity condition in the ground conductor. A circuit interrupter mechanism is coupled to the at least one fault detection circuit. The circuit interrupter mechanism is configured to interrupt electrical continuity between the at least one hot line contact and the at least one hot load contact in a tripped state and establish electrical continuity between the at least one hot line contact and the at least one hot load contact in a reset state. A self-test circuit is coupled to the ground continuity monitor. The self-test circuit is configured to perform a simulated ground continuity test and provide a test failure signal if the ground continuity monitor fails to respond to the simulated ground continuity test, the test failure signal being configured to trip the circuit interrupter mechanism.

In yet another aspect, the present invention is directed to a protective device configured to be coupled between an AC power source and an electrical load, the AC power source including at least one hot conductor and a ground conductor connected to earth ground. The device includes an input device configured to be coupled to the AC power source, the input device having a plurality of line contacts including at least one hot line contact configured to be coupled to the at least one hot conductor and a line-side ground contact configured to be coupled to the ground conductor. An output device includes a plurality of load contacts configured to be coupled to the electrical load, the plurality of load contacts including at least one hot load contact and a load-side ground contact. The output device is configured to provide the electrical load with AC electric power received via the input device from the AC power source. A ground continuity monitor is coupled to the ground conductor, the ground continuity monitor being configured to detect a ground discontinuity condition in the ground conductor. A circuit interrupter mechanism is coupled to the ground continuity monitor. The circuit interrupter mechanism is configured to interrupt electrical continuity between the at least one hot line contact and the at least one hot load contact in a tripped state and establish electrical continuity between the at least one hot line contact and the at least one hot load contact in a reset state. A self-test circuit is coupled to the ground continuity monitor and configured to perform a simulated ground continuity test that simulates the ground discontinuity condition. The self-test circuit provides a test failure signal when the ground continuity monitor fails to provide an output signal in response to the simulated ground continuity test. The test failure signal is configured to trip the circuit interrupter mechanism.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention and together with the description serve to explain the principles and operation of the invention.

BRIEF DESCRIPTION OF THE DRAWINGS

FIGS. 8A and 8B are schematic diagrams of a ground continuity monitor in accordance with embodiments of the present invention;

FIGS. 12A-12C includes schematic views of user interface control circuits in accordance with embodiments of the present invention;

DETAILED DESCRIPTION

Figure 1:
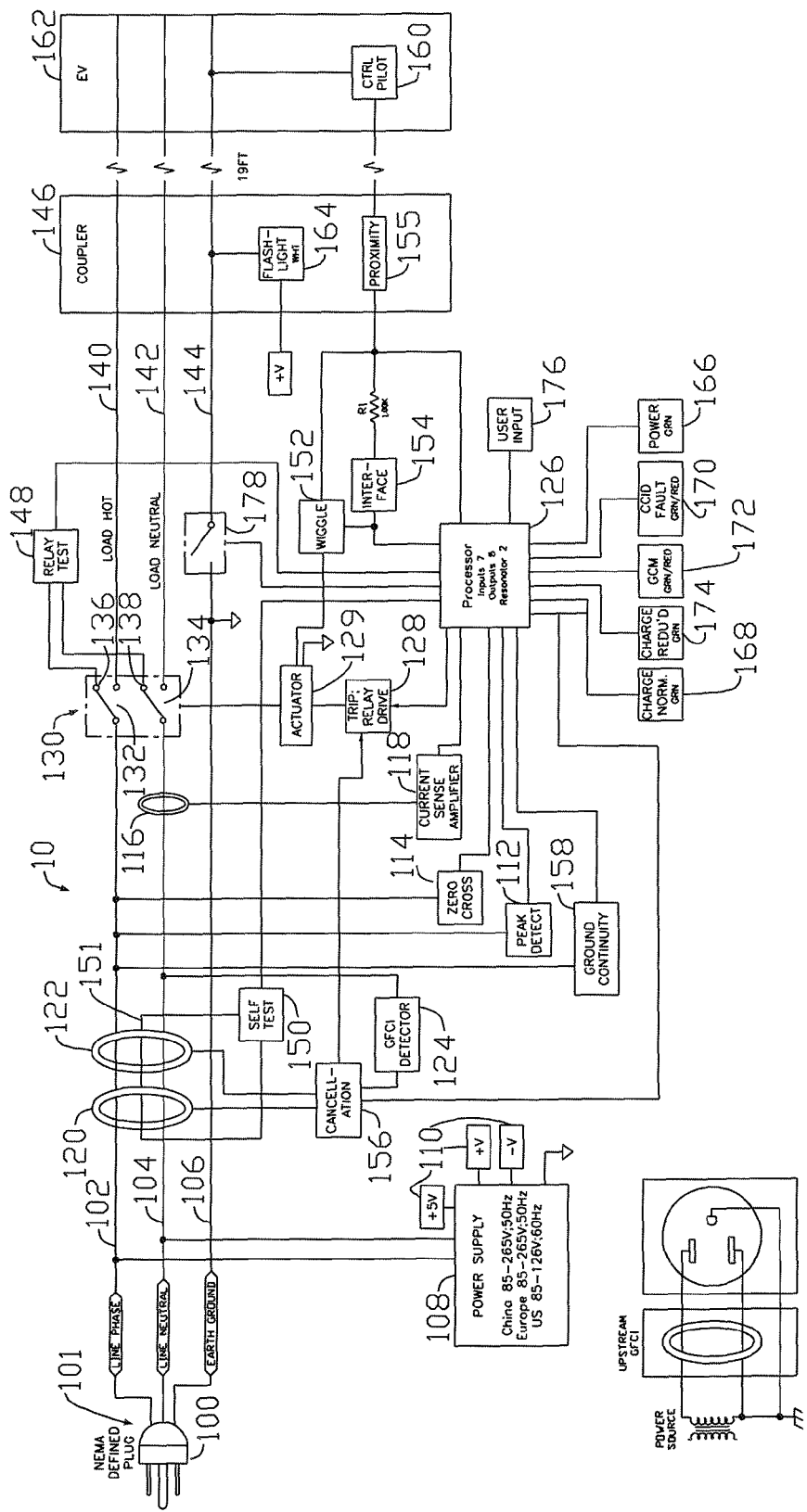
FIG. 1 is a block diagram of an EV charging station in accordance with an embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the device of the present invention is shown in FIG. 1, and is designated generally throughout by reference numeral 10.

As embodied herein and depicted in FIG. 1, a block diagram of an EV charging station 10 is shown. The charging station has an input plug 100 configured to mate with a receptacle connected to the electrical distribution system. The plug 100 terminates a charging station power cable 101 that includes at least one phase conductor 102, a ground conductor 106, and may include a neutral conductor 104. In the example embodiment of FIG. 1, a phase conductor 102, a neutral conductor 104 and a ground conductor 106 are shown. The conductors in the cable 101 are connected to a power supply 108 disposed in the housing of the charging station. The power supply 108 accommodates a voltage supply range of 85 VAC to 265 VAC and a frequency range from 45 Hz to 70 Hz depending on the parameters of the electrical distribution system, the voltages required by device 10, and the needs of the EV 162. Those of ordinary skill in the art will understand that the electrical parameters are typically a function of the local jurisdiction (U.S., Europe, China, Japan, etc.).

The functional core of device 10 is processor 126. The processor 126 is coupled to a user interface device 176 that is employed by the user to initialize the device 10. Processor 126 is also connected to most of the other internal non-user accessible components of station 10, including the zero-cross detector 114, peak detector 112, ground continuity monitor 158, current sense amplifier 118, GFCI detector 124, trip-relay drive 128, self test circuit 150, ground continuity relay 178, relay test facility 148, wiggle circuit 152, and coupler interface 154. The trip relay drive 128 may be energized by either the GFCI detector or processor 126. The trip relay drive 128 is connected to the trip actuator 129, which is configured to trip the circuit interrupter 130. Processor 126 is also coupled to a plurality of indicators that include charge normal indicator 168, charge reduced indicator 174, ground continuity monitor indicator 172, CCID fault 170 and power indicator 166. A description of the other elements of device 10 is provided below.

Power supply 108 provides a plurality of DC output voltages 110 that are electrically isolated from the phase (and neutral) conductors. Although only three DC voltage boxes are depicted (e.g., +5V, +V, −V), the last two (+V, −V) represent all of the plurality of voltages required by both the charging station and the EV 162. For example, the control pilot of EV 162 may require ±15 Volts. The supply voltages 110 provide all of the necessary voltages required by device 10 and EV 162. For example, the control pilot 160 associated with electric vehicle may require, e.g., ±15 Volts. The benefit of having an isolated power supply that provides output voltages less than about 30 volts is that no currents derived from the power supply can be a shock hazard. More importantly, a cancellation current (as described herein) derived from the power supply and directed into a current path that includes the neutral conductor 104 cannot be a shock hazard.

A peak detector 112 is coupled to a phase conductor 102 and produces a half wave rectified signal that is proportional to the phase voltage. Processor 126 is configured to determine the phase voltage from the peak voltage of this waveform.

A zero cross detector 114 is coupled to the phase conductor 102 and generates a square wave that is synchronous with the voltage on phase conductor. Processor 126 is configured to read the square wave as necessary.

A current sensor 116 and current sense amplifier 118 are configured to monitor the current flow to electric vehicle 162. The current sensor 116 may be configured as a current transformer that provides an isolated output signal to current sense amplifier 118. In an alternate embodiment, current sensor 116 employs a Hall Effect sensor to sense the current flowing to the electric vehicle while simultaneously providing electrical isolation to the current sense amplifier 118. In an alternate embodiment of the present invention, current sensor 116 employs a shunt sensor in combination with an isolation device for providing an isolated signal to the current sense amplifier 118. Current sense amplifier 118 provides a signal proportional to the electric vehicle that processor 126 is capable of reading.

A ground continuity monitor 158 is connected between the line phase 102 and processor 126. When power is first applied to charging station 10, processor 126 keeps ground relay 178 open while verifying that there is ground continuity through the electrical distribution system to the charging station. By keeping the relay 178 open, processor 126 can determine whether there is upstream ground continuity in the electrical distribution system. Only if there is ground continuity, can electric vehicle safety be assured. For example, if conductor 106 is improperly connected to the phase conductor of the distribution system when plug 101 is inserted into an outlet, a miswire condition exists. As another example, a person leaning on the EV car fender or body may establish another path to ground. This ground path is in parallel with the intentional ground near the panel and will camouflage the true condition of the panel ground during measurement. By measuring the ground continuity condition with the relay open, this uncertainty is avoided.

While relay 178 is open, processor 126 interrogates ground continuity monitor 158. If ground continuity monitor 158 indicates that the ground path to the electrical distribution system is continuous, processor 126 then closes relay 178. In one embodiment, the control pilot 160 is activated after the ground conductor 144 is connected to the ground conductor 106 by relay 178 and a current return path is established. Control pilot 160 confirms ground continuity from the charger station to the electric vehicle and sends a confirmation signal to processor 126. Once this exchange occurs, ground continuity from the electrical distribution system's service panel to the electric vehicle is verified. The aforementioned ground continuity test is performed when power is initially applied to the charging station or to the electric vehicle. The circuit interrupter 130 is not allowed to reset until these tests are performed to thereby eliminate any safety issues related to ground continuity.

In one embodiment, a load grounding confirmation circuit is implemented using the power output coupler 146, interface 154 and processor 126. The load grounding confirmation circuit includes a load grounding test circuit. The test circuit includes a test wire that is coupled to a test terminal disposed in the power output coupler 146. The test circuit is formed by the test wire and the load ground conductor 144. A load ground test signal is generated that propagates in the test circuit. A comparator circuit is coupled to the load grounding test circuit and is configured to compare at least one electrical parameter derived from the load ground test signal with at least one predetermined reference parameter to thereby determine a load ground continuity status of the load ground conductor 144. The comparator circuit may be disposed in the interface circuit 154. In one embodiment, the electrical parameter derived from the test circuit relates to the impedance of the ground conductor 144. In another embodiment, the load ground test signal includes a square wave having a predetermined amplitude. The impedance of the ground conductor 144 may be determined as a function of the amplitude of the square wave. A grounding evaluation circuit is configured to establish a state of the circuit interrupter in accordance with the load ground continuity status provided by the comparator circuit. In one embodiment, the grounding evaluation circuit is implemented by processor 126.

The GFCI function may include a GFCI or a CCID, or both, depending on the embodiment. In reference to FIG. 1, a differential transformer 120 is configured to sense the differential current between phase conductor 102 and neutral conductor 104. As noted in the Background Section, the differential current is measured to determine the presence of a ground fault. The signal from differential transformer 120 is provided to GFCI detector 124. GFCI detector 124 provides an output signal to processor 126 to trip relay drive 128 when the differential current exceeds a predetermined limit (the trip threshold.) The processor 126 outputs an independent signal to trip relay drive 128 in response to the output signal. The trip relay drive 128 signals the trip actuator 129 in response to either one of the GFCI detector output signal or the signal provided by the processor 126. The trip actuator 129, in turn, causes interrupter 130 to trip such that the phase conductor 102 is disconnected from load hot conductor 140. Interrupter 130 is at least a double pole structure; the interrupter 130 includes hot contact set 132 and neutral contact set 134. Contact sets 132,134 are mechanically linked and open and close together. In an alternate embodiment, contact sets 132,134 are not mechanically linked and have separate actuators 129. The two actuators are operated at about the same time so that the contact sets are in effect linked electrically. In yet another embodiment, contact sets 132, 134 are associated with independent relay structures having at least one pole.

Two signals are provided to trip relay drive 128 for the following reasons. When circuit interrupter 130 interrupts the fault condition, the GFCI detector 124 output signal ceases. The processor 126 may include an electronic latch for circuit interrupters that require either constant energization (or constant de-energization) of actuator 129 to maintain the tripped state. If the output signal from detector 124 ceases when the circuit interrupter trips, the signal from processor 126 maintains the latch state such that the circuit interrupter remains in the tripped state. Alternatively, the trip relay drive 128 and the processor 126 provide redundancy. Yet another reason for the two signaling methods relates to the processor propagation delay through the processor as it relates to the desired GFCI trip time. The trip relay 128 ensures that the interrupter 130 trips within 25 milliseconds.

The GFCI is also configured to detect a ground to neutral fault on the load side of the circuit interrupter (This type of fault condition may also be referred to as a grounded neutral fault). Ground fault detector 124 provides signal to grounded neutral transformer 122. When there is a ground fault condition between the neutral and ground conductors on the load side of transformer 122, a signal from grounded neutral transformer 122 activates the differential transformer 120. This results in GFCI detector 124 outputting a trip signal to processor 126 and trip relay drive 128.

The circuit interrupter 130 may be tripped for other reasons. For example, the device 10 may be tripped by an overcurrent condition sensed by current sense amplifier 118. The circuit interrupter 130 may also trip in response to either an overvoltage or an undervoltage condition detected by peak detector 112. The circuit interrupter 130 may also trip in response to an improper wiring condition. Finally, the "wiggle" circuit 152 may also cause actuator 129 to trip the device.

Some of the conditions that the present invention is configured to respond to include transposition of the distribution circuit wires connected to phase conductor 102 and ground conductor 106, an open ground condition somewhere in the ground conductor circuit, a miswiring condition, an end-of-life condition or a fault condition in the electric vehicle (which is transmitted by the control pilot 160 to processor 126 via an encoded signal).

Cancellation circuit 156 addresses the problem of an overly sensitive GFCI disposed upstream in the electrical distribution system. The GFCI detector 124 may have a trip threshold level of about 20 mA because the electric vehicle itself is likely to have a standing leakage to ground that is greater than the typical 6 mA sensitivity of commonly used GFCIs. As noted in the Background section, a 6 mA GFCI may be disposed upstream of the charging station and could be prone to nuisance tripping. Cancellation circuit 156 desensitizes the trip threshold of the upstream GFCI or substantially "blinds" the upstream GFCI completely from ground fault conditions occurring in the electric vehicle to mitigate nuisance tripping of the upstream GFCI.

Cancelation circuit 156 is coupled between the GFCI detector and the line neutral. The GFCI detector 124 provides a buffered or amplified sensed signal to the cancellation circuit 156 in response to receiving a signal from the differential transformer 120. Cancellation circuit 156 propagates a cancelation current on a wire loop in the upstream electrical distribution system. The wire loop includes portions of neutral conductor 104 and ground conductor 106. Conductors 104, 106 are connected via plug 100 to the neutral wire and the ground wires, respectively. These conductors are connected together at the panel. See FIG. 1. When a ground fault condition is detected by the GFCI detector 124, the cancelation current circulates around the wire loop. The cancelation current is similar to a ground fault current in some respects, and different in others. Both currents are differential currents, but the cancelation current is opposite in phase and has a comparatively lesser magnitude than the ground fault current. When the upstream GFCI sums the two currents, the cancelation current will tend to cancel the downstream ground fault signal. Thus the upstream GFCI is desensitized and will not respond to the ground fault.

GFCI detector 124 is configured to prevent it from being desensitized. Note that the wire loop passes through transformer 120 and like the upstream GFCI; GFCI detector 124 is responsive to the summation of the ground fault current and the opposing cancellation current flowing around the loop. Since the magnitude of the cancellation current is proportional to the magnitude of the ground fault current, i.e., the ground fault current is a multiple of the cancellation current. Thus the extent of the desensitization is also proportionally reduced. Of course, it is desirable for GFCI 124 to trip at its desired trip threshold, e.g. 20 mA, without any apparent desensitization. Accordingly, the trip threshold of GFCI detector 124 is restored by increasing its sensitivity by an amount corresponding to the inverse of the multiplier.

In another embodiment of the invention subsequently described herein, the wire loop does not pass through the differential transformer and the aforementioned compensation techniques are eliminated. In yet another embodiment also subsequently described herein, the wire loop may include portions of phase conductor 102, the voltage source, and ground conductor 106. In yet another alternate embodiment subsequently described herein, the differential transformer 120 provides a signal directly to the cancellation circuit 156. In this case, the cancellation circuit provides a sense signal to detector 124 such that the GFCI detector 124 detects the ground fault current. Once the EV charging station 10 is unplugged from the electrical distribution system, or the electric vehicle is unplugged from the charging station, the de-sensitizing signal is removed so the sensitivity of the upstream GFCI becomes restored.

Again, an upstream GFCI is only desensitized to ground fault currents occurring downstream of differential transformer 120. Ground fault conditions located in the electrical distribution system do not produce a differential current that is sensed by differential transformer 120. If the transformer 120 is not producing a signal, the cancellation circuit 156 will not generate a cancelation current. Accordingly, the upstream GFCI is not de-sensitized to ground faults occurring elsewhere in the branch circuit, whether downstream or upstream from where the charging station is tapped. As an aside, a background test circuit is provided in FIG. 4 such that a background differential current is always being generated. This circuit will be described in greater detail below in the discussion of FIG. 4.

As briefly noted above, device 10 includes a relay test circuit 148 coupled between the circuit interrupter 130 and processor 126. The purpose of the relay test circuit 148 is to detect an end-of-life condition in the circuit interrupter 130. For example, the contacts comprising contact set 132, or contact set 134, may become welded in the reset position and cannot be opened by actuator 129. When processor 126 sends an output signal to actuator 129 to trip the circuit interrupter 130, it is configured to interrogate relay test 148 to determine if the relay test circuit 148 detects a voltage between contacts 136, 138. If the voltage is detected, the processor concludes that the circuit interrupter has tripped. If the voltage is not detected, the processor concludes that one of the contact sets was not opened. When processor 126 determines that there is a welded condition in at least one of the contact sets, the processor will not reset the circuit interrupter. If only one of the contact sets 132, 134 is welded, there is a fail safe condition because no power will be provided to the electric vehicle.

Fault lamp 170 is also included to indicate the welded contact condition or other such end-of-life issues with the circuit interrupting mechanism (e.g., trip relay drive 128, actuator 129, and circuit interrupter 130, etc.). When these components experience an end of life condition, the circuit interrupter 130 may remain in the reset state when it should be in the tripped state. The processor 126 responds to this condition by activating the fault indicator 170. In one embodiment, fault indicator 170 extinguishes a green indicator and illuminates a red indicator to signal the user that an end of life condition has occurred. In another embodiment, the fault indicator 170 initiates a flashing indication. In another embodiment, the fault indicator 170 initiates an audible indication to signal the end-of-life state.

EV charging station 10 includes a power output coupler 146 that is configured to couple the station 10 to the EV 162. A flashlight 164 is disposed in the coupler 146 to provide illumination when the user attempts to connect the electric vehicle 162 to the charging station 10 under low ambient lighting conditions. Flashlight 164 includes a trigger switch that enables the light when coupler 146 is not in a mated relationship. The trigger switch may also be incorporated into a trigger handle included in the coupler. The coupler 146 also includes a proximity detector 155 that has two switches operatively coupled to a trigger handle disposed in coupler 146. Proximity detector 155 allows the processor signal to couple to the electric vehicle only when the handle is in a mating relationship with a port on the electric vehicle. Resistor R1 disposed in the charging station and a rectification circuit disposed in control pilot 160 are also involved in verifying the mated relationship.

EV charging station 10 includes a wiggle detector circuit 152. The processor 126 transmits an encoded signal having a user selectable duty cycle referred to as a "duty cycle source signal" or as a "wiggle signal." The control pilot 160 transmits a signal in response to the wiggle signal. The wiggle detector 152 is configured to monitor the two-way communications between the EV station 10 and the EV 162. An end of life condition may occur in processor 126 if it fails to generate the wiggle signal. If the wiggle signal is absent for a predetermined period of time, the wiggle detector 152 assumes that either the processor 126 or the control pilot 160 have stopped working and sends a trip command signal to actuator 129.

As noted briefly above, processor 126 is connected to a plurality of visible indicators which are selectively activated by processor 126. Power indicator 166 includes two color indicators. Processor 126 will signal the power indicator 166 to illuminate one or the other of the two color indicators depending on whether or not the source voltage as detected by peak detector 112 is within an acceptable range of voltages. Charging lamps 168, 174 indicate which of four charging levels has been selected by the user via user input 176. They may also indicate whether the charging is successfully taking place. Of course, more than two charging lamps may be employed. CCID lamp 170 employs a red lamp as a trip indicator and a green lamp as a reset indicator. GCM (ground continuity monitor) lamp 172 emits a green color when ground continuity is present between the electrical distribution system and the electric vehicle. A red color indicates a ground discontinuity. Of course, other colors such as amber may be employed. Visible indication may include flashing indication. The plurality of indicators may be consolidated and the various indications encoded by multiple colors or patterns of flashing. Audible indication may include a beeping indication.

Referring back to the user input 176, which was briefly mentioned above, the user interface 176 may include one or more energy conservation input selections. In one input selection, a charging rate is automatically selected to charge the battery with the least amount of wasted electricity. This determination may be based on a signal from the control pilot 160 that indicates the type of battery involved, the temperature rise of the battery while charging, or the instantaneous charge voltage. The selection determination may also be based on historical charging cycle information held by processor 126 in memory. The user input 176 may also be configured to provide an automatic input selection wherein the charging cycle is automatically scheduled in accordance with a time (e.g., night) when electricity is more plentiful and/or less expensive. The user input 176 may also be configured to automatically terminate a charging cycle before a full charge is stored should this outcome represent a more efficient use of electricity. In another input selection, the battery is charged in a manner that would most extend the useful life of the battery. If the user does not activate the energy conservation switch, a greater range of user accessible settings are enabled. The user may then select the fastest charging speed as opposed to the most energy efficient charging speed.

FIG. 1 shows various display elements (166, 170, 172, 174) connected to the processor 126. In another embodiment, the charging station is provided with a display (not shown) that reflects the charge percentage or the estimated driving range of the electric vehicle based on charging information. The charging information includes at least one parameter such as the type of battery, the initial charging current or energy, the rate of change in the charging current or charging energy, battery voltage, or the rate of change in the battery voltage.

Now that the various component parts of the EV charging station 10 depicted in FIG. 1 have been described, a description of various operational routines run by the EV charging station 10 are described below. The first such process relates to charging station initialization. After power is applied to the EV charging station 10, the power supply 108 and processor 126 are allowed to stabilize for a predetermined period of time. Subsequently, the processor 126 performs certain initialization routines before the circuit interrupter 130 is automatically reset. The first initialization routines are performed relate to ground continuity. One test determines whether the line ground conductor has been miswired or whether there is an open ground condition in the line. As described above, once it has been established that this ground path is continuous, ground relay 178 closes. Another initialization test determines whether the electric vehicle 162 is properly connected to the electrical charging station. In this procedure, processor 126 communicates with the electric vehicle 162 via the control pilot 160 to determine whether there is a miswired condition or whether the load ground is continuous. If a load ground continuity fault is detected, the processor 126 will test to determine if the fault condition is in coupler 146 or if it is in the electric vehicle 162 itself.

Once processor 126 determines that the electric vehicle is properly coupled to the charging station 10, the processor 126 tests for overvoltage or undervoltage conditions. The processor 126 performs the test by communicating with peak detector 112 and the zero cross detector 114 to determine voltage and frequency of the AC source. The first step is to determine whether the source voltage frequency is within an allowable range such as 45 to 70 Hz. Once the frequency has been determined, if the source voltage has a frequency of approximately 60 Hz, the allowable voltage range should be with a range between 85 to 140 VAC. If the frequency is approximately 50 Hz, the allowable voltage range should be with a range between 85 to 265 VAC.

Once the overvoltage and undervoltage determinations are made, the EV charging station 10 performs a series of self tests using processor 126 and self test module 150. If the self tests pass, the circuit interrupter will be reset automatically and other tests are performed in the reset state. For example, after automatic reset, the processor again tests for overcurrent and ground fault conditions. If the tests pass and none of the fault conditions are present, the circuit interrupter will maintain the reset state. However, if an overcurrent or ground fault current exists, the circuit interrupter immediately will trip. After a pre-determined period of time has elapsed, processor 126 generates a reset signal to automatically reset the circuit interrupter. In one embodiment of the present invention, the processor is programmed to provide the system with about 15 seconds under the assumption that the fault condition will be resolved within this period of time. However, if a ground fault (or overcurrent fault) is still present, the circuit interrupter trips again. After another predetermined period of time has elapsed, the processor provides a signal to reset the circuit interrupter automatically. This will continue for only a predetermined number of reset attempts (e.g. 4 attempts). At this point, a manual override is required to reset the interrupter. Manual override is effected by way of a reset button that is included in user input 176. The manual override may also be effected by disconnecting and reconnecting the electric vehicle from the charging station. Of course, the initialization process will again be performed in the manner described above.

Those skilled in the art will understand that the test sequence described above may be altered somewhat and certain steps may be omitted, such as the frequency determination step. Once the circuit interrupter 130 has been successfully reset after initialization, EV station 10 enters its normal operating phase. The processor may be configured to continually or continuously monitor the electrical distribution system for ground discontinuities, overvoltage, undervoltage, and ground fault conditions. If any of these conditions are detected by system 10, processor 126 is programmed or configured to generate a command to trip the circuit interrupter and/or activate a warning indicator. Further, the processor 126 may continuously, continually or periodically monitor the encoded signal from the control pilot for a fault condition in the electrical vehicle. The operation of the EV charging station is as follows.

A user of the EV station 10 may, for example, use the user interface 176 to select a charging rate based on desired charging speed and consideration of the amount of available current. The selected charging rate is communicated to the control pilot 160 by processor 126 as an encoded signal. The communication link employs interface circuit 154 and proximity circuit 155. The encoded signal may be a square wave having a user selectable duty cycle referred to as a "duty cycle source signal" or as a "wiggle signal." EV 162 alters the peak-to-peak amplitude of this square wave in accordance with electric vehicle specifications. Information may be conveyed from the EV charging station 10 to the electric vehicle 162 by frequency modulating the encoded signal. The electric vehicle may respond to the charging station using an AM signal whereby the amplitude of the response waveform is modulated to encode a response message. Those of ordinary skill in the art will understand that other types of communication protocols may be employed in either direction such as phase or amplitude modulation. Furthermore, two way communications may take place using only two wires.

The control pilot 160 implements the selected battery charging rate encoded by the wiggle signal and sends a return signal to processor 126. The return signal may be sent directly to processor 126 via proximity detector 155 or through interface 154 instead. The response signal resembles the wiggle signal except that control pilot 160 modifies the positive amplitude and/or the negative amplitude to communicate certain electric vehicle conditions. For example, a ground continuity fault condition may be reflected in the amplitude of the response signal. The amplitude of the response signal may also be employed to indicate whether the electric vehicle is connected and the type of battery employed in the EV 162 (e.g., whether vented or non-vented). If there is an inappropriate supply voltage at the vehicle itself, control pilot 160 sends an encoded signal to processor 126 to trip the circuit interrupter.

Another aspect of the EV charging station's normal operating procedures relates to periodic self testing. Processor 126 and self test circuit 150 routinely monitor the various components of the EV station 10 to determine whether certain components are operational and not at end-of-life. If an end-of life condition is detected, the self-test portion of the EV station 10 may activate a warning indicator, trip the circuit interrupter, or prevent the circuit interrupter from resetting. The warning indicators may include visible or audible indication. The self testing procedures may be scheduled to occur as a part of the system initialization process, immediately after initialization, or periodically as part of the normal operating sequence of the station 10.

In carrying out the self testing protocol, self test circuit 150 is configured to detect an end of life condition by generating a test signal in response to a test command signal generated by processor 126. The processor 126 monitors the system response to the test signal to determine the operational state of differential transformer 120, grounded neutral transformer 122, GFCI detector 124, trip relay drive 128, actuator 129, circuit interrupter 130, relay test 148, or a subset thereof. Processor 126 may issue a test command as part of the normal operational sequence of processor 126 programming, or in response to a predetermined event that signals the likelihood of a reliability issue.

Referring to FIG. 1, self test circuit 150 creates a grounded neutral fault condition by closing a low impedance circuit 151 through transformers 120,122. Circuit path 151 couples the signal in grounded neutral transformer 122 (received from the output of GFCI detector 124) into differential transformer 120. In response, the differential transformer 120 sends a signal to GFCI detector 124 which, in turn, sends a test acceptance signal to trip relay drive 128 and processor 126. If processor 126 does not receive a signal from GFCI detector 124 (or trip relay drive 128) in response to the self test signal, the processor 126 recognizes that one of the self test circuit 150, transformer 122, transformer 120, detector 124, or trip relay drive 128 are experiencing an end of life condition. In response to detecting an end-of-life condition, processor 126 sends a signal to trip the circuit interrupter 130. If the user attempts to manually reset the device 10 in one of the ways described above, the process will repeat and the circuit interrupter will trip out again.

Another self-test verifies the operational status of the relay drive 128, actuator 129, and circuit interrupter 130 without causing an unwanted trip of the interrupter. In this test, an initial assumption is made that the relay drive 128, actuator 129, and circuit interrupter 130 are fully operational. The self test circuit 150 generates a voltage pulse to distinguish the self-test signal from a true fault condition signal. The ground fault detector 124 responds with a pulsed test acceptance signal. When the pulsed test acceptance signal is detected by processor 126 the circuitry under test is deemed operational by processor 126 and processor 126 does not generate a trip signal.

Another self-test determines the status of actuator 129. Processor 126 directs an output pulse to actuator 129 during a zero-crossing of the AC power source. While there is not enough energy in the actuator 129 to trip the interrupter at this point in the AC cycle, the actuator 129 can provide a detectable response if it is operational. Alternatively, the processor 126 may provide a short duration pulse. The actuator 129 response will also be of a brief duration such that the circuit interrupter 130 will not trip.

Another self-test determines the status of trip relay drive 128, actuator 129, circuit interrupter 130 and relay test circuit 148. In this test, processor 126 outputs a pulsed signal that causes the interrupting contacts of the circuit interrupter 130 to toggle for a brief, unnoticeable period. The toggling action is confirmed by relay test 148 and interpreted by processor 126 to mean that trip relay drive 128, actuator 129, circuit interrupter 130 and test relay 148 are operational. This self test may also be performed while the circuit interrupter 130 is in the tripped state. In this case, the current carrying contacts close briefly and then reopen. Like other self tests, this test may be performed when the charging station and electric vehicle are powered and initialized or on a periodic basis after reset. If the self test occurs when the circuit interrupter 130 is in the reset position, the processor pulse signal is configured to open the contacts only briefly.

In another self test embodiment, the self test signal is timed to occur during a predetermined portion of the AC cycle when the processor 126, trip relay drive 128, and/or actuator 129 are unable to generate a trip signal. This allows processor 126 and self test circuit 150 to test the GFCI functionality without tripping the circuit interrupter. Legitimate fault conditions typically endure beyond the narrow test intervals prescribed by the instant embodiment. In one implementation of this scheme, trip relay 128 includes an SCR in combination with a solenoid actuator 129. The solenoid is configured to trip a so-called mouse trap mechanism (circuit interrupter 130). The self test signal is transmitted during negative half cycles of the AC source when the SCR is non-conductive. Accordingly, the SCR is incapable of energizing the solenoid to trip the mouse trap mechanism. Reference is made to U.S. Pat. Nos. 6,674,289; 6,873,158; 7,253,629; and 6,980,005 which are incorporated herein by reference as though fully set forth in its entirety, for a more detailed explanation of automated self testing during negative half-cycles of the AC power source.

In another embodiment of the present invention, self test circuit 150 directs a signal pulse to the GFCI detector 124 under the control of processor 126. Processor 126 includes a timing circuit which is initiated when the signal pulse is transmitted by self test circuit 150 to the GFCI detector 124. If the GFCI detector 124 provides a test acceptance signal within a predetermined period of time, the timer is reset or turned off. If the GFCI detector 124 does not respond to the processor 126 with the test acceptance signal within the predetermined period of time, the processor 126 will cause circuit interrupter 130 to trip.

In another embodiment of the invention, self test circuit 150 is also configured to generate a simulated phase (hot) to ground fault condition. In this embodiment, a switched ground fault impedance is coupled between the phase (hot) and neutral conductors to generate a simulated ground fault condition on differential transformer 120.

In another embodiment of the present invention, the self test circuit 150 establishes a simulated neutral to ground fault condition to test the GFCI circuitry.

In another embodiment of the present invention, self test circuit 150 is configured to simulate an arc fault condition. Note that the charging station may include an arc fault circuit interrupter (AFCI), an arc fault detector (AFD), a combination AFCI/GFCI or a combination AFD/GFCI. AFCIs are configured to detect sputtering arcing conditions that occur due to a poor electrical connection in the power distribution path to the electric vehicle. Sputtering arcing conditions also arise when there is damaged insulation between two conductors. As such, sputtering arc faults can adversely affect the efficiency of the charging cycle and they also generate heat. Accordingly, AFCIs avoid damage to equipment and prevent fires that may occur if the arcing condition were allowed to persist. An AFD is similar to an AFCI in that it is capable of detecting a sputtering arc fault condition but then only indicates the existence of the arcing condition by way of an indicator without interrupting the fault condition. An AFD permits the charging cycle to continue, albeit less efficiently, while warning that a repair is eventually necessary. Reference is made to U.S. Pat. No. 6,373,257, which is incorporated herein by reference as though fully set forth in its entirety, for a more detailed explanation of an Arc Fault Circuit Interrupter.

In accordance with yet another embodiment of the present invention, self test circuit 150 may be configured to test selected components of the device 10. For example, self test circuit 150 may be configured to directly transmit a test signal to the GFCI detector 124 or the trip relay drive 128. This test does not test the differential transformer 120. Other tests may be devised to test for an end of life condition in the grounded neutral transformer 122 or differential transformer 120. By analyzing and comparing a plurality of test outcomes for various tests, processor 126 is able to narrow the location of the fault condition to a particular component or to a subset of components. The results can be displayed via an array of human readable indicia or via modem to a remote repair facility.

The processor 126 and the self-test circuit 150 are also configured to determine whether certain components associated with the electric vehicle itself are in an end of life condition. These include the control pilot 160, coupler 146, interface 154, proximity detector 155, or processor 126. Also, processor 126 and the self-test circuit 150 are also configured to determine the quality of the connection (e.g., poor, intermittent, satisfactory) between control pilot 160 and processor 126. None of the self test routines that have been described are likely to cause an upstream GFCI to trip.

In addition to the plurality of self-test routines performed using the self test circuitry 150, note that other components such as wiggle detector 152 and relay test 148 are configured to test other components in EV charging Station 10 and in the EV itself. Many of these tests may overlap such that a given component of the charging station 10 may be tested by more than one self test routine. Taken as a whole, these test routines determine whether there is an end of life condition in either the EV charging station 10 or the EV 162 itself.

Another issue that the present invention contemplates relates to the possibility of the cancellation circuit 156 preventing the GFCI detector 124 from "seeing" the test signal. If this were allowed to happen, the self test function will conclude falsely that there is an end of life condition and it will prevent reset of the circuit interrupter, activate an alarm or trip the circuit interrupter. The present invention employs several strategies to prevent this from happening.

In one embodiment of the present invention, the self test sequence is completed after the initialization sequence is completed and before the cancellation circuit is activated. In another embodiment of the present invention, the processor is configured to deactivate the cancellation circuit 156 during self-testing cycles. Since the deactivation periods are only on the order of a few milliseconds, nuisance tripping of an upstream GFCI is improbable. In yet another embodiment of the present invention, cancellation circuit 156 is coupled to the phase, neutral or ground conductors such that the circulating current passes through the upstream GFCI but not through differential transformer 120. In this case, the upstream GFCI is desensitized by the cancellation circuit signal, but not the GFCI function in the charging station.

While the components and sub-systems discussed above are periodically checked by the self-testing procedures of the present invention, other components of the electric vehicle charging station 10 are configured to be "fail safe" such that power to the load is automatically cut off. By way of illustration, if the power supply 108 experiences an end of life condition by failing to provide a sufficient DC output voltage output, actuator 129 is configured to cause the contacts in circuit interrupter 130 to revert to their normally open tripped state of the circuit interrupter.

Actuator 129 may also be configured as a fail safe device by including a stored energy device (e.g. a capacitor) in combination with a switch and a mouse trap mechanism. Actuator 129 is configured to close the switch in response to the end of life condition in the power supply. When this occurs, the capacitor's stored energy is released and the mouse trap circuit interrupter 130 is tripped.

In another embodiment of the present invention, a latching relay mechanism may be included in the circuit interrupter 130 instead of a mouse trap mechanism. When the power supply experiences end of life, actuator 129 is configured to close the switch to dump energy into the latching mechanism to thereby trip the circuit interrupting contacts.

As another illustration of a fail safe design, actuator 129 may include a relay comprised of a solenoid winding. Current (or trickle current) must flow through this winding to maintain the circuit interrupter in the reset state. If the solenoid winding open-circuits at end of life, the circuit interrupter trips automatically. Ground continuity relay 178 may also be designed to be inherently fail-safe by employing normally open contacts.

The cancellation circuit 156 is another example of an inherently fail safe component/sub-system. Should the cancellation circuit 156 experience an end of life condition and fail to generate a loop current, the upstream GFCI would no longer be desensitized. The upstream GFCI would be susceptible to nuisance tripping but would serve to protect the electric vehicle from ground fault conditions.

Figure 2:
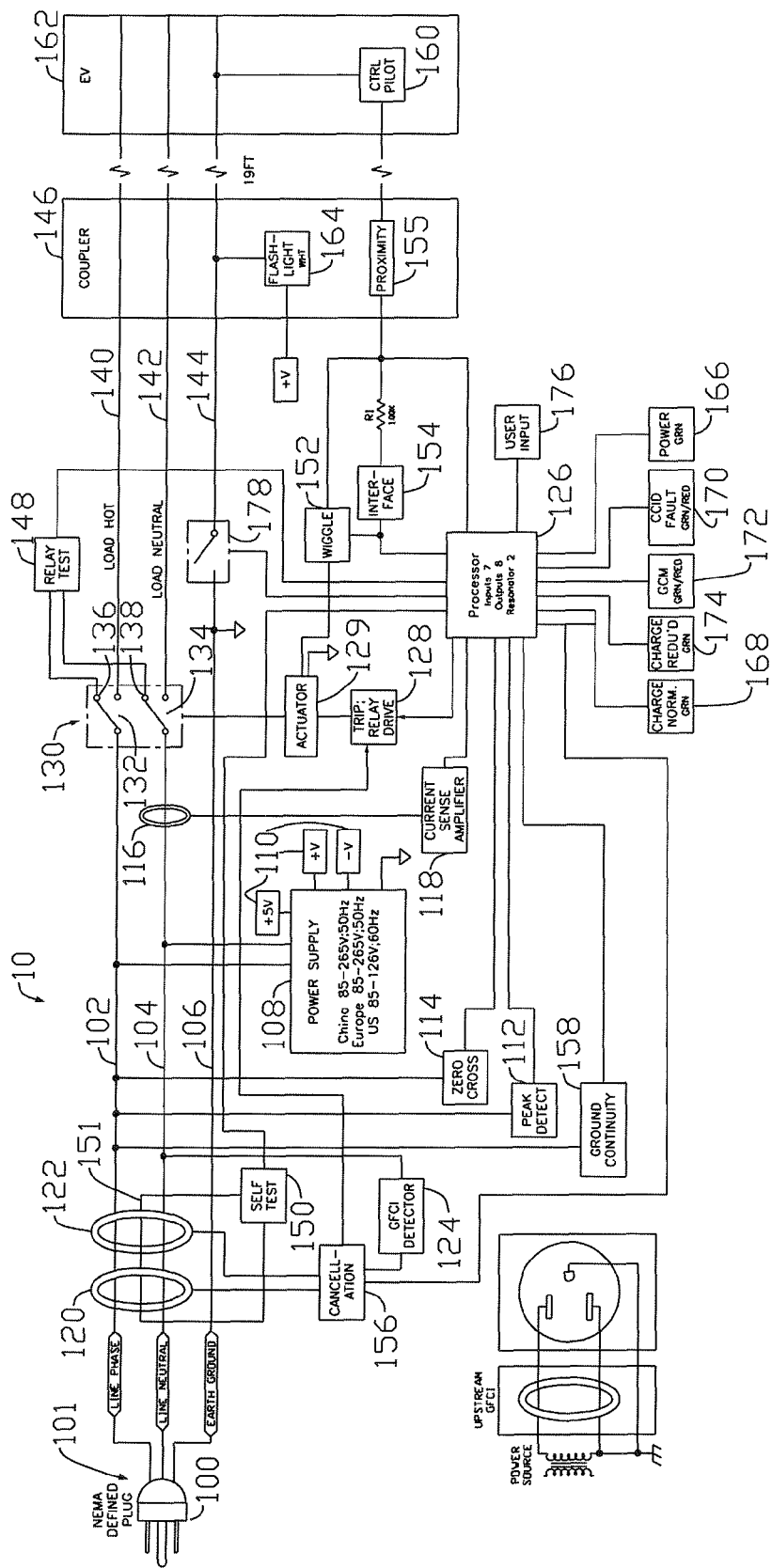
FIG. 2 is a block diagram of an EV charging station in accordance with another embodiment of the present invention.

Referring to FIG. 2, a block diagram of an alternate embodiment of the charging station 10 in accordance with the present invention is shown. Note that the positions of the cancellation circuit and the GFCI detector are interchanged relative to the embodiment of FIG. 1. Thus, the GFCI detector derives signal from the cancellation circuit instead of the other way around. As a result, the GFCI detector 124 is not de-sensitized by the cancellation circuit and is configured to detect the higher 20 mA ground fault current. Note also that the wire loop in FIG. 2 passes through transformer 120. The fact that the net differential current sensed by differential transformer 120 is diminished or even eliminated would imply that the ground fault detector 124 would be prevented from operating. However, even when the signal is completely eliminated, the result is the cancellation current equals the fault current, as will be shown. In other words, the GFCI detector 124 senses the cancellation current as a proxy for the fault current.

Another difference between the embodiment of FIG. 1 and the embodiment of FIG. 2 relates to the positioning of the sensing transformers. In FIG. 2, the differential transformer 120 is disposed upstream of peak detector 112, zero cross 114, current sensor 116, ground continuity monitor 158, and power supply 108. When a ground fault condition occurs in one of these elements, GFCI detector 124 is capable of detecting the condition. Thus, an end of life condition in any element of the charging station is detectable if the element is coupled to the power conductors downstream from the differential transformer of a GFCI.

In the embodiment of FIG. 2, the wiggle detector 152 is connected to control pilot 160. As before, the wiggle detector 152 detects an end of life condition in processor 126, but also detects an end of life condition in the bi-directional communication loop between the charging station and the electric vehicle. If there is an end of life condition in one of the components involved with the communication (i.e., interface 154, proximity detector 155 or control pilot 160), a poor electrical interconnection in the communication path, or if the electric vehicle 162 is simply disconnected from the charging station, the proper response signal from the electric vehicle to the charging station may become disrupted. After a predetermined period of time has elapsed without detecting the response signal, wiggle detector 152 sends a trip command signal to actuator 129 to cause circuit interrupter 130 to trip. If the response signal is restored, the wiggle detector 152 would allow the circuit interrupter 130 to reset.

In reference to the embodiments depicted in FIG. 1 and FIG. 2, both embodiments may be implemented in a variety of configurations. For example, the Background of the Invention describes "traveler sets," which are corded wire sets that are included with the electric vehicle. The traveler sets are plugged into a charging socket at one end and plugged into the EV at another end. The present invention may be implemented as part of the traveler set between plug 100 and EV coupler 146. In another embodiment, the present invention may be directly incorporated into an electric charging station and be completely transparent to the end-user. In yet another embodiment, the line side of the protective device 10 may include wire leads that are connected to the charging station via twist-on connectors or other such connective means. For example, each of the line termination wire leads may be fastened to corresponding wire leads of the line power conductors by fastening means including wire-to-wire splices, wire-to-wire connectors, wire-to-wire crimps, wire-to-wire bonding, or by way of screw terminals. In the last two embodiments, the line neutral conductor 104 may be replaced with a second phase conductor depending on the configuration of the charging station. Further, if the charging station is a stand-alone system, i.e., not part of an electric distribution system having upstream GFCIs, the cancelation circuit 156 may not be necessary and may be omitted.

As embodied herein and depicted in FIGS. 3A-3C, detailed schematics of the processor 126 circuit and various interface circuits in accordance with one embodiment of the present invention are depicted. FIG. 3A shows processor 126, wiggle circuit 152 and interface circuit 154. FIG. 3B shows processor programming input jack J4. Pins such as MOSI and MISO are also used as data pins by processor 126 during non-programming related functions. FIG. 3C shows LED cable J3 with all of its various I/O pins.

Returning to FIG. 3A, it will be apparent to those of ordinary skill in the pertinent art that modifications and variations can be made to processor 126 of the present invention depending on the complexity of various features of the EV charging station. For example, processor 126 may be implemented using any suitable computer system that includes an address/data bus coupled to a processor CPU. The computer system also includes main memory, such as a random access memory (RAM) or other dynamic storage devices, coupled to the bus for storing information and instructions to be executed by the CPU. The main memory may also be used for storing temporary variables or other intermediate information during execution of instructions by the processor. The computer system may further include a read only memory (ROM) or other static storage device coupled to the bus for storing static information and instructions for the processor.

The computer system may include a display that is implemented by a cathode ray tube (CRT), liquid crystal display, active matrix display, plasma display or a series of lamp indicators. The display provides a means for providing information to the EV charging station user. The computer system may also include various input devices, such as a keyboard, a cursor control, a mouse, a trackball, cursor direction keys or various switch inputs. The input devices are employed, inter alia, to communicate user command selections to the processor 126. Of course, the various procedures described above, e.g., self-test routines, etc., may be performed by the computer system in response to executing an arrangement of instructions contained in memory. Such instructions can be read into the computer system memory from another computer-readable medium or from other computer systems.

The computer system also may include at least one communication interface. The communication interfaces may be configured to provide two-way data communications to a computer, a local network, or a wide area network. For example, the communication interface may include a digital subscriber line (DSL) card, a modem, an integrated services digital network (ISDN) card, a cable modem, a telephone modem, a local area network (LAN) card (e.g. for Ethernet™ or an Asynchronous Transfer Model (ATM) network), a wireless device, or any other communication interface configured to provide a data communication connection to a corresponding type of communication line. In any such implementation, the communication interface is configured to send and receive electrical, electromagnetic, or optical signals that carry data streams representing various types of information. Further, the communication interface may include peripheral interface devices, such as a Universal Serial Bus (USB) interface, a PCMCIA (Personal Computer Memory Card International Association) interface, etc.

A network link typically provides data communication through one or more networks to other data devices. For example, the network link may provide a connection through a local network to a host computer, which has connectivity to a wide area network (WAN) or the global packet data communication network now commonly referred to as the "Internet." The networking facility may provide a link to repair or servicing equipment operated by a service provider.

The processor 126, therefore, may be configured to send and receive data, including program code. In the Internet example, a server computer (not shown) might transmit requested code belonging to an application program for implementing an embodiment of the present invention. The processor 126 may execute the transmitted code while being received and/or store the code in memory for later execution. Processor 126 may also be configured to be operated from a remote computer, cell phone, personal digital assistant (PDA) or a blackberry device.

The term "computer-readable medium" as used herein refers to any medium that participates in providing data and/or instructions to the processor for execution. Such a medium may take many forms, including but not limited to non-volatile media, volatile media, and transmission media. Common forms of computer-readable media include, for example, a flash drive or flash card, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Again, it will be apparent to those of ordinary skill in the pertinent art that modifications and variations can be made to processor 126 of the present invention depending on the complexity of various features of the EV charging station. For example, if the EV charging station includes a relatively simple user interface 176 that features a few lamp indicators, the relative complexity of the programming required to support the interface will also be low. On the other hand, if the EV charging station 10 includes various graphical user interfaces (GUIs) for accessing related application programs that are, in turn, managed by an operating system platform, a general purpose computer may be required.

In the embodiment depicted in FIG. 3A, processor 126 is implemented using an 8-bit microcontroller that employs a RISC architecture having up to 16 MIPS throughput at 16 MHz. With respect to memory capabilities, in one embodiment of the invention, processor 126 may include 8K bytes of Flash memory, 512 bytes of EEPROM, and 1K byte of SRAM. Processor 126 may include peripheral features such as several 8-bit and/or 16-bit timer/counters, programmable watchdog timers, A/D converters, comparators, PWM channels, various interrupts, and various serial interfaces. In alternative embodiments, hard-wired circuitry may be used in place of, or in combination with, software instructions to implement the embodiments of the present invention. Thus, embodiments of the present invention are not limited to any specific combination of hardware circuitry and/or software. Thus, in addition to the computer chip depicted in FIG. 3A, processor 126 may also be implemented using any suitable off-the-shelf microprocessor (e.g., processors manufactured by Intel, Motorola, etc.) or any suitable processing circuit depending on the sophistication of the implementation. For example, those of ordinary skill in the art will recognize that processor 126 can be implemented using application specific integrated circuits (ASICs), or a combination of off-the-shelf processors and ASICs in the design.

Figure 3:
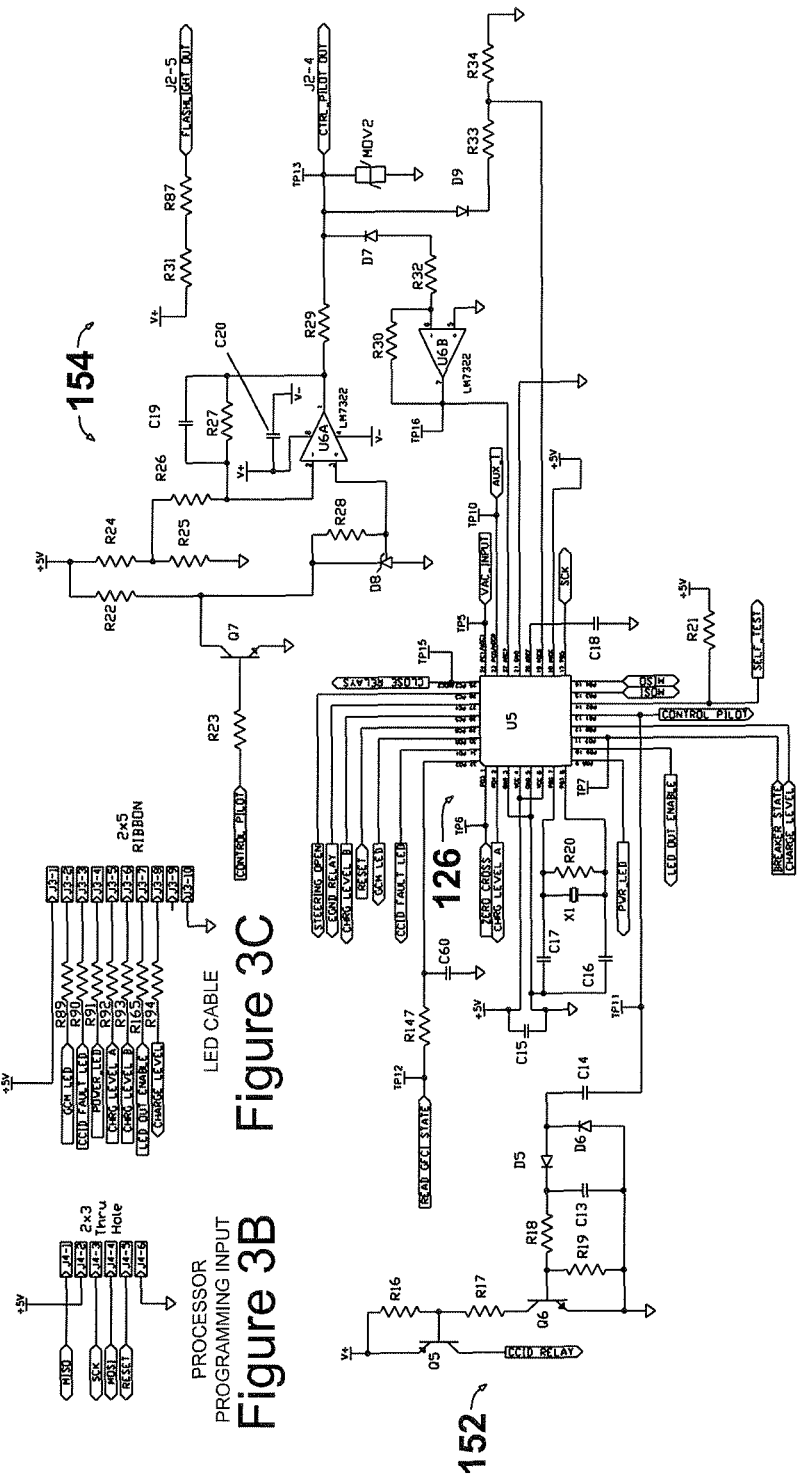
FIGS. 3A-3C include detailed schematics of the processor circuit and interface circuit depicted in FIG. 1 and FIG. 2 in accordance with another embodiment of the present invention.

The processor 126 depicted in FIG. 3A includes a pin VCC that is connected to a +5V supply. The ground pin (GND) is coupled to ground and to VCC by way of a capacitor C15. Processor 126 includes 23 programmable I/O lines that are divided into a first set of I/O lines (PB0-PB7), a second set of eight data lines (PD0-PD7) and a third set of seven I/O lines (PC0-PC6). The various I/O lines are implemented in the embodiment depicted in FIG. 3 in the following manner.

The READ GFCI STATE and ZERO CROSS inputs of processor 126 are configured to be edge sensitive. Further, these inputs may include external interrupts. Interrupts, as the name suggests, interrupt CPU processing and the redirect the sequence of the executable code such that a predetermined routine is executed instead. In this case, the processor changes the voltage state on the CLOSE RELAYS pin to trip circuit interrupter 130. The CLOSE RELAYS output includes an electronic latch. The circuit interrupter is tripped when the latch is disabled or when power to the charging station is removed. In an alternate embodiment, the circuit interrupter is tripped when the latch is enabled. In a similar manner, when there is an input signal on the READ GFCI STATE or ZERO CROSS pins, the voltage state on the EGND RELAY pin may change in order to open ground relay 178.

The AUX_I and VAC_INPUT pins are coupled to analog to digital (A/D) converters. The A/D converters convert their respective analog inputs and provide the processor with digital representations of the battery charging current and the source voltage. The charging current is provided to the battery by the charging station. The source voltage is provided to the charging station by the electrical distribution system. The charging station is provided data inputs for the supply voltage, load current and elapsed time. Using these values, the processor is programmed to store the charging history data in memory.

Processor 126 may include other pins for accommodating various features. The RESET, MOSI, MISO and SCK pins are bi-directional programming pins used by a programming tool to program the processor to be programmed. Subsequently, these pins may be accessed to obtain data from the processor, such as data corresponding to predetermined charging station events or other conditions that have occurred over time. By way of a non-limiting example, a predetermined condition may include fault conditions, charging station utilization time, charging rates, conditions in the electrical distribution system, or vehicle identification information.

The LED OUT ENABLE signal is an output that is used to enable the various LED outputs depicted herein. The LOAD SHED I/O pin allows the charging station to be controlled by certain predetermined conditions in the electrical power distribution system or by certain predetermined conditions in the electrical power grid to which it is connected. For example, if the overall load on the grid is excessive, a signal from the power grid to the LOAD SHED pin disrupts or prevents the occurrence of a charging cycle. In an alternate embodiment, the decision about whether or not to allow a charging cycle to proceed involves two way communications between the power grid and the charging station. Various kinds of information can be communicated to the grid. As an example, the charging station communicates a vehicle identification signature to the power grid. This identification may be an encoded signal from the control pilot or may be a password entered at the charging station itself. Based on its identity, the vehicle is charged in a preselected priority controlled by the power grid. As another example, the charging station may collect data and subsequently provide that data. The data may include the time battery charging time, the amount of additional electricity required to complete the charging cycle, the efficiency of the charging cycle, or the efficiency of the charging cycle during a previous charging cycle.

As another example of charging station communications, the charging station 10 may be configured to accumulate a utilization history and provide this information to the power grid. The power grid may enable the charging station to provide charging current based on the history.

In another embodiment, the power grid is configured to provide a signal to the LOAD SHED pin to alter the user selectable charging cycle. The charging station is still permitted to charge the battery but at a different rate or at a later time than what was selected by the user. For any of the embodiments that have been described, the charging station may include a display that alerts the user whenever the power grid has provided an instruction to the charging station. The power grid couples to the charging station by way of connector J6. The coupling may include an RF link.

Some of the processor pin designations are defined in Table I below:

TABLE I

Processor 126 Pin Definitions

| Pin Designation | Definition |
| --- | --- |
| STEERING OPEN | An output that controls cancellation circuit 156. |
| EGND RELAY | An output that controls ground relay 178. |
| CHRG LEVEL B | An output that controls charge lamps 168, 174. |
| GCM LED | An output that controls GCM lamp 172. |
| CCID FAULT LED | An output that controls fault indicator lamp 170. |
| READ GFCI STATE | An input controlled by trip relay drive 128 or ground monitor 158. |
| ZERO CROSS | An input that receives signal from zero cross detector 114. |
| CHARGE LEVEL | An output that controls charge lamps 168, 174. |
| PWR_LED | An output that controls power lamp 166. |
| BREAKER STATE | An input that receives signal from relay test 148. |
| CHARGE LEVEL | An input that receives signal from user input 176. |
| CONTROL PILOT | An output that sends signal to interface 154. |
| SELF_TEST | An output that controls self test 150. |
| AUX_I | An input that receives signal from current sense 118. |
| VAC_INPUT | An input that receives signal from peak detector 112. |
| CLOSE RELAYS | An output that controls actuator 129. |

In further reference to FIG. 3A, wiggle circuit 152 is configured to actively establish whether or not processor 126 is functional. As such, the wiggle circuit needs to be independently operational from the processor. Although the wiggle circuit 152 is shown as being external to processor 126, it may be included in processor 126 so long as this independent operation is preserved. If the wiggle circuit is included in processor 126, its functionality may be implemented in software.

The signal CONTROL PILOT is shown as being on pin 13 of processor 126, and is directed to both the wiggle circuit (explained above) and interface circuit 154. In particular, the CONTROL PILOT pin is connected to capacitor C14 of the wiggle circuit and resistor R23 of the interface circuit 154. Diodes D5 and D6 selectively couple capacitor C14 to capacitor C13. After power is first applied to the charging station and it has been proven that certain conditions are met, e.g. the source voltage is within range, processor 126 provides an output signal at the CONTROL PILOT pin. The control pilot signal is a square wave. Capacitor C13 is configured to accumulate a charge that turns Q6, and thus, Q5 ON. In this state, the output port of the wiggle circuit 152 (CCID RELAY) is HIGH.

In reference to the interface circuit 154, the CONTROL PILOT pin provides 0 and +5 V TTL signal levels to amplifier U6A. Amplifier U6A converts these signal levels to +/−12 V signal levels of the output CTRL_PILOT OUT. Amplifier U6A and the associated circuitry are also configured such that the duty cycle of a square wave present at the CONTROL PILOT is propagated to CTRL_PILOT OUT within a predetermined percent difference. In one embodiment, the square wave is about 1 kHz and the predetermined percent difference between the input and output duty cycles is less than two percentage points.

The (0, 5) V TTL signal is converted into +/−12V because interface circuit 154 has a rather high output impedance, which is established by resistor R29. In one embodiment, the value of R29 is 100K Ohms. The positive portion of the output signal CTRL_PILOT OUT is fed back to processor 126 by way of diode D6 and a voltage divider comprising resistor R33 and R34. The altered negative output signal CTRL_PILOT OUT is also fed back to processor 126 by way of diode D7, resistor R32 and amplifier U6B. The positive magnitude indicates to the charging station whether or not a charging cycle is being requested, and at what rate. The negative magnitude indicates to the charging station that an electric vehicle is present.

Figure 4:
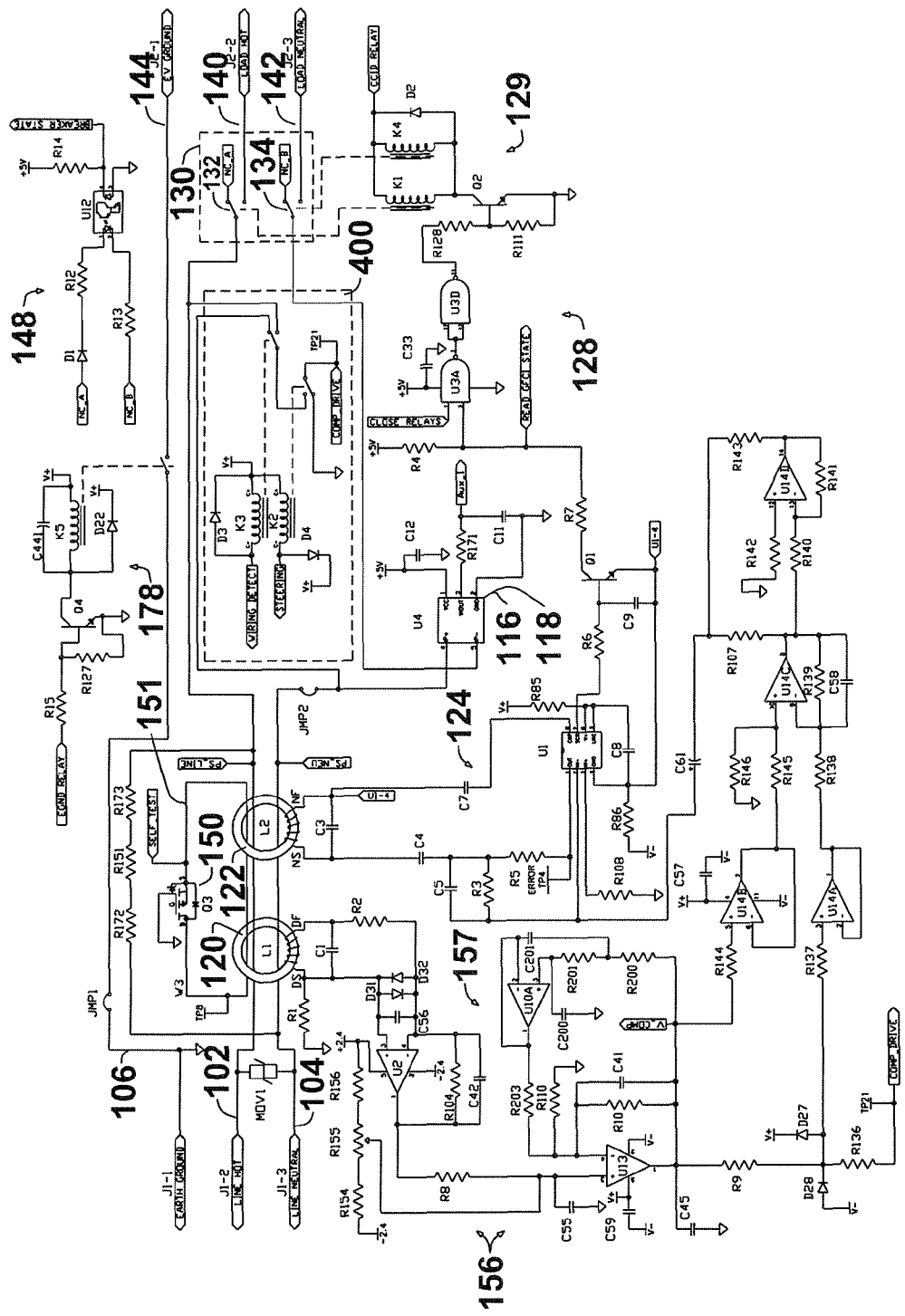
FIG. 4 is a detailed schematic of various circuits depicted in FIGS. 1 and 2 in accordance with an embodiment of the present invention.

As embodied herein and depicted in FIG. 4, a detailed schematic of the self test circuit 150, GFCI detector 124, cancellation circuit 156, actuator 129 and other circuits depicted in FIGS. 1 and 2 are shown. The line hot conductor 102 and line neutral conductor 104 are shown passing through toroidal sensors 120 and 122. Each of these circuits will be taken in turn in the following discussion beginning with cancellation circuit 156.

Before providing a detailed description of the circuitry shown in FIG. 4, a broad overview is provided. The cancelation circuit 156 functions as a conditioning circuit that is configured to monitor the differential current flowing through the plurality of line terminals (J1-2, J1-3) via sensor 120. Cancellation circuit 156 is configured to generate a cancellation current (i.e., a conditioning signal) in response to the differential current. The conditioning signal propagates in a path formed by the line neutral conductor 104 and the line ground conductor 106 to thereby reduce the differential current that propagates in the line hot conductor 102 and the line neutral conductor 104. As noted previously, cancelation circuit 156 desensitizes the trip threshold of the upstream GFCI or substantially "blinds" the upstream GFCI from ground fault conditions occurring in the electric vehicle by providing the conditioning signal.

Sensor 120 provides amplifier U2 with a differential current signal that may be based on various signal sources. Before the protective device 10 is reset, the background circuit formed by R172, R151 and R173 provides a background differential current that is sensed by sensor 120. The differential current flowing through these resistors propagates on the segment of phase conductor 102 but not the segment of neutral conductor 104 passing through differential transformer 120. In an alternate embodiment, the current flows on the segment of the neutral conductor but not the segment of a phase conductor (see FIG. 21.) Without the background current, the cancelation circuit 156 would not generate any output signal when the device 10 is tripped and when relay 178 is open because of the lack of a sensor input. Once the device is reset, the cancelation current includes the background current and the ground fault leakage current. The current cancelation circuit 156 provides the cancelation signal on the COMP-Drive pin.

The cancelation signal is directed into the neutral conductor 104 via the neutral coupling circuit 400. The cancelation current (See FIG. 1) propagates through the plug 100 to the termination point where the neutral conductor of the electrical distribution system is connected to the line ground conductor. The cancelation signal propagates on the line ground conductor such that the loop is completed at the reference terminal of the power supply. Of course, amplifier U13 is referenced to the power supplies. Once the device 10 is reset, the load current is directed through sensor 120 as well. The cancelation circuit 156 forms a negative feedback loop by directing the cancelation current (COMP-DRIVE) through sensor 120 via the neutral conductor 104. If the EV experiences a ground fault, the cancelation current will neutralize the ground fault current propagating upstream of device 10 because the cancelation current (in the reset state) includes the ground fault leakage current. Once the ground fault current is removed by tripping the circuit interrupter 130, the cancelation current again only includes the differential current generated by the background circuit (R172, R151, and R173). The cancelation circuit 156 is discussed in greater detail below.

The cancellation circuit 156 includes a differential transformer 120 coupled to a trans-conductance amplifier U2. The impedance of coupling resistor R2 is chosen to be less than the impedance of the secondary winding on transformer 120. Those skilled in the art will recognize that the differential transformer is then burdened as a current transformer such that the secondary current is not as affected by the permeability in the core material included in the transformer. The output signal from amplifier U2 is proportional to the differential current (the vector sum of the current) flowing in phase conductor 102 and neutral conductor 104. The signal from amplifier U2 is coupled to voltage amplifier U13 by way of resistor R8 such that differential current signal is further amplified. By utilizing the two amplifier stages, it becomes easier to create a large gain without sacrificing either electrical stability or frequency response in the output signal provided by amplifier U13. The output of U13 is connected to resistor R9 in series with resistor R136 to provide the cancelation signal at (COMP-DRIVE). For ease of discussion, these two resistors will be treated mathematically as a single resistor R9. As noted, (COMP-DRIVE) is connected to the neutral conductor 104 downstream of differential transformer 120 by way of neutral coupling circuit 400. Once connected to neutral conductor 104, the series combination of amplifier U13, serving as a voltage source and resistor R9 complete a wire loop comprising segments of neutral conductor 104 and ground conductor 106 in the manner described above. Note also that the combination of resistor R9 and capacitor C45 provide a low pass filter that protects amplifier U13 from high frequency noise that would otherwise be fed back via the neutral conductor.

In one embodiment of the present invention, the gain of amplifier U13 is about 1000 and the overall bandwidth of the two amplification stages (comprised of amplifiers U2 and U13) is about 10 kHz. One reason for limiting the bandwidth of the amplifiers is that most commercially available GFCIs, including upstream GFCIs, are not intended to respond to ground fault currents above 10 KHz because frequencies greater than 10 kHz only cause nuisance tripping. In another embodiment the gain is about 10,000 and circuit stability is achieved using other methods to be described.

Of course, any unwanted voltage sources in the wire loop would result in the generation of a loop current that would be sensed by the upstream GFCI. Thus it is desirable for the signal from amplifier U13 to nullify any such currents. One such voltage source is the naturally occurring voltage drop (IR drop) in the neutral conductor 104 when load current is passing through it. Load currents originate from the electric vehicle during the charging cycle, or from miscellaneous loads distributed elsewhere in the branch circuit. In any event, the IR drop introduces a circulating current in the current loop, herein referred to as "noise current." Since the noise current flows on the neutral conductor but not the phase conductor passing through differential transformer 120, it is sensed as if it were a ground fault current. The noise current, therefore, is reflected in the output voltages provided by amplifiers U2 and U13.

Note that each amplifier (U2, U13) includes a negative feedback input. For U2, the negative feedback path includes resistor R104 disposed in parallel with capacitor C42. The negative feedback path in U13 includes resistor R10 disposed in parallel with capacitor C41. As previously described, the signal provided by amplifier U13 is sensed by transformer 120 such that there is also an overall negative feedback path in the circuit. Taking these various negative feedback paths into account, the cancellation circuit is governed by Equation 1. This equation assumes no discontinuity in the loop.

$$V_o = I_f R9(k_1) + V_{ir}(k_2) \qquad \text{(Equation 1)}$$

Wherein, $V_o$ represents the U13 output voltage,
$I_f$ represents the fault current in the electric vehicle,
$V_{ir}$ represents the IR drop in the neutral conductor,
$k_1$ and $k_2$ are constants, and
R9 represents the resistor value.

Equation 1 clearly shows that the output voltage of amplifier U13 is affected by the fault current in the electric vehicle as well as the voltage drop in the neutral conductor. The two constants $k_1$, $k_2$ are established by the turns count (n) of the secondary winding of the differential transformer and various resistance values in the cancellation circuit as follows:

$$K1 = \frac{[R104(R10 + R110)]}{[n(R10)(R110) + (R104)(R10 + R110)]} \qquad \text{(Equation 2)}$$

$$K2 = \frac{[R104(R10 + R110)]}{[n(R9)(R110) + (R104)(R10 + R110)]} \qquad \text{(Equation 3)}$$

One skilled in the art will understand that, in light of the equations provided above, the expression "$I_f(k_1)$" represents the cancellation voltage component from amplifier U13 as related to the fault current. Since $k_1$ must be less than or equal to one, a portion of the fault current is, in fact, cancelled. In one embodiment of the present invention, two thirds of the fault current is cancelled. This means that if the electric vehicle is expected to leak no more than 20 mA to ground, then the cancellation current allows no more than one third of that, or about 6 mA that would be sensed by the upstream GFCI.

The expression $V_{ir}(k_2)$ represents the cancellation voltage component from amplifier U13. This voltage component is generated in response to the voltage drop in the neutral conductor. Since $k_2$ has to be less than or equal to one, this means that a portion of this voltage drop is also cancelled by circuit 156.

In one embodiment of the present invention, almost the entire fault current is cancelled by making $k_1$ substantially equal to one (1). This is accomplished by making the negative feedback resistor R10 a large value or by removing it from the circuit altogether. The overall feedback path is then relied upon to stabilize the gain of U13. In the process, Equation 1 simplifies to the following:

$$V_o = I_f(R9) + V_{ir}$$ (Equation 4)

The output voltage $V_o$ of amplifier U13 causes a current ($I_f$) to flow through resistor R9. This current can be a pure AC current since power supply 108 is isolated from the power connectors and the need for a DC bias voltage is eliminated. The outcome is that $V_{ir}$ has substantially the same magnitude, frequency, and wave shape as the voltage drop in the neutral conductor, Vir, except that it is opposite in polarity. No matter what the voltage drop is in the neutral conductor ($V_{ir}$), there is an equal and opposite voltage component ($V_{ir}$) from the amplifier that cancels it. Consequently, the loop current is no longer affected by $V_{ir}$.

Taking this one step further, the current passing through resistor R9 is the loop current $I_L$. From equation 4 (with the Vir component cancelled), current $I_L$ is governed by just the EV fault current:

$$I_L = I_f$$ Equation 5

The unwanted voltage component having been cancelled, the circulating current is then able to prevent an upstream GFCI from nuisance tripping. The circulating current $I_f$ has substantially the same magnitude and frequency, but is opposite in polarity with respect to the fault current propagating on the hot conductor to the electric vehicle. The sum of these two currents is about zero. Since the upstream GFCI responds to this sum rather than to just the current on the hot conductor, the cancellation circuit has prevented false tripping. This is true even if the EV fault current is greater than the trip threshold of the upstream GFCI. However, for faults occurring in parallel with the EV charging station, the cancellation circuit 156 provides no canceling signal. For this reason the cancellation circuit does not interfere with the upstream GFCI's ability to detect and interrupt ground fault currents occurring in loads elsewhere in the branch circuit.

Cancellation circuit 156 is configured to prevent nuisance tripping of an upstream GFCI even when an electric vehicle fault current starts abruptly. Thus the cancellation circuit 156 needs to generate the cancellation signal almost immediately. Further, the cancellation signal must also be relatively stable. If this signal is not stable, e.g., because of overshoot, the overshoot could cause the upstream GFCI to nuisance trip. Circuit stability is achieved in part by using the previously described negative feedback components and by DC coupling the signal path from differential transformer 120 to R9. Note that there is no coupling capacitor between transformer 120 and amplifier U2, and no coupling capacitor between amplifier U2 and amplifier U13. Unwanted DC voltages that could arise in the cancellation circuit may be cancelled by way of potentiometer R155. In another embodiment, a capacitor (not shown) is connected in series with resistor R110 so that amplifier U13 only produces an AC gain (unwanted DC voltage is not amplified.) In an alternate embodiment, active DC nulling circuit 157 is used in lieu of potentiometer 155 and resistors (R154, 156.) As such, a factory adjustment is no longer necessary. Nulling circuit 157 is a low pass filter that measures the DC component of the signal at the output terminal and subtracts it from the input signal of amplifier U13.

Note that the cancellation circuit 156 may be typically included in charging stations referred to as "traveler sets" that plug into a receptacle, but may not be included in permanently connected charging stations that are hard-wired to the electrical distribution system. The hard-wired version of the charging station may be disposed in a dedicated branch circuit that does not include any upstream GFCIs.

The charging station is intended of course to supply power to more than one electric vehicle manufacturer, product category, or model type. Considering the plurality of electric vehicles, some may require protection with a 20 mA GFCI (CCID) while others may require protection at some other threshold, such as 6 mA. To address this issue, the control pilot in the electric vehicle communicates the model number to the charging station. An encoded signal is provided to processor 126. The processor discerns the vehicle identity and alters the trip threshold of GFCI detector 124 accordingly. Processor 126 may disable the cancellation circuit if the electric vehicle in question is not expected to generate enough ground fault leakage current during normal operation to trip the upstream GFCI.

In another embodiment of the present invention, the cancellation circuit 156 may be disposed in a duplex receptacle housing (as opposed to a charging station housing.) This sets up the possibility of two GFCIs in series, namely a circuit breaker-type GFCI that trips at 6 mA, and the receptacle-type GFCI that also trips at 6 mA. These GFCIs may provide power to an electric vehicle or another user load. Ordinarily the two GFCI devices have equal probability of interrupting a fault condition in the downstream load. However, because of the presence of cancellation circuit 156, the receptacle-type GFCI is the one that would interrupt the fault. This outcome is more desirable due to the fact that the receptacle is closer to the point of use compared to the circuit breaker.

In another embodiment of the present invention, the cancellation circuit may be disposed in a duplex receptacle that does not include a GFCI. As such, the receptacle does not include a ground fault detector or a circuit interrupter. A circuit breaker-type protective device that includes ground fault protection feeds power to this receptacle. The cancellation circuit 156 is configured to sense ground fault current flowing through the duplex receptacles, to the feed-thru terminals of the receptacle, or to both. The cancellation circuit 156 is configured in this case to generate a cancellation current that prevents the upstream protective device from tripping due to the fault current. Thus, it is possible to remove certain branch circuit receptacle(s) from the protection that they would otherwise be provided (e.g., by the circuit breaker). In this case, the risks associated with power interruption are greater than the risks associated with a fault condition. Examples of such loads include refrigeration equipment where there is the risk of food spoilage, HVAC equipment, sump pumps, emergency lighting equipment, premise lighting equipment, ice melting equipment, computerization equipment, or medical equipment. Some of the aforementioned loads include electronic filter circuits or simply leak current to ground during their normal usage. Such leakage currents could be enough to cause the upstream protection device to nuisance trip. The leakage of an individual load might not be enough to cause nuisance tripping, however a cumulative leakage involving a combination of loads or the parasitic impedances indigenous to the branch wiring could be enough to do so. Of course, the circuit breaker still affords protection to the remaining receptacles disposed in the branch circuit.

In a similar embodiment of the present invention where cancellation circuit 156 is disposed in a duplex receptacle (or other such housing) that does not include a GFCI detector or circuit interrupter, the cancellation circuit 156 is configured to partly desensitize the upstream device (instead of completely desensitizing the upstream protective device). For example, a load plugged into the duplex receptacle or a load powered by way of the feed-thru terminals is still somewhat protected from a ground fault condition by the upstream protective device but at a greater trip threshold, e.g., 10, 20 or 30 mA. The electrical noise anticipated from the load is much less likely to cause the upstream protective device to nuisance trip.

In another embodiment of the present invention, the cancellation circuit may be disposed in an attachment plug or a housing of a particular appliance. In this embodiment, an upstream protective device will not trip in response to a ground fault condition in the appliance when it would otherwise trip. In another but similar embodiment of the present invention, the cancellation circuit is disposed in an adapter. The adapter is configured to plug into a receptacle and, in turn, includes an integral receptacle of its own into which the attachment plug of an appliance can be plugged. A ground fault condition occurring in the appliance makes the upstream GFCI much less likely to nuisance trip. Thus, the adapter may be used to help an electrician diagnose the cause of a GFCI's nuisance tripping.

Referring again to FIG. 4, note that the GFCI detector 124 is coupled to the cancellation circuit 156 via resistor R9 and amplifiers U14. At first glance this arrangement might appear to be inappropriate since COMP_DRIVE includes an unwanted voltage component related to the IR drop on the neutral conductor. Unless the circuit was designed appropriately, the unwanted voltage component could impair GFCI detector 124 such that it would not be able to detect the ground fault current accurately. Note that this voltage component is present on the sense winding of transformer 120 as well as at the outputs of both amplifiers U2 and U13. See equation 4. This difficulty is resolved by amplifiers U14A and U14B. The ground fault signal is extracted from the cancellation signal and the unwanted voltages are canceled. The buffer amplifiers U14A and U14B receive the cancellation signal from the two ends of resistor R9. The two signals are subtracted by amplifier U14C. The output signal from amplifier U14C is transmitted by amplifier U14D to an input terminal of GFCI detector IC U1. In one embodiment of the present invention, GFCI detector IC U1 is realized by a RV4141 integrated circuit manufactured by Fairchild Semiconductor Incorporated.

The embodiment of FIG. 4 also shows a low impedance path 151 disposed within transformers 120, 122. As described previously, the self test circuit 150 is enabled by processor 126 to test whether the GFCI function is capable of detecting and interrupting a fault condition. When the self test takes place, low impedance path 151 is closed by the self test circuit to initiate a simulated neutral-to-ground ground fault condition (a grounded neutral fault.) This simulation represents a true ground fault condition in the electrical distribution occurring between neutral conductor 142 and ground conductor 144. The simulated grounded neutral fault condition couples a signal from neutral transformer 122 to differential transformer 124. Since this coupling represents a positive feedback path with respect to GFCI detector 124, the detector breaks into oscillation. The frequency of oscillation is around 5 kHz. When processor 126 detects this signal, the self test has passed. Passing this test is a prerequisite for allowing the circuit interrupter to reset. The cancellation circuit 156 is stabilized with negative feedback paths that are selected so as not to interfere with this self test signal.

The embodiment of FIG. 4 further depicts a neutral coupling circuit 400 that includes relays K2 and K3. When the cancellation circuit is disabled, steering relay K2 uses one of its form C contacts to divert current through resistor R9 to ground. This avoids nuisance tripping during self test. In the process of the cancellation circuit becoming enabled, wiring detect relay K3 selects which conductor (102 or 104) is the neutral polarity. After that, relay K2 connects the cancellation circuit to the selected conductor. Relay K3 has form C contacts so there is never the possibility of a short circuit between the phase and neutral conductors.

The neutral coupling circuit 400 is employed, in part, to prevent nuisance tripping of the upstream GFCI. The neutral coupling circuit 400 prevents the cancellation circuit 156 from directing a transient signal into the neutral conductor during the power initialization phase. During the power initialization phase, the power supply 108 may not be fully charged. A spurious signal could cause the upstream GFCI to nuisance trip. To avoid this problem, relay K2 is coupled to a power supply delay timer that decouples the cancellation circuit 156 from the neutral conductor for a predetermined time delay. The time delay is greater than the expected power supply charge up time. Further if it were not for this decoupling, cancellation circuit 156 would attempt to cancel the self-test signal. It would impress a current on the wire loop that resembles the test signal. This current would be detected by the upstream GFCI and cause it to nuisance trip.

In another embodiment of the present invention, the cancellation circuit 156 is not disabled during certain self-tests because this would expose the upstream GFCI to the self test signal. The self test signal is chosen such that a GFCI at the upstream position would not be able to detect it. In this embodiment, the self-test signal is a signal pulse that only GFCI detection circuit 124 is capable of detecting. The pulse may be timed to occur at a particular phase angle of the AC power source voltage, such as at a zero-crossing. The pulse signal may be timed to occur on a particular half cycle polarity (the positive or negative half cycle polarity) of the AC power source if it is known that the upstream GFCI is incapable of detecting a fault current that occurs on that polarity. Another approach (disclosed in FIG. 6) depicts an alternate embodiment of the cancellation circuit 156. In this embodiment the cancellation circuit has its own differential transformer 120'. The self test signal is confined to differential transformer 120. Thus the cancellation circuit is completely oblivious to the self-test signal and so is not made to generate a wire loop current that would cause the upstream GFCI to nuisance trip. Thus self-testing can be performed at any time utilizing any waveshape without concern for nuisance tripping.

In another embodiment of the invention, circuit interrupter 130 is opened whenever the user provides a change request to the charging station. Before circuit interrupter 130 resets, the neutral cancellation circuit 400 decouples the cancellation circuit from the neutral conductor and a self-test execution takes place.

Another purpose for the neutral coupling circuit 400 is to make sure the cancellation circuit 156 is not damaged and continues to operate when there is a reverse polarity wiring condition. Reverse polarity wiring means that the phase and neutral conductors have been transposed somewhere upstream of the charging station. When there is a reverse polarity condition, phase conductor 102 in the charging station acts as if it were the neutral conductor. Accordingly, wiring detect relay K3 connects the cancellation circuit 156 to phase conductor 102 instead of two neutral conductor 104.

In continuing the discussion of FIG. 4, note that actuator circuit 129 is also depicted therein. The actuator circuit 129 includes solenoids K1 and K4. The signal input CCID RELAY must be in a high state for solenoids K1, K4 to energize. Other conditions must also be met before solenoids K1, K4 can become energized. In any event, when solenoids K1 and K4 are energized by the wiggle signal (CCID RELAY), the interrupting contacts (132, 134) close and circuit interrupter 130 enters the reset state. The CCID RELAY signal is generated by wiggle circuit 152 depicted in FIG. 3. The wiggle circuit 152 receives the CONTROL PILOT signal from processor 126. The CONTROL PILOT signal is a square wave that is used to charge capacitor C14. When processor 126 reaches end of life, there is no longer a square wave at the CONTROL PILOT pin. Instead, the voltage on the CONTROL PILOT pin is either zero volts or a DC voltage or zero. Of course, little or no current flows through C14 since capacitors only conduct AC current. The resulting voltage on capacitor C13 is not enough to keep Q6 and Q5 ON. Since Q5 is OFF, CCID RELAY is low and solenoids K1, K4 cannot be energized. Thus, circuit interrupter 130 cannot be reset. Accordingly, the wiggle circuit 152 prevents reset of the circuit interrupter when the processor is experiencing an end of life condition.

Figure 5:
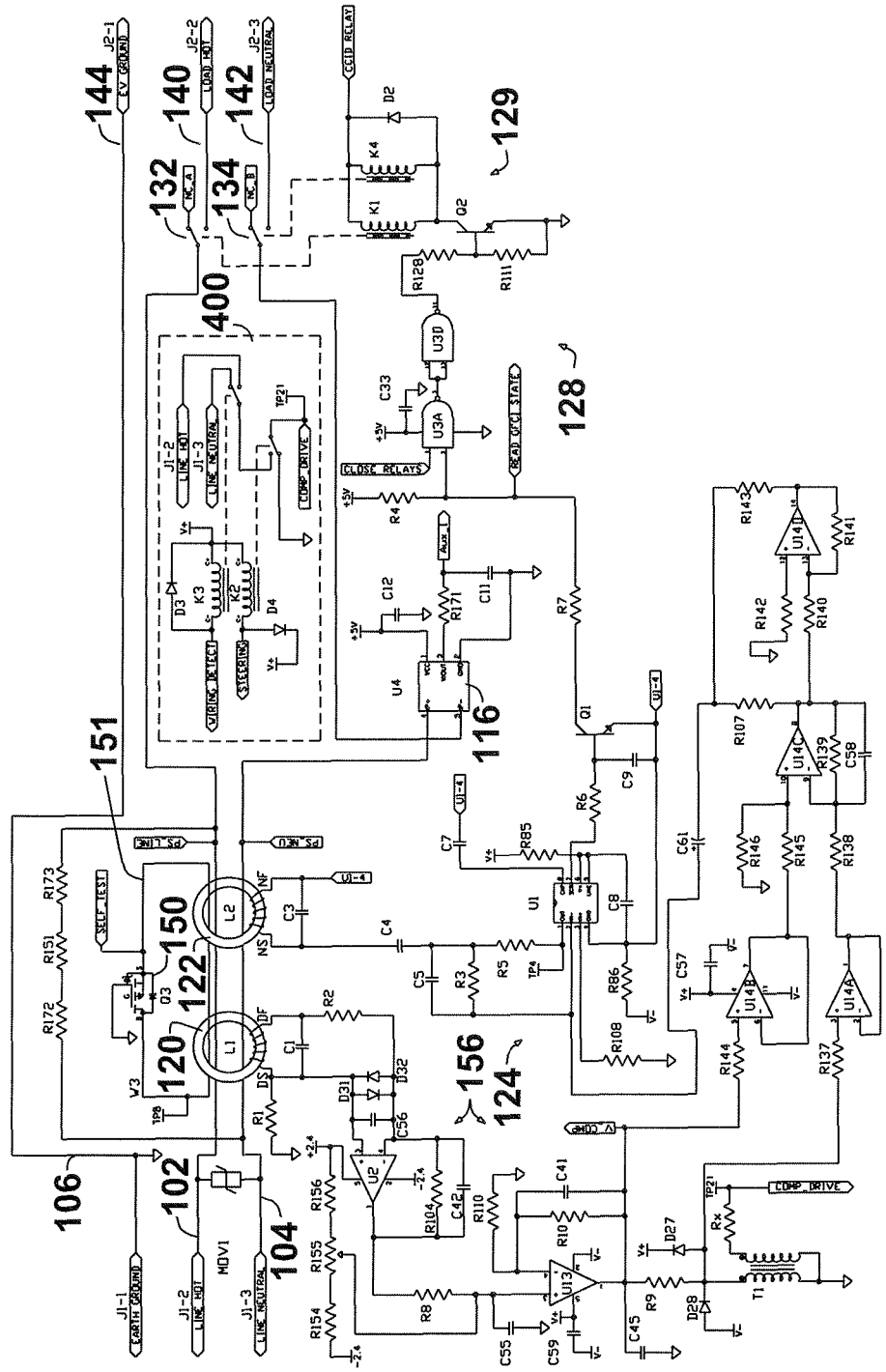
FIG. 5 is a schematic diagram of a cancellation circuit in accordance with another embodiment of the present invention.

Referring to FIG. 5, a schematic diagram of a cancellation circuit 156 in accordance with another embodiment of the present invention is depicted. The cancellation circuit depicted in FIG. 5 is referred to as an "open loop" leakage current detection circuit whereas the circuit shown in FIG. 4 is referred to as a "closed loop" leakage current detection circuit. The difference between the two circuits relates to the point where the neutral coupling circuit 400 is connected to the neutral conductor 104 (or phase conductor 102 if there is reverse polarity wiring.)

Referring to neutral coupling circuit 400, note that the switch controlled by K3 is configured to toggle between line hot and line neutral. In other words, the neutral coupling circuit 400 is connected upstream of differential transformer L1. In comparison, the neutral coupling circuit depicted in FIG. 4 is connected downstream of differential transformer 120. In each circuit implementation, there is a wire loop formed by a voltage source and an impedance in the cancellation circuit being connected across the upstream neutral and ground conductors bonded at the panel. In FIG. 5, however, the wire loop does not pass through transformer L1. Accordingly, transformer L1 does not sense any of the current flowing in the wire loop. As such, transformer L1 is oblivious to the voltage drop in the neutral conductor and the "noise current" that it sets up in the wire loop and, therefore, cannot measure and cancel the noise current. This implementation may be desirable because the noise current may be used to identify a bad connection in the neutral path or ground path, or may be used to identify an over-current condition. Of course, these conditions could result in a shock or fire hazard if they are allowed to persist. In this implementation, because the noise current is not cancelled, an upstream GFCI may detect the noise current as a ground fault current and trip to thereby interrupt the hazard. Note also that if the only signal that propagates through the cancellation circuit is a fault signal, GFCI detector 124 does not have to be differentially coupled to the cancellation circuit 156. In this embodiment, the GFCI detector IC U1 may be directly connected to the output of either amplifier U2 or to amplifier U13. This implementation eliminates the circuitry associated with amplifiers U14A-D.

Another feature associated with the circuit of FIG. 5 relates to the inclusion of transformer T1 at the output of cancelation circuit 156. The cancellation circuit output voltage is provided via a secondary winding of a transformer T1 instead of via the output of amplifier U13 for several reasons. Transformer T1 is used to match the impedance of U13 and its output circuitry to the impedance of the wire loop. This permits the cancellation current injected into the neutral conductor to be greater than 20 mA (peak). A current of 20 mA is near the limit of what amplifier U13 can source. Higher currents may be required if the ground fault current of the electric vehicle contains harmonic distortion. Another purpose of transformer T1 relates to the sensitivity of the amplifiers U2 and U13. If there is more current passing through the neutral conductor of differential transformer L1, the gains of amplifier U2 and/or U13 do not have to be as great. By reducing the impedances of resistors R104 and/or R10 and capacitors C42 and/or C41 (i.e., the negative feedback path impedances), the stability of cancellation circuit 156 is improved. Transformer T1 also provides isolation and the elimination of unwanted feedback. Transformer T1 may be configured to keep unwanted voltages in the wire loop from back-feeding into the output of amplifier U13 and damaging the amplifier. These unwanted voltages may be due to lightning surges, inrush currents, excessive steady state load currents, poor electrical connections, and the like. These unwanted voltages, therefore, may be either transient or continuous in nature. The core material of transformer T1 is chosen to be lossy and/or to have low saturation. The windings are chosen to have an appropriate turns ratio so that the disturbance on the secondary winding does not induce a damaging signal on the primary winding. As before, a low pass filter at the output of amplifier U13 comprising a resistor R9 and capacitor C45 may be included to additionally protect the output of amplifier U13.

Figure 6:
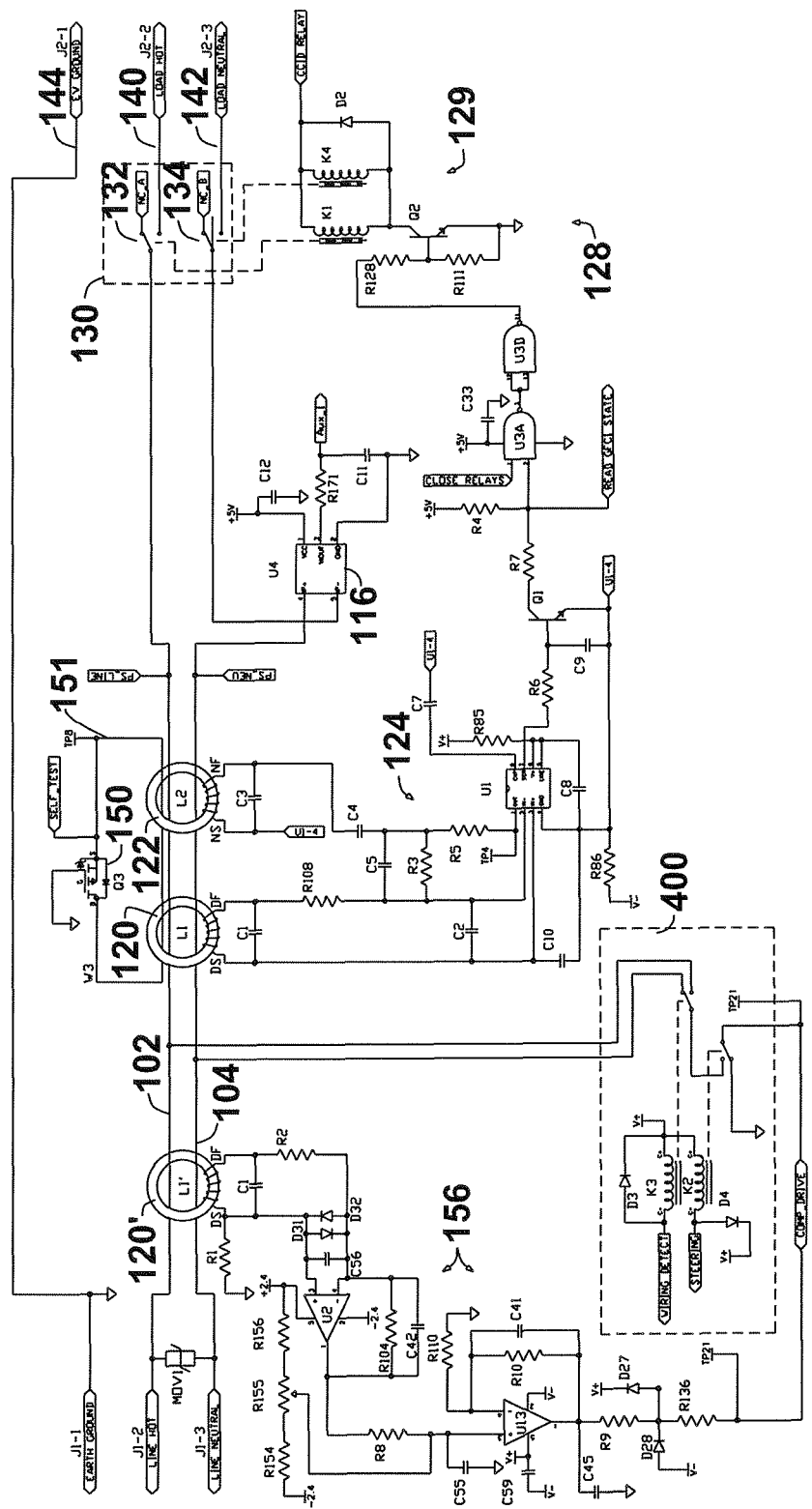
FIG. 6 is a schematic diagram of a cancellation circuit in accordance with an alternate embodiment of the invention.

Referring to FIG. 6, a schematic diagram of a cancellation circuit in accordance with an alternate embodiment of the invention is depicted. Although the cancellation circuit 156 is shown as a closed loop circuit, it could have been shown as an open loop circuit. Like the previous embodiment, the cancellation circuit 156 is configured to desensitize the upstream GFCI in the manner previously described. However, in this embodiment, the cancellation circuit 156 and the GFCI detection circuit 124 are implemented as independent circuits. As such, the cancellation circuit includes a committed differential transformer 120'. The GFCI detection circuit 124, on the other hand, derives its signal from differential transformer 120. Thus, the coupling circuitry between cancellation circuit 156 and GFCI detection circuit 124 is eliminated.

Another feature of the circuit depicted in FIG. 6 is that the two transformers (120,120') need not be of identical construction. Transformer 120 may be optimized for the GFCI detection function. In one embodiment, transformer 120 may be configured to include a ring laminate core whose permeability decreases as frequency increases. This implementation eliminates nuisance tripping associated with high frequency noise propagating in the electrical distribution system. A transformer of this type does not allow the high frequency components to be induced on the secondary windings. In similar manner, the transformer 120' may be optimized for its function within the cancellation circuit. Transformer 120' may be configured to include a ferrite core whose permeability has a greater bandwidth than transformer 120. The greater bandwidth allows the cancellation circuit to detect and eliminate high frequency noise that might otherwise cause the upstream GFCI to nuisance trip. Another reason for separating the cancellation circuit from the GFCI function is that it allows self testing to be conducted continuously, even during a charging cycle, without causing an upstream GFCI to nuisance trip.

Figure 7:
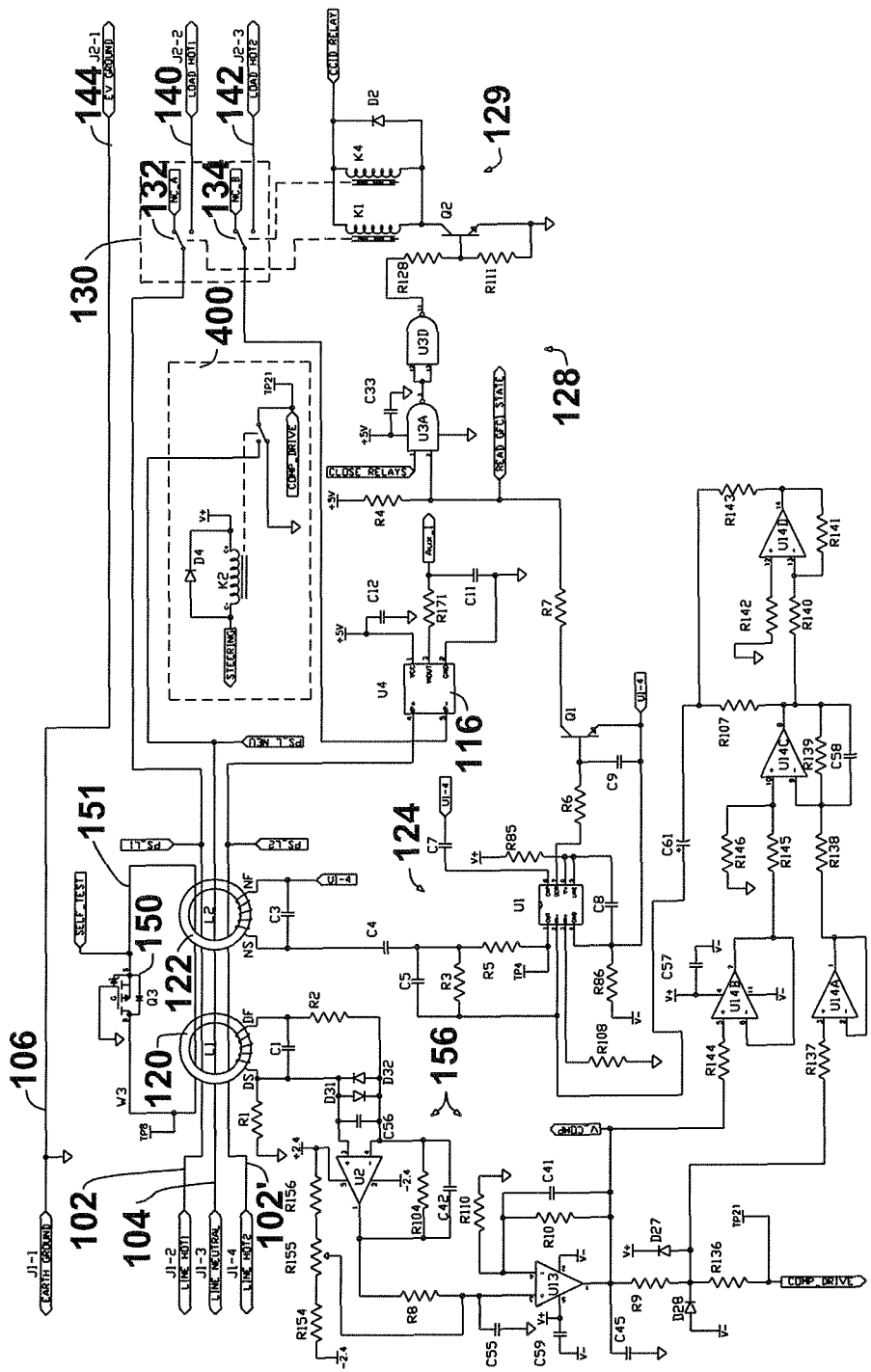
FIG. 7 is a schematic diagram of a cancellation circuit in accordance with yet another alternate embodiment of the present invention.

Referring to FIG. 7, a schematic diagram of a cancellation circuit in accordance with yet another alternate embodiment of the present invention is depicted. Although the cancellation circuit 156 shown in FIG. 7 is a closed loop circuit, it could be implemented as an open loop circuit. In this embodiment, there is a two phase (also referred to as a split phase) electrical distribution system comprising two phase conductors (102, 102') and one neutral conductor 104. The principles that have been presented for a single phase electrical distribution system also apply to multi-phase electrical distribution systems (two or three-phase.) Note that cancellation circuit 156 again forms a wire loop comprising conductors (104, 106.) The cancellation circuit 156 takes advantage of the fact that reverse polarity wiring is not possible in a two-phase system. Thus, the wiring detect relay K3 is omitted.

As embodied herein and depicted in FIGS. 8A and 8B, schematic diagrams of a ground continuity monitor in accordance with embodiments of the present invention are depicted. In general, an improper ground condition includes a poor or missing electrical connection in the ground circuit to the charging station. As a result of the poor electrical connection, or an absence of a ground wire altogether, there is unwanted impedance. The measurement of the quality of the ground path, therefore, relies on feeding a sense current through the upstream ground conductor and measuring the magnitude of the output signal. This measurement is performed by a ground continuity monitor. In certain embodiments of the invention, the impedance above which the ground is considered improper is a value within the range of 5,000 to 40,000 Ohms. On the other hand, certain embodiments of the present invention are configured to measure impedance values as low as approximately 20 Ohms. Once the ground continuity monitor establishes that there is proper grounding, ground relay 178 is closed and another grounding test takes place to make sure that there is not an improper grounding condition in the "load" circuit between the charging station and the electric vehicle. Improper grounding conditions in the load circuit likewise include a poor electrical connection and also miswired conditions such as transposition of the phase and ground conductors.

Referring to FIG. 8A, a block diagram of a ground continuity monitor 158 is shown. This embodiment does not require any input from a cancellation circuit 156. Ground continuity monitor 158 may be used when the cancellation circuit 156 is inactive such that cancelation circuit 156 does not disrupt the sense signal indicative of improper grounding.

Ground continuity monitor 158 is configured to compare the impedance of the line ground conductor, as represented by Rgnd, to a DC reference value (K) 804 using comparator 806. As shown in FIG. 1 and repeated herein, the line ground conductor is coupled to the line hot conductor through the AC power source transformer. The +5V output of power supply 108 is coupled to the line hot conductor 102 by way of sense resistor Rs. A small DC sensing current flows through resistor Rs, line phase and the line ground conductor. Thus, the lumped impedance of the line ground conductor and the sense resistor Rs form a voltage divider. Low pass filter 800 filters out AC voltages such that only the DC voltage component across RS is provided to the input of comparator 802. If the resistance Rgnd of the line ground conductor is relatively small in comparison to the value of resistor RS, most of the DC voltage from the power supply will appear across resistor RS. If Rgnd is greater than a predetermined amount, the output of the differential amplifier 802 will be greater than reference value (K) 804 and the comparator 806 will turn the NPN transistor ON to alert processor 126 to the ground continuity fault. The state of the NPN transistor is read via the READ GFCI STATE pin of processor 126. Again, the READ GFCI STATE pin indicates whether an improper grounding condition exists. Once the processor 126 determines that there is a ground continuity fault, the ground relay 178 either remains open, or is opened, such that a charging cycle is either prevented or interrupted.

In reference to the sensing current, note that the magnitude of the sensing current is inherently limited because it is provided by the power supply 108. Thus, the value of sense resistor Rs is not primarily selected on the basis of limiting hazardous fault current. The value of resistor Rs is typically between 200 KOhms and 2 MOhms on the basis of the degree of sensitivity required by monitor 158. However, the sense resistor Rs also does function to limit hazardous current.

Referring to FIG. 8B, a block diagram of an alternate ground continuity monitor 158 is shown. In this embodiment, the sensing signal is provided by oscillator 808 which directs a high frequency oscillation signal into the circuit. In one embodiment, the oscillator provides a 1 KHz sensing current. Ground continuity monitor 158 is configured to compare the impedance of the line ground conductor, as represented by Rgnd, to a DC reference value (K1) 818 using comparator 816. As shown in FIG. 1 and repeated herein, the line ground conductor is coupled to the line hot conductor through the AC power source transformer. The AC output of oscillator 808 is coupled to the line hot conductor 102 by way of sense resistor Rs via an isolation capacitor Cs. High pass filter 810 filters out power line frequencies such that differential amplifier 812 compares the oscillator 808 output with the high frequency voltage component of the voltage drop across RS. Peak detector 814 converts the output signal of amplifier 812 into a DC voltage. Comparator 816 compares the DC voltage against DC reference voltage 818. The output of comparator 816 is connected to the NPN transistor which uses the READ GFCI STATE pin of processor 126 for indicating an improper grounding condition in the manner previously described. Like the embodiment in FIG. 8A, if the resistance Rgnd in the line ground conductor is negligible compared to the value of resistor Rs, most of the high frequency signal will appear across resistor RS. If however, there is a relatively high resistance Rgnd in the ground conductor the ground continuity monitor 158 signals processor 126 that a fault condition exists (i.e., READ_GFCI_STATE is ON). When this occurs, the ground relay 178 is prevented from closing, or interrupted, and a charging cycle is either prevented or interrupted.

Capacitor CS does not affect the measurement since its impedance at the oscillation frequency is considerably less than the resistance of RS. Note that capacitor CS has "an across-the-line" rating meaning that at end of life it fails open. The ground continuity circuit will interpret an open capacitor in the same manner as a poor ground and signal processor 126 to prevent a charging cycle. Thus the capacitor's failure mode is "fail safe."

The maximum oscillation frequency of oscillator 808 is about 9 kHz, the FCC limit for unintentional radiators. The minimum oscillation frequency of oscillator 808 must be sufficiently greater than the power line frequency, i.e. 60 Hz. The frequency that is selected needs to allow high pass filter 810 to strip off the AC power line frequency voltage present in the voltage drop across resistor RS. Also, as the selected frequency is increased in value toward the maximum frequency limit, the smaller the value of capacitor CS becomes. A low capacitor value translates to a relatively smaller size and helps meet the objective for a low value of sensing current at the AC power source frequency.

In an alternate embodiment shown in the Detail view, line segment 103 in FIG. 8B may be replaced by circuit 103'. Circuit 103' includes a resistor $R_T$ in parallel with a switch S1. Switch S1 may be controlled by the SELF_TEST signal from processor 126. When the switch S1 is closed, it provides a low impedance path and the circuit 103' operates in the same way that circuit segment 103 operates, i.e., it provides a short circuit path between capacitor Cs and resistor Rs. When the switch S1 is open, the current path includes threshold resistor $R_T$. The value of is $R_T$ is set at the threshold impedance that the ground continuity monitor 158 considers equivalent to a ground continuity fault. In other words, when Rgnd is greater than or equal to $R_T$, the ground continuity monitor 158 turns the NPN transistor ON to signal the processor that a fault is present. Thus, when processor 126 opens switch S1, the ground continuity monitor 158 successfully completes the test sequence if it turns the NPN transistor ON. The test fails if the NPN transistor remains OFF. Thus, if processor 126 reads the READ_GFCI_STATE pin as an active LOW state it will determine that the ground continuity test passed, and it will allow the ground relay 178 to be closed. If the ground continuity test fails at some point after initialization when the device 10 is in the reset state, processor 126 will open the ground relay 178 and trip the circuit interrupter 130. Those of ordinary skill in the art will understand that switch S1 may be implemented using any suitable switching device depending on size, cost, signaling issues, etc. For example, S1 may be implemented using a relay, a semiconductor switch, an FET, or a bi-polar transistor.

Figure 9:
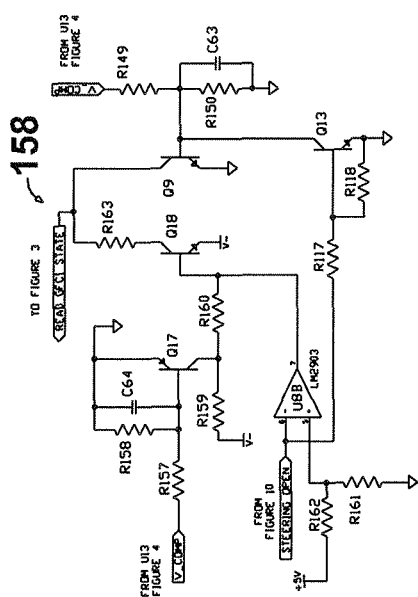
FIG. 9 is a schematic diagram of a ground continuity monitor 158 in accordance with an alternate embodiment of the present invention.

Referring to FIG. 9, a schematic diagram of a ground continuity monitor 158 in accordance with an alternate embodiment of the present invention is shown. In this embodiment, the ground continuity monitor 158 employs the signal V_COMP as an input signal. As shown in FIG. 4 and FIG. 5, V_COMP is derived from the cancelation circuit 156 in general, and from the output of amplifier U13 in particular. Thus, V_COMP is a voltage signal that corresponds to the cancelation current signal provided by cancelation circuit 156. Thus, this embodiment relies on the cancellation circuit for its operation. As noted above, the cancelation circuit 156 circulates a current signal through a feedback loop that is comprised of the line neutral conductor and the line ground conductor. Thus, V_COMP may be monitored for voltage drops that are indicative of high impedances in the line ground conductor. In addition, because the ground continuity monitor 158 employs V_COMP as the sensing signal for determining the quality of the ground, the signal has a frequency that corresponds to the power line frequency, e.g., 60 Hz.

The ground continuity monitor 158 of this embodiment essentially includes four parts. The first part relates to the switching circuit comprised of amplifier circuit U8B. This circuit is employed by processor 126 to turn the ground continuity monitor OFF by disabling transistors Q9 and Q18. Because V_COMP is an AC signal that includes a positive half cycle and a negative half cycle, the ground continuity monitor 158 must monitor both half cycles. Thus, the circuit comprised of transistors Q17, Q18 compares the negative half cycle with a negative voltage threshold and the circuit comprised of transistor Q9 compares the positive half cycle to a positive threshold value. The output portion of the ground continuity monitor 158 is comprised of transistor Q9 and transistor Q18. These transistors form a NOR gate. If either transistor or both transistors are ON, processor 126 will READ GFCI STATE as being LOW. A more detailed description of the circuit is provided below.

Ground continuity monitor 158 is connected in two places to the output of amplifier U13 (i.e., V_COMP signal). The signal is coupled to a positive peak detector Q9 by way of a voltage divider (R149, R150.) When the voltage on the base of Q9 is greater than a predetermined voltage threshold (the base-emitter diode drop of Q9), then detector Q9 turns ON and signals the READ GFCI STATE input of processor 126 that there is a ground discontinuity problem. In a similar manner, a negative peak detector Q17 is coupled to the output of amplifier U13 by way of voltage divider (R157, R158.) When the resulting voltage drop on the base of Q17 is greater in magnitude than its base-emitter diode drop, then Q17 signals the READ GFCI STATE input of processor 126 by way of transistor Q18 that there is a ground discontinuity condition. The reason for including the two detectors is to avoid an unwanted half cycle delay time that could otherwise occur before the ground discontinuity condition is detected.

In the discussion of the cancelation circuit of FIG. 4, it was noted that the cancellation current COMP_DRIVE is comprised of several components such as the ground fault leakage current and the background current generated by background circuit R172, R151 and R173. In the discussion it was also noted that when the circuit interrupter 130 is tripped and the ground relay 178 is open, COMP_DRIVE would be approximately equal to zero if the background circuit were not provided. Since V_COMP is the voltage signal related to COMP_DRIVE, the only assured voltage component that is present in V_COMP when the device 10 is tripped is the voltage component generated by the background circuit (R172, R151, R173) shown in FIG. 4. This is precisely the purpose of the background circuit. The background current is always present because the background circuit is hard-wired between line neutral and line hot. Thus, a sensing current for determining the quality of the line ground path is always assured. Transformer 120 senses the differential background current as it would a current caused by a ground fault condition.

One feature that each of the embodiments of the ground continuity monitor have in common is that the low magnitude of the sensing signal is below the trip threshold of the upstream GFCI such that it is not detected as a ground fault condition. For the embodiment of FIG. 9 in particular, the cancellation circuit cancels the differential current flowing through resistors (R172, R151, R173) by generating a current on the aforementioned wire loop. The upstream GFCI could detect this current as a ground fault if it were not limited. This is a relatively simple task because the sensing current is based on a known source voltage and a known resistance value. For example, in one embodiment of the present invention, the combined resistance of the resistors (R172, R151, and R173) is approximately 1 Meg-Ohm. Thus, the current flowing in this circuit path is about 120 uA when the supply voltage is 120 VAC.

As briefly noted above, the purpose of the amplifier circuit U8B relates to a requirement that the ground continuity monitor 158 and its two detectors (Q9, Q17) be disabled during self testing. The combination of comparator circuit U8B and transistor Q13 performs this function in response to the control signal fed to steering relay K2. The goal of the self test cycle initiated by self test circuit 150 is to prove that the GFCI function in the charging station is operational. However, if appropriate steps were not taken, the self test signal could cause the cancellation circuit 156 to generate an erroneous output voltage. Ground continuity monitor 158 would, in turn, interpret this voltage as a ground discontinuity condition and drive the READ GFCI STATE signal to indicate that the GFCI function had successfully tripped. This would be the case even if the GFCI were to have an end of life condition. Thus, the ground continuity monitor 158 and its two detectors (Q9, Q17) must be disabled to truly test the GFCI function during self testing. As noted above, the comparator U8B and transistor Q13 operate in response to the control signal fed to steering relay K2. A sequence of events occurs during the charging cycle. Initially, relay K2 directs the cancellation current to ground during the self test cycle, and at the same time relay K2 disables ground continuity monitoring circuit 158. As such, the ground continuity circuit cannot generate an output voltage when self testing is taking place to cause a false self test acceptance. The STEERING OPEN signal is what causes the toggling of K2 and the disabling of the ground continuity monitoring circuit.

In another embodiment of the present invention, processor 126 may be equipped with separate inputs for ground continuity monitor 158 and GFCI detector 124. While a self test cycle is in progress, any signal occurring on the ground continuity monitor input pin is ignored in this embodiment. Processor 126 determines whether or not the GFCI function has experienced an end of life condition based on the signal (or lack thereof) on the GFCI detector input.

In the various embodiments of the present invention described herein, the cancellation circuit 156 provides signal inputs to other circuits, such as the ground continuity monitoring function and the ground fault detection monitoring function. As such, the present invention contemplates combining all of these functions into a single circuit to thereby reduce the part count and improve certain functionalities. This feature is noticeably present in the output voltage of amplifier U13, which as described above, may include a plurality of superimposed voltage components. One of the features of the present invention relates to the methods for treating the superimposed voltages output of U13 despite the fact that the overall magnitude of the combined voltages is indeterminate. The magnitude of the combined voltages is indeterminate by virtue of the fact that the levels of ground fault current in the electric vehicle and voltage drop in the neutral conductor are indeterminate. This situation is further complicated by the fact that it may be desirable to trip when the total output voltage at U13 represents one condition but not another. For example, it may be desirable to trip when there is a ground discontinuity condition, but not trip when a normally occurring neutral voltage drop occurs. Also, it is desirable to identify which condition caused the circuit interrupter to trip, aiding repair.

One method employed by the present invention for distinguishing between a ground continuity condition and a normally occurring voltage drop in the neutral conductor relies on the interpretation of the voltage magnitude. Note that a ground discontinuity condition typically generates such a strong U13 output voltage that it far exceeds the worst case voltage expected from a voltage drop in the neutral conductor. For example, if the background current is 120 uA, then the cancellation current around the wire loop becomes 120 uA. If the threshold at which a ground is considered discontinuous is greater than or equal to 42 KOhms, then the voltage across the discontinuity at this threshold is 5 Volts. Since the value of resistor R9 is considerably less than 42 KOhms (in one embodiment it is about 100 Ohms), then the voltage at the voltage output of U13 has to be about 5 Volts to effect the cancellation current. By comparison, the greatest voltage drop expected in the neutral conductor (under steady state loading conditions) is 2 Volts. Thus if a ground discontinuity condition and voltage drop condition co-exist, the voltage drop in the neutral conductor even though indeterminate has only a secondary effect on the output voltage of amplifier U13.

Another method employed by the present invention for distinguishing between a ground continuity condition and a normally occurring voltage drop in the neutral conductor has been previously presented. Briefly stated, the voltage drop across resistor R9 is caused by a ground fault condition but not the voltage drop across the neutral conductor, allowing these two components to be distinguished.

Another method employed by the present invention for distinguishing between a ground continuity condition and a normally occurring voltage drop in the neutral conductor is to perform certain system checks after the circuit interrupter 130 has been tripped. After tripping occurs, the electric vehicle is decoupled from the charging station so the battery is no longer charging. The load current, the voltage drop in the neutral conductor due to the electric vehicle, and any EV ground fault leakage current are near or at zero. By process of elimination, a large voltage at the output of amplifier U13 can only be present if there is a ground discontinuity. Processor 126 is, therefore, programmed to identify the voltage as a ground discontinuity fault under this circumstance.

In another configuration employed by the present invention, the cancellation circuit 156, ground fault detection and ground continuity monitoring are combined to take advantage of certain synergies. For example, cancellation circuit 156 functions like a watch dog timer for end of life conditions that impair the operation of the GFCI function. If resistor R9 of cancellation circuit 156 open-circuits, amplifier U13 saturates as the cancellation circuit attempts to generate a cancellation current, and trips the circuit interrupter since the GFCI function is incapable of doing so.

Figure 10A:
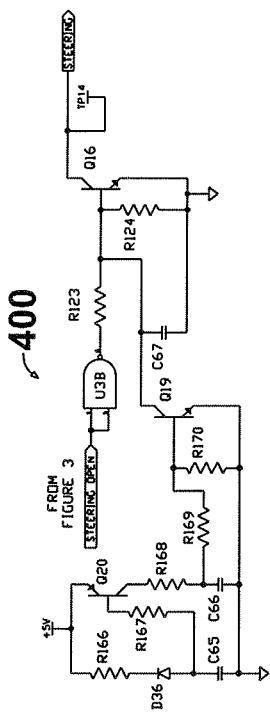
FIGS. 10A-10B include schematic diagrams of control input portions of the neutral conductor coupling circuit depicted in FIGS. 4, 5 and 7 in accordance with an embodiment of the present invention.
Figure 10B:
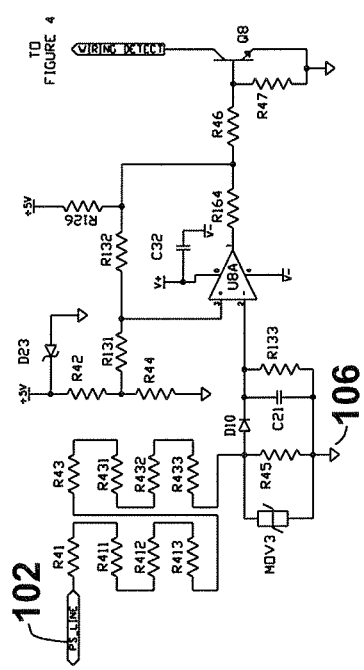

Referring to FIGS. 10A-10B, schematic diagrams of control input portions of the neutral conductor coupling circuit 400 depicted in FIGS. 4, 5 and 7 in accordance with an embodiment of the present invention are disclosed. Referring back to FIGS. 4, 5 and 7, note that the neutral conductor coupling circuit 400 is at least partially controlled by the signals STEERING and WIRING DETECT. The circuitry that provides these signals is described herein.

FIG. 10A shows the signal STEERING OPEN being input into circuit 400. The STEERING OPEN signal from processor 126 controls steering relay K2 by way of NAND gate U3B and transistor Q16. This signal, therefore, enables the processor 126 to control the timing of relay K2 such that the cancellation signal is diverted to ground (rather than to conductor 102 or conductor 104 by relay K3) at the appropriate time. The reason for the diversion of the cancellation signal to ground has been previously explained. In any event, the signal STEERING OPEN is gated by NAND gate U3B and conditioned by circuit 400 to provide the STEER- ING signal used by switching portions of the neutral conductor coupling circuit 400 depicted in FIGS. 4, 5 and 7.

Neutral conductor coupling circuit 400 includes a +5 VDC conditioning circuit. This circuit monitors the +5 VDC power supply to prevent erroneous control signals from being provided by the coupling circuit during the power initialization cycle or during times when the power supply is intermittent. During the power up cycle, there is a short period of time before processor 126 stabilizes. Further, if the EV charging station 10 is receiving an intermittent supply voltage from the electrical distribution system, perhaps due to a loose plug, the +5 VDC supply may be interrupted. Those skilled in the art will understand that the +5 VDC supply is important because digital circuitry often employs +5 VDC TTL voltage levels on both the data and addressing lines. If the +5 VDC signaling levels are compromised, the TTL voltage levels on both the data and addressing lines may also be compromised, leading to erroneous results.

The +5 VDC conditioning circuit includes resistors R166, R167, capacitor C65, and transistors Q19, Q20. As has been stated, it ensures that cancellation circuit signal is being diverted by relay K2 to ground at the proper time. If the +5 VDC supply collapses, transistor Q19 turns ON after a brief period of time, governed by the time constant of the RC circuit formed by R166, C65. When the +5 VDC supply returns, transistors Q19, Q20 are held ON for a predetermined period of time. This period of time is governed by the time constant of the RC circuit formed by R167, C65. Relay K2 maintains the diversion of the cancellation signal to ground for as long as transistors Q19, Q20 are turned ON. Once the power voltage is safely established the transistors turn OFF.

In reference to FIG. 10B, the neutral coupling circuit 400 also includes a reverse polarity wiring detection circuit that uses the line hot signal (PS LINE) to generate and provide the signal WIRING DETECT to relay K3. See FIG. 4. The phase conductor 102, i.e., PS LINE, is directed into a voltage divider formed by a plurality of series resistors (R41, R411, R413, R43, R431, R432 and R433) and resistor 45 connected to ground. The presence of a voltage across resistor R45 indicates that the hot line conductor is not reverse wired. The voltage divider drives comparator U8A LOW such that transistor Q8 is turned OFF. Accordingly, relay K3 diverts cancellation signal to neutral conductor 104. However, if there is a reverse polarity condition, there is little or no voltage across resistor R45. Comparator U8A is driven HIGH and transistor Q8 turns ON to energize the solenoid of relay K3. As a result, relay K3 diverts cancellation signal to phase conductor 102.

Figure 11A:
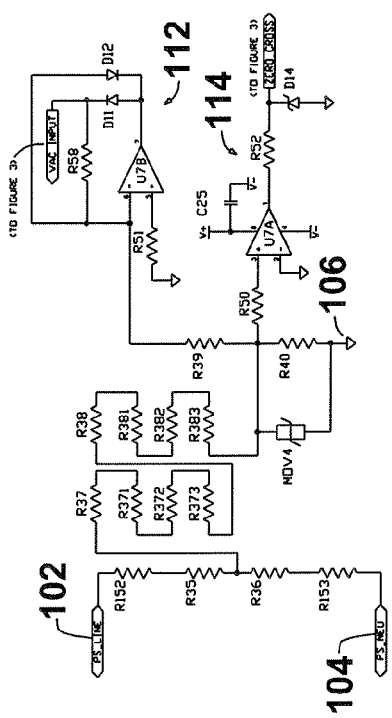
FIGS. 11A-B are schematic views of a peak detector and zero cross detector in accordance with embodiments of the present invention.
Figure 11B:
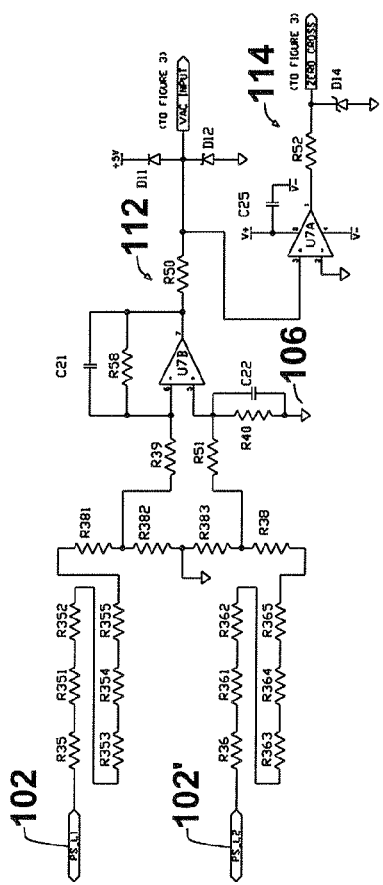

FIGS. 11A-B include schematic views of a voltage parameter detection circuit including a peak detector and a zero cross detector in accordance with embodiments of the present invention. Referring to FIG. 11A, a schematic representation of peak detector 112/zero cross detector 114 in accordance with one embodiment of the present invention is disclosed. The phase line voltage (PS LINE) and the neutral line voltage (PS NEU) are connected to detectors (112, 114) via a T-connection. One benefit of the T-connection is that the detector still operates even if the phase and neutral conductors are transposed. The phase line is connected to a first resistor leg R152, R35 and the line neutral is connected to a second resistor leg R36, R153. The junction point of the two resistor legs is connected to a plurality of series resistors (R37, R371, R372, R373, R38, R381, R382, and R383). In a split phase electrical distribution system, the second leg connects to the second phase conductor (not shown) instead of to a neutral conductor. See FIG. 11B. In one embodiment, the resistance in the first leg is 900 KOhms. The resistance in the second conductor leg is 300 KOhms. In one embodiment, the resistances of the two legs are intentionally dissimilar. The dissimilarity ensures that a source voltage will be present regardless of whether the electrical distribution system is single phase or split phase, whether there is a reverse polarity condition in which the phase and neutral supply conductors are transposed, or whether the power source ranges between 85 VAC to 265 VAC.

The coupling series resistors are coupled to ground by way of resistor R40. A movistor MOV 4 is connected in parallel with resistor R40. The voltage present at the point where the series coupling resistors are connected to resistor R40 is directed into comparator U7A and amplifier U7B. Since the resistance of R40 and the coupling resistance in the one embodiment are about 100 KOhms, approximately 90 uA of leakage current is directed into the ground conductor. Thus, comparator U7A derives the ZERO CROSS from the T-connection circuit and provides it to processor 126. Amplifier U7B also samples the voltage from the T-connection circuit and provides the VAC INPUT signal to processor 126.

Referring to FIG. 11B, an alternate schematic of the voltage parameter detection circuit, i.e., peak detector 112 and the zero cross detector 114 is shown. In this embodiment, the T-connection of FIG. 11A is replaced by a circuit that may be employed in both a split phase system and a single phase system. The voltage parameter detection circuit configuration of FIG. 11B accommodates single phase, split phase electrical distribution systems and three-phase electrical distribution systems. Source voltage conductors 102, 102' represent different phase legs of the three-phase system. Even for a three-phase system, amplifier U7B is able to provide an accurate peak voltage value to the VAC input of processor 126.

Briefly then, the voltage parameter detection circuit depicted in FIG. 11B is configured to take a first voltage reading from a first voltage source conductor and a second voltage reading from a second voltage source conductor to derive various voltage parameters such as zero cross data and voltage magnitude data therefrom. The first voltage reading and the second voltage reading are referenced to the reference ground terminal. Processor 126 drives the circuit interrupter into the tripped state if the voltage parameters are not within predetermined tolerances. One feature of the voltage parameter detection circuit is that it is operational when the reference terminal is not at an earth ground potential.

Thus, the first voltage source conductor 102 is connected to a first resistor leg (R35, R351, R352, R353, R354, R355, 381) and the second source voltage conductor 102' is connected to a second resistor leg (R36, R361, R362, R363, R364, R365, R38). In the single phase system, line neutral conductor 104 is connected to the second resistor leg. Resistor 381 in the first leg is connected to resistor R382 which is, in turn, connected to ground. Resistor 38 in the second leg is connected to resistor R383 which is also connected to ground. The resistors R382, R383 are referred to as center-grounded viewing resistors. The center grounded viewing resistors are connected to amplifier U7B which provides a scaled measurement of the voltage signal (VAC_INPUT) to processor 126. Diodes D11 and D12 limit the instantaneous AC voltage to values between 0 and +5 volts. The VAC_INPUT signal is also provided as an input to comparator U7A. Comparator U7A provides zero-cross information via the ZERO CROSS input to processor 126.

The voltage zero-cross parameter indicates a zero crossing wherein an instantaneous voltage magnitude is substantially equal to zero.

With respect to the embodiments of either FIG. 11A and/or FIG. 11B, it should be noted that the ground continuity monitoring circuit may generate a ground leakage current that may be interpreted by an upstream GFCI as a ground fault. Even though the magnitude of this leakage current is intentionally small (e.g., less than 0.2 mA) nuisance tripping could be eliminated if the leakage current was eliminated. With this in mind, the T-connection of FIG. 11A may be configured such that the leakage current to ground can be employed to annihilate a portion of the leakage current to ground produced by the ground continuity monitoring circuit. Note that the upstream GFCI is not exposed to as much differential current. Thus there is no interference with the ground current monitoring circuit which operates in the manner described. Using the numbers set forth above, if the 90 uA value from the T-connection is subtracted from 0.2 mA from the ground continuity circuit, the leakage current seen by the upstream GFCI is cut by about half.

Note also that the reverse polarity detection circuit described in FIG. 10B leaks current to ground. The 90 uA value from the T-connection can also be used to annihilate a portion of the reverse polarity leakage current seen by the upstream GFCI. Obviously, the annihilation currents and the current being eliminated must be opposite in phase. This is easily accommodated by inverting the polarity of one of the currents. For example, the polarity of the ground continuity monitoring circuit leakage current may be inverted by attaching the differentially connected resistors (R172, R151, and R173) between the load side of neutral conductor 104 to the phase conductor 102 on the line side of differential transformer 120.

In a split phase electrical distribution system, the upstream GFCI is also subjected to an unwanted ground leakage component from the charging station. This component can be annihilated in a similar manner. The two phase system offers an additional advantage by providing another degree of freedom for achieving the necessary phase relationships. The circuit element that is leaking some current to ground deliberately may be connected to whichever of the two line conductors have the correct phase for nullifying the ground leakage component.

Referring to FIGS. 12A-12C, schematic views of user interface control circuits in accordance with the present invention are disclosed. In the circuit of FIG. 12A, eight flip-flops (U11A-11I) provide buffered display outputs in accordance with one embodiment of the present invention. Processor 126 (FIG. 3) provides the signal CHRG LEVEL A as an input to D-flip flop U11A. This signal is stored in U11A by the clocking signal CHRG LEVEL B which is also provided by processor 126. The output of the D-flip-flop U11A is cascaded to the input of each succeeding D-flip flop (i.e., U11B-U11I) by the clocking action of the CHRG LEVEL B signal. Flip-flops 11A-11D drive LEDs D21-D18. These LEDs provide an indication of whether the EV is charging normally. Flip flops U11E-U11I are coupled to voltage dividers that drive the base input of Q12-Q11, respectively. Transistor Q12 is coupled to the POWER LED output of processor 126 and these signals energize LED 15 when power is applied to the EV charging station 10. Transistor Q11 is coupled to the GCM LED output of processor 126 and these signals energize LED 17 to signal whether ground continuity is present or not. Transistor Q10 is coupled to the CCID FAULT LED output of processor 126 and these signals energize LED 16 when the system 10 detects a fault condition.

Those skilled in the art will understand that the aforementioned signals from processor 126 may be employed to drive the display portion of a graphical user interface. The display portion may be implemented using CRT, LCD, plasma, etc. implementations.

FIG. 12B depicts a user input circuit that includes a user actuatable switch S1 coupled to the +5 VDC power supply rail via pull-up resistor R80. When the user closes the switch, the signal CHARGE LEVEL is driven high signaling the processor to begin the charging process. Those skilled in the art will understand that the signal CHARGE LEVEL may be provided to processor 126 via a graphical user interface that includes input devices such as keyboards, touch screens, a computer mouse, etc.

FIG. 12C depicts a 2×5 interface ribbon that supports signal communications between units of the charging station 10.

Figure 13:
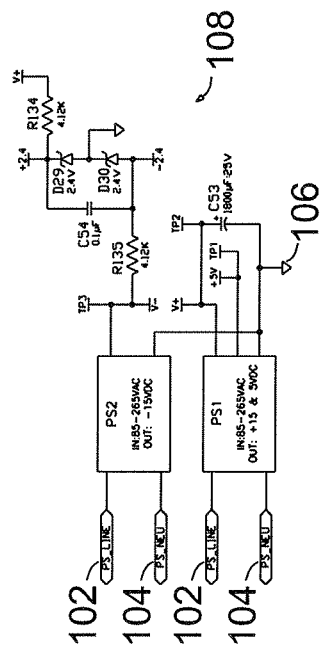
FIG. 13 is a block diagram of a power supply circuit in accordance with one embodiment of the present invention.

As embodied herein and depicted in FIG. 13, a block diagram of a power supply circuit in accordance with one embodiment of the present invention is disclosed. The power supply includes a first module PS1 that is configured to convert the AC line voltage derived from the line hot conductor 102 and the line neutral conductor 104 into +15 VDC and +5 VDC. The power supply also includes a second module PS2 that is configured to convert the AC line voltage derived from the line hot conductor 102 and the line neutral conductor 104 into-15 VDC. Thus, the power supply provides +/−15 VDC rails and +5 VDC voltage supply for the digital circuitry. Each power supply module (PS1, PS2) include isolation circuitry such that the hot conductor 102 and the neutral conductor 104 are not shorted to ground conductor 106. First and foremost, shorting either the hot or neutral conductors to ground would represent a safety issue. A short circuit would also subvert the functionality of the ground continuity monitor and other features of the charging station. The amount of isolation provided by the power supplies is at least 1.5 kV. In one embodiment, the amount of the isolation provided is 3 kV.

Figure 14:
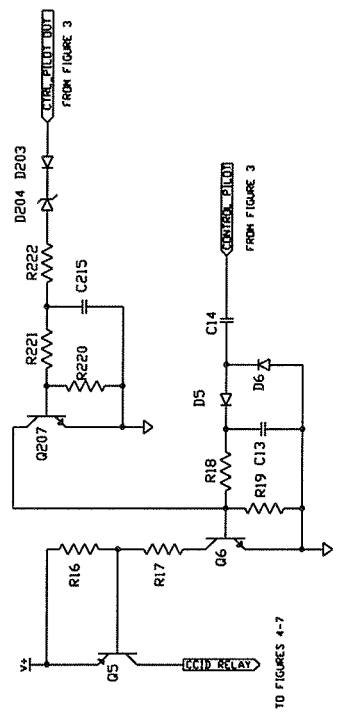
FIG. 14 is a schematic diagram of a wiggle circuit in accordance with an alternate embodiment of the present invention.

Referring to FIG. 14, a schematic diagram of a wiggle circuit in accordance with an alternate embodiment of the present invention is disclosed. One branch of the wiggle circuit receives a signal from the CONTROL PILOT output pin of processor 126 and is responsive to its frequency content. If the processor is generating a square wave within a predetermined range of frequencies, capacitor C14 conducts enough current to turn transistor Q6 ON, assuming for the moment that transistor Q207 is OFF. A second branch of the wiggle circuit controls transistor Q207 in accordance with the CONTROL PILOT signal. Transistor Q207 is OFF when the amplitude of the CTRL_PILOT OUT signal (the return signal from control pilot 160) is less than a predetermined positive peak threshold, e.g. +6 Volts. When transistor Q6 is ON, transistor Q5 is ON. Transistors Q5, Q2 both need to ON in order for relays (K1, K4) to energize and thereby close circuit interrupter 130.

The wiggle circuit 152 is responsive to the frequency component in a similar manner to other embodiments of the invention and in addition is responsive to the voltage level of the control pilot signal. The advantage of including voltage detection in the wiggle circuit is that a charging cycle then only takes place when control pilot 160 is calling for one. An unwanted charging cycle could be the result of transistor Q2 being on at the wrong time due to processor 126 having an end of life condition such as a short circuit.

An unwanted charging cycle could also be the result of an end of life condition in transistor Q2. In addition, the voltage level is indicative of various end of life conditions. When the wiggle circuit 152 detects an end of life condition, it prevents the circuit interrupter from closing and delivering unprotected power to the electric vehicle.

In another embodiment of the present invention, a window comparator is included in the second branch of the wiggle circuit. If the positive amplitude from control pilot 160 is outside a predetermined range of voltages, the wiggle circuit prevents a charging cycle from taking place.

Figure 15:
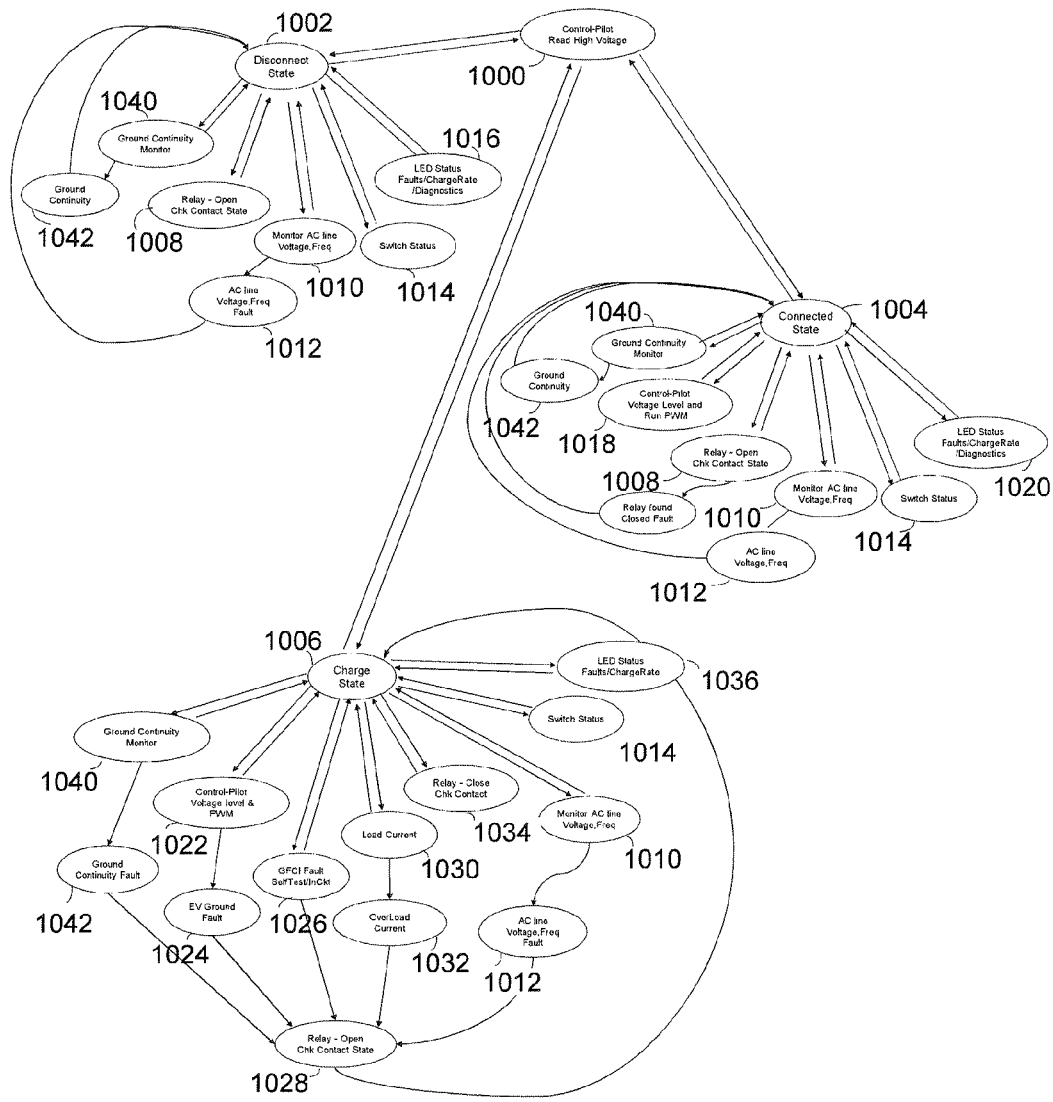
FIG. 15 is a state diagram illustrating the foreground processing activities of the EV charging station.

As embodied herein and depicted in FIGS. 15-20, various state diagrams of the electric vehicle charging station 10 are shown. FIG. 15 depicts activities that processor 126 performs in the foreground whereas FIGS. 16-20 depict interrupt activities that are periodically repeated, during a charging cycle.

As embodied herein and depicted in FIG. 15, a state diagram showing the foreground processing activities of the EV station is disclosed. The processor 126 directs the foreground activity of the EV charging station to follow one of three paths depending on the control pilot signal 1000. The control pilot signal 1000 is the command signal from the electric vehicle 162 to the processor 126. The three states include the disconnect state 1002, the connected state 1004, and the charge state 1006.

With respect to the disconnect state 1002, processor 126 monitors the electric vehicle. Since the electric vehicle is not connected to the charging station at this time, control pilot 1000 is a steady DC level rather than a square wave. When the positive magnitude of control pilot 1000 is about 12 Volts, it is indicative of the fact that the electric vehicle 162 or coupler 146 are not coupled to the charging station. Accordingly, processor 126 recognizes that the electric vehicle 162 or coupler 146 is in disconnect state 1002 and switches the circuit interrupter 130 to enter (or remain in) an open state 1008. The open state may be verified via relay test 148. In state 1010, processor 126 schedules a plurality of measurements. The measurements may include the AC line voltage (via peak detector 112) or the line frequency (via zero cross 114.) If one of the measurements is not proper, measurement fault state 1012 maintains disconnect state 1002. A display includes indicators 168, 174, 172, 170 or 166 which are configured to provide a disconnected display state 1016. The user can manipulate user input 176 to establish the desired switch state 1014. Switch state 1014 establishes the charging rate and may establish when the charging is to take place, whether immediately or late at night when the cost of electricity is cheaper. Changes to switch state 1014 may alter the indication provided by display state 1016. If the interrupting contacts are welded, the indicators enter a welded contact display state 1016'. If one of the measurements provides an improper result, the indicators enter an improper measurement display state 1016".

When the positive magnitude of control pilot signal 1000 is about 9 Volts, electric vehicle 162 is in the "connect state" 1004. This occurs when the electric vehicle and the control pilot 160 becomes coupled to the charging station. The control pilot signal 1000 is now a square wave. When the ground continuity monitor check 1040 indicates that the ground path to the charging station is proper, ground relay 178 closes to allow the control pilot state 1018 to be read. Despite the closure, circuit interrupter 130 is still in open state 1008. Control pilot state 1018 provides two way communications between the electric vehicle and the charging station. The display, which includes indicators 168, 174, 172, 170 or 166, is configured to provide a connected display state 1020. Measurements 1110 or the ability to manipulate switch state 1014 may continue during connect state 1004. Measurements 1110 or manipulation of switch state 1014 may be configured to alter display state 1020.

When the positive magnitude of control pilot signal 1000 is about 6 Volts, electric vehicle 162 is in the charge request state 1006. The control pilot signal is still a square wave. A 6 Volt positive magnitude indicates that control pilot 160 is coupled to the charging station and the circuit interrupter 130 is in a closed state 1034. At this point, the electric vehicle is coupled to the source voltage, and the charging cycle is able to commence. At this time, the negative amplitude of control pilot signal 1000 is verified to be −12 Volts. The −12 volt signal indicates that the ground connection to electric vehicle 162 is present. In another embodiment, the negative amplitude of control pilot signal 1000 is verified during connect state 1004 for the same purpose. The closed state 1034 is maintained through the charging cycle unless a fault condition state happens to occur. The circuit interrupter 130 enters relay open state 1028 in response to a fault condition.

As noted previously, the EV station 10 may detect several fault condition states. Ground continuity monitor check 1040 generates ground continuity output state 1021 if there is an improper ground in the electrical distribution system. Another is electric vehicle ground fault state 1024. This state occurs when there is a discontinuity somewhere in the ground conductor path between the charging station and the electric vehicle. Loss of ground results in a change in the negative magnitude in the control pilot response signal. Another fault state is the GFCI fault state 1026. This state occurs when the GFCI function in the electric vehicle fails the self test regimen previously described. There is the possibility that fault state 1026 is caused by a momentary noise condition rather than a true fault condition. It is also possible that a true fault condition can be cleared or may dissipate after some time has elapsed. Accordingly, the interrupter 130 is allowed to re-enter closed state 1034 after a predetermined time interval. Should the GFCI subsequently pass the self test, the circuit interrupter 130 will remain in the closed state. However, if the GFCI fails the self test, the circuit interrupter 130 is driven into the open state. In one embodiment, the predetermined interval is 15 seconds. The circuit interrupter is given three opportunities to reenter the closed state.

Another fault condition state is related to the charging current (load current.) Load current state 1030 is the charging routine that is selected by the user via user input 176 and communicated to control pilot 160 by way of processor 126 using pulse width modulation.

The overload current fault state 1032 occurs when the actual load current (as sensed by current sensor 116) is greater than the expected current from load current state 1030 in accordance with predetermined time-current curves. Overload current fault state 1032 may include a delay interval in order that inrush current at the onset of the charging cycle is ignored. The time-current curves associated with the overload current fault state 1032 are established by current sense amplifier 118 or processor 126. These curves may all be faster than the curve anticipated in an upstream circuit breaker or overcurrent device. This means that circuit interrupter 130 may interrupt the overcurrent condition in deference to the upstream device. Sometimes overload fault state 1032 is due to a momentary overload condition that does not represent a hazard. Thus interrupter 130 is allowed to re-enter closed state 1034 after a predetermined interval. In one embodiment, the predetermined interval is one minute and the circuit interrupter is given two chances to re-enter the closed state.

The third switch state category 1006 includes measurement state 1010, measurement fault state 1012, and switch state 1014. These states are similar to states that were described in switch state category 1002 and were previously described. The charge display state 1036 employs indicators 166, 168, 174, 172, and 170.

In the relay closed state 1034, processor 126 employs actuator 129. Note that actuator 129 generates heat when the circuit interrupter is in the closed state. The amount of heat may be undesirable. One way to curb excessive heat is for actuator 129 to be controlled at a first energy level to effect the closed state and at a reduced energy state to sustain closure. Another way to control actuator 129 is via two different pulse width modulated signals. One signal effects the closed state and the other signal has a lower duty cycle to sustain closure. Actuator 129 may also be controlled by a DC voltage that effects closure. A square wave having a predetermined duty cycle is employed to sustain closure. When the actuator is operated in such a way, circuit interrupter 130 may be susceptible to entering the open state if the charging station is jarred mechanically. To overcome this problem, the circuit interrupter is monitored by relay test 148 to ensure that it is, in fact, in the closed state. When processor 126 determines that the circuit interrupter 130 is erroneously in the open state through interrogation of relay test 148, the processor generates an output signal for re-establishing the closed state.

Figure 16:
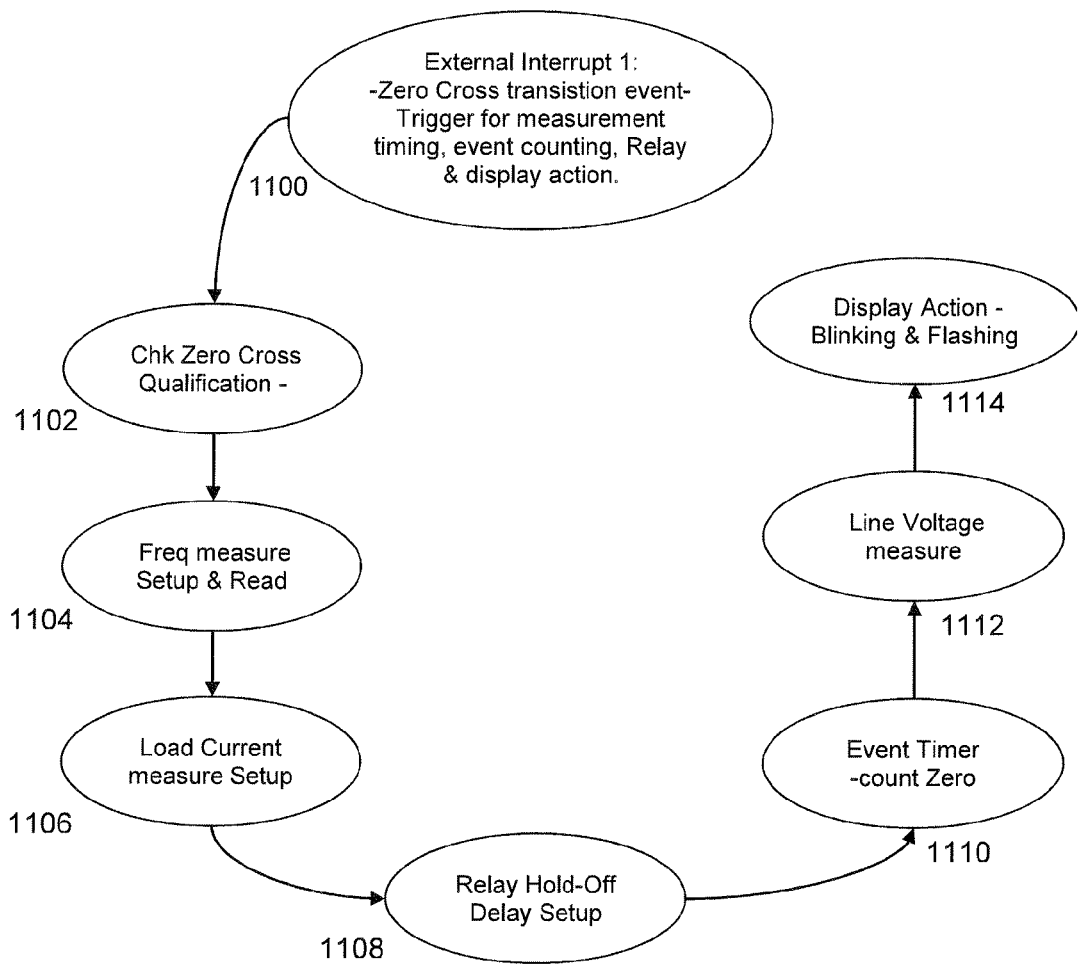
FIG. 16 is a state diagram illustrating zero-cross interrupt processing in accordance with embodiments of the present invention.

As embodied herein and depicted in FIG. 16, a state diagram of the zero cross interrupt 1100 is depicted. In one embodiment, the zero cross interrupt routine 1100 is processed by the processor 126 at the start of every cycle of the AC source voltage. During step 1102 the processor 126 waits until the zero cross measurements stabilize. This enables the processor 126 to accurately measure the zero cross measurements. Ideally, the signal from zero cross detector 114 is a square wave whose period matches that of the power source and whose transitional edges are monotonic. Unfortunately the transitional edges are not always monotonic as the result of circuit instability or high frequency noise. Since the line frequency is calculated from the periods between the transitional edges, it is important that their true locations be identified. This step is performed by software filtering. One filtering strategy is to ignore periods measuring less than a predetermined interval. In one embodiment, periods measuring less than 0.1 mS are ignored. In another embodiment, the predetermined period is greater than half of the period of the source voltage. As such, the transitional edges at the end of each full cycle are still measured but the transitional activity near the mid-point of each AC cycle is ignored. In another strategy, a transitional edge is ignored unless it falls within an expected time window after a preceding zero cross has been detected. In another strategy, the half cycle of the source voltage is verified to be of the proper polarity.

Figure 17:
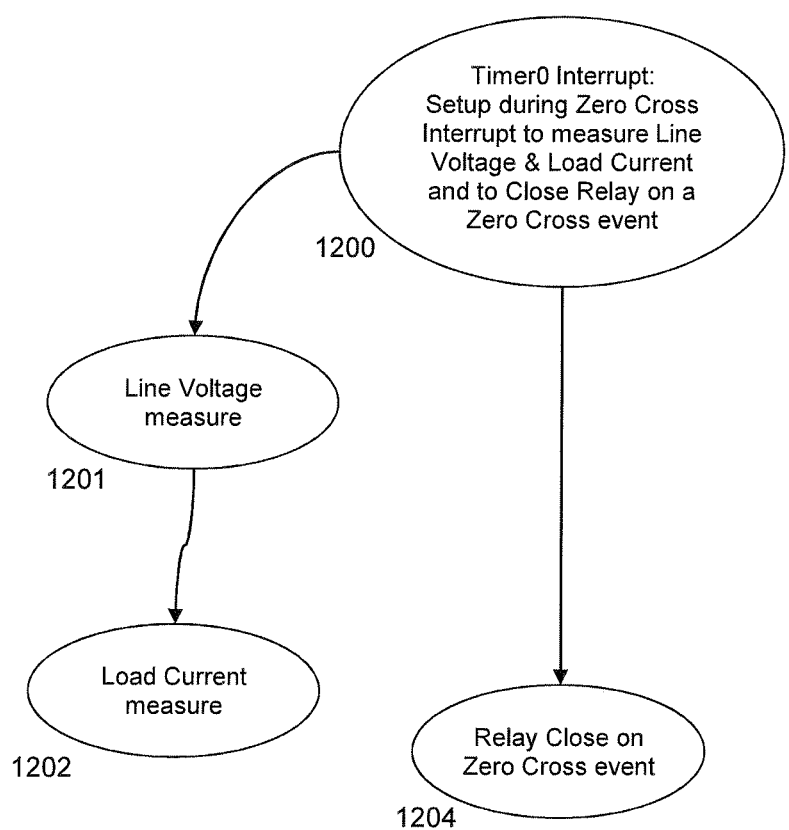
FIG. 17 is a state diagram illustrating a timer interrupt sequence related to current and voltage measurements in accordance with embodiments of the present invention.

During step 1104 the measured period between the zero crosses is gated into memory only if the measurement is within predetermined boundaries. In one embodiment, these boundaries are established at about 10 Hz and 100 Hz. During the power-up routine there needs to be a predetermined number of consecutive cycles whose periods are within the boundaries and thus eligible for gating. In one embodiment, this predetermined number of consecutive cycles is two cycles. After the power-up routine has been completed, step 1104 may be repeated periodically (or may even take place constantly) to make sure that the line frequency has not drifted. If a measurement during this repeat testing is outside of the predetermined boundaries, an earlier gated measurement may take its place. Of course, this substitution is permissible only for a predetermined period of time. If subsequent measurements are still not proper, the processor sends a signal to trip the circuit interrupter (relay.) In another aspect, when the source voltage frequency has been ascertained to be proper it sets an allowable range of voltages for the power source. By way of example, if the measured frequency is 50 Hz, the allowable source voltage range includes 230 VAC, as for Europe. If the measured frequency is 60 Hz, the allowable range of source voltages includes 120 VAC, as for North America. If the actual source voltage (detected by peak detector 112) is not within the expected source voltage range, the processor sends a signal to trip the circuit interrupter (relay) and may indicate the reason for tripping via an indicator lamp. Step 1106 is labeled "load current measure setup." This step implements a digital fuse responsive to an overcurrent condition when the charging station is in the charge mode. The overcurrent condition is sensed by sensor 116 and amplified by current sense amplifier 118. Processor 126 reads the load current at 90 degrees (relative to the zero crossing) of the source voltage, doing this once per line cycle. A timer, which is described in more detail in FIG. 17, is loaded with a value such that the measurement interrupt occurs when the phase angle of the source voltage is at about 90 degrees. The measurement itself uses an analog to digital converter and takes typically 10 to 20 μS. When there is an overcurrent condition, the processor sends a trip signal to trip the circuit interrupter. In another embodiment, the load current is monitored over a full line cycle to determine the phase angle where the maximum load current occurs. Once found, the phase angle (as a time delay with respect to the zero crossing) is stored in memory and applied to subsequent measurements. In another embodiment, the load current is measured a plurality of times during the period of the AC line cycle rather than at a predetermined phase angle. The RMS value of the load current is derived from these measurements.

Step 1108 is directed to the relay close set-up and implements a time delay. Processor 126 transmits a signal to the reset circuit interrupter (relay) 130 via actuator 129, and the delay implemented by step 1108 ensures that contact closure occurs at approximately the next zero crossing of the source voltage. The reason for the delay is because the life expectancy of the circuit interrupting contacts is extended when closed while there is virtually no energy. Of course, the delay needs to take into consideration the mechanical time constants of the interrupter (relay) which may vary from component to component. The mechanical closure time of the particular relay is not known until it is closed initially. During initial closure, an expected turn-on time is held in memory. Although turn-on time is usually on the order of a few milliseconds, it is not a problem if is more than a line cycle. As such, the delay time is measured instantaneously or "on the fly," as it is phrased in the common engineering vernacular. Processor 126 determines the actual closure time by interrogating relay test 148. Armed with this information, processor 126 then is able to close the interrupting contacts during subsequent closures at or near the zero crossing. The circuit interrupter (relay) re-enters the reset state 1034 upon closure.

Step 1110 implements an event timer that counts zero crosses. While processor 126 includes an oscillator configured to provide timing signals for events that last under about 10 mS, the event timer is adept at timing events that last for a plurality of line cycles. The period of a 60 Hz line cycle is 16.67 milliseconds. As such, the event timer is used for performing most of the foreground timing disclosed in FIG. 15. Further, step 1110 becomes enabled only when there is a need in the foreground to do so, for example, when there is to be an attempt to reset the GFCI function after a predetermined period of time (15 seconds.) A benefit from the event timer is that the timing interval is assured of being synchronized to the AC line frequency.

Step 1112 implements a source voltage measurement which is provided by the peak detector 112. A timer is loaded with a timing value to schedule the interrupt such that a voltage measurement is taken at the 90 degree point (relative to the zero crossing) of the source voltage. Analog to digital conversion of the measurement takes place in step 1302 (See FIG. 18). Processor 126 may accumulate and average the readings.

Referring to FIG. 17, a timer interrupt 1200 sequence that performs several activities related to load current and peak voltage measurement. Interrupt 1200 is set when a recurring zero cross is detected. Since the period of a line cycle (and thus its frequency) is already known, the interval between the zero cross and the 90 or 270 degree phase angle, or any other phase angle for that matter, is also known. Timer interrupt 1200 generates an interrupt signal near the 90 degree phase angle for load current measurement 1202 and line voltage measurement 1201. The time required for each measurement is about 10 to 20 µS. During the load current measurement 1202, the load current is measured and checked against various overcurrent threshold limits. The threshold limits range from small to large magnitudes of overcurrents. A running sum counter integrates the current curve over time. The processor polls the measured current every line cycle. During each poll, the amount of the measured current in excess of the closest threshold limit is determined. Based on this difference, a value is added to the running sum counter. If no threshold limit is exceeded, the running sum counter is decremented. As soon as the accumulated value in the running counter reaches a predetermined value, circuit interrupter 130 trips and the overload condition may be visibly or audibly indicated. The faster the running sum counter reaches this value, which happens for comparatively greater overcurrents, the faster the circuit interrupter trips. In other words, there is an inverse time-current curve. This time-current curve is below the anticipated curve of an upstream circuit breaker located in the panel, so nuisance tripping of the upstream breaker is avoided. In other words, the overcurrent device in the electric vehicle station is much more likely to trip than an upstream breaker in response to an overcurrent condition.

In another embodiment, the trip time response is derived from a collection of historical load current measurements 1202. Sixty measurements (or fifty measurements when the line frequency is 50 Hz) are accumulated in a one second buffer and averaged. The resulting averages are written into the one minute buffer until sixty of them (fifty measurements) are accumulated and stored. The one minute buffer is updated each second. Of course, processor 126 requires a certain amount of time to perform these tasks. Thus, in one approach, a running count of the measurements over a period of one second is collected to eliminate the need for a one second buffer (along with storing sixty individual measurements).

The load current measurement 1202 results in the storage of the load current data. The load current data is, therefore, readily monitored by the digital fuse element to discern overcurrent conditions. Unfortunately, charging current is not always a steady value and may be accompanied by an inrush. To prevent an inrush current from being mistaken as an overcurrent fault condition, the digital fuse applies an inverse time-current curve to the stored data. In one embodiment, the digital fuse has different current interruption thresholds depending on what the average current was during the previous 1 second, 5 seconds or 15 seconds of stored data in the 1 minute buffer. Processor 126 will trip the circuit interrupter if the load current was greater than 20 A over the previous 1 second, 19 A over the previous 5 seconds, or 18A over the previous 15 seconds of stored data. The specific time intervals and current values are provided by way of non-limiting example.

In another approach, the circuitry in current sense amplifier 118 includes a signal storage element that holds the peak current for a predetermined period of time. Processor 126 interrogates the signal storage element whenever an instantaneous measurement of the load current is needed. Of course, there is no current when the circuit interrupter (relay) is in the tripped position, so load current measurement 1202 can be bypassed during those occasions.

In step 1201, a supply voltage delay time is measured. In particular, the peak supply voltage is measured at 90 degrees of the voltage cycle in a manner similar to the measurement of peak supply current. Because the voltage measurement takes typically 10 µS to 20 µS to complete, the voltage measurement and current measurement are substantially simultaneous with each other. There are other ways to measure the supply voltage and/or load current to achieve similar results. In one approach, the supply voltage or the charging current are measured at phase angles substantially different from each other. In another approach, the measurements are an average (or RMS) measurement based on several readings that are taken within a cycle of the AC power source.

The relay close step 1204 is also generated by the Timer interrupt 1200 to reset (close) the relay contacts on a zero crossing. The start of the relay close step 1204 is synchronized with a zero crossing. In step 1108 (FIG. 16), the hold-off delay for the relay was set up. The delay period is derived from the previously measured relay close time and the current line frequency period. Thus the delay period takes into account the mechanical closure time of the relay and may include another predetermined interval that ensures closure at a zero crossing. When a decision is made to close the relay, the position of the next zero crossing is measured, or alternatively, may be predicted from the known period of the AC power source. The timing of the zero crossing is readily determined because the close delay interval equals the known period of the AC line cycle minus hold-off time delay 1108, this close delay interval being synchronized to start at a zero crossing. The load current measurement via load current delay 1202 and relay closure via relay close delay 1204 never occur at the same time. The relay must be closed before load current is measured.

Figure 18:
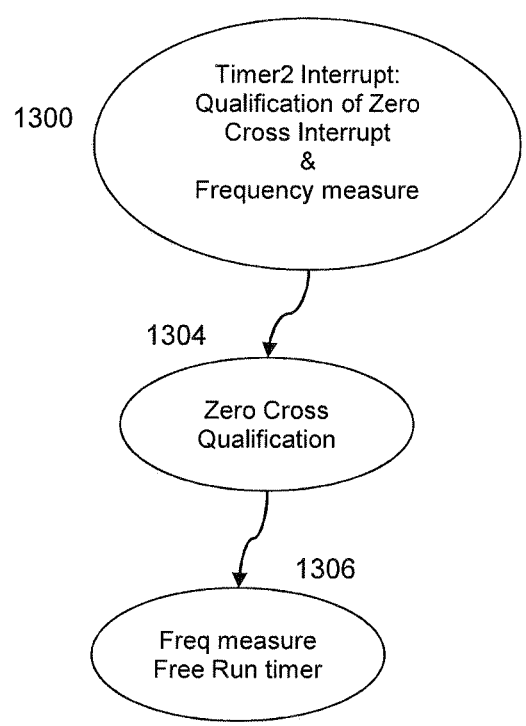
FIG. 18 is a state diagram illustrating a timer interrupt processing related to zero-cross events in accordance with embodiments of the present invention.

Referring to FIG. 18, a process for a timer interrupt 1300 is disclosed. The timer interrupt 1300 has multiple uses related to zero cross events. In step 1304, the timer interrupt 1300 performs a zero cross qualification to determine whether a particular zero cross reading is valid. Timer interrupt 1300 starts counting at a zero cross for a pre-established period of time during which all zero crosses are ignored. A valid zero cross is, therefore, necessarily one that occurs after the elapsed time. The pre-established period of time may be a function of the power source frequency having been previously obtained. For 60 Hz, the period is set for about 14 milliseconds. Alternatively, pre-established period of time is depends on the measured line frequency to ensure that noise occurring at the half cycle zero cross is ignored.

In step 1306, a frequency measurement, derived from the measured period, is implemented by measuring the time between zero crossings. When the frequency has not been established, the zero cross qualification 1304 result is not applied to remove zero cross noise. Instead, low and high frequency boundaries such as 30 Hz and 300 Hz are used to remove noise. Valid zero cross signals are those that follow consecutively between predetermined time limits (in this case, between 3-30 µs. Once the frequency has been established, the boundaries can be tightened around the known frequency. The reason for wanting the frequency boundaries to be variable is to remove as much zero cross noise as possible. By way of example, when the frequency is established as 60 Hz, the boundaries are tightened to 55 to 65 Hz.

As such, two methods for removing zero cross noise have been presented, namely zero cross qualification 1304 and frequency measure 1306. Another method for removing zero cross noise is to double-check whether a zero cross is still being indicated a predetermined time after the zero-cross state change. The zero cross signal has to be confirmed by this repeat reading as stable (at a consistent level) before processing continues. If the reading indicates that there is not a valid zero cross, the zero cross interrupt is cancelled.

Figure 19:
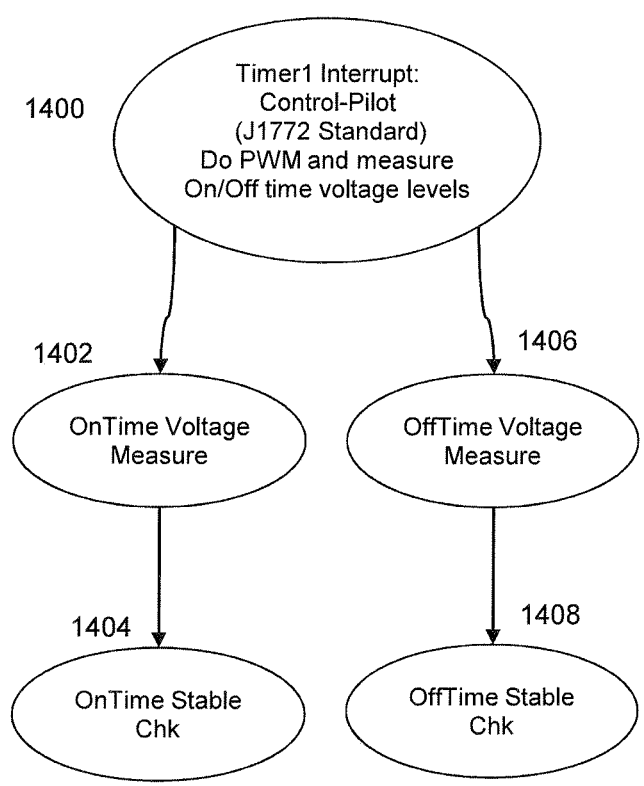
FIG. 19 is a state diagram illustrating a timer interrupt processing related to current and voltage measurements in accordance with embodiments of the present invention.

Referring to FIG. 19, another timer interrupt 1400 is disclosed. Interrupt 1400 is employed as a means for modulating the control pilot signal. As described previously, the control pilot signal is a square wave having a pre-established frequency such as 1 kHz and a variable pulse width. Timer interrupt 1400 encodes certain commands to the electric vehicle. Control pilot 160 communicates back certain intelligence about the vehicle to the charging station 10 by altering the positive or negative amplitude of the square wave. The altered signals correspond to whether the vehicle is in a disconnect mode, connect mode, charge mode, or fault mode. An analog to digital measurement of the control pilot voltage levels are taken at the center of the high states and at the center of the low states of the square wave. The duty cycle of the square wave is established using an up-down counter in combination with a comparator that toggles to a high state when the count exceeds a preset number. The modulated square wave signal (also referred to as a pulse width modulated waveform) appears at an output terminal of processor 126. In addition, the up-down counter establishes interrupt signals that indicate the measurement points for positive or negative amplitudes of the square wave. In one embodiment, the interrupts occur at the count maxima and count minima of the up-down counter. As such, the interrupts occur at the center of the positive states and the negative states of the control signal. In another embodiment, the interrupts occur at other than the maxima and minima. Of course, the measurements then occur at other than the center of the positive states and the negative states of the control signal.

Step 1402 is an interrupt corresponding to the control pilot on-time voltage measurement. During the on-time voltage measurement interrupt, the processor implements the on time stable check 1404 to compare the current measurement with a previous measurement to ensure that the voltage level is stable (noise free.) The measurement is considered to be stable if it is within a few percentage points or a certain count of the previous measurement. If the measurement is outside a predetermined range, and the next measurement is in agreement (within a few percentage points), processor 126 considers the measurement as representing a true level change and thus a valid mode change. In other words, two consecutive measurements have to be about the same before they are considered to represent a new mode. On the other hand, when consecutive measurements are not the same, they are considered untrustworthy and the mode is not deemed to have changed.

Off-time voltage measure 1406 and off time stable check 1408 are similar to steps 1402 and 1404, respectively. The difference is that steps 1402 and 1404 occur during positive portions of the control pilot signal whereas steps 1406 and 1408 occur during the negative portions of the control pilot signal.

Figure 20:
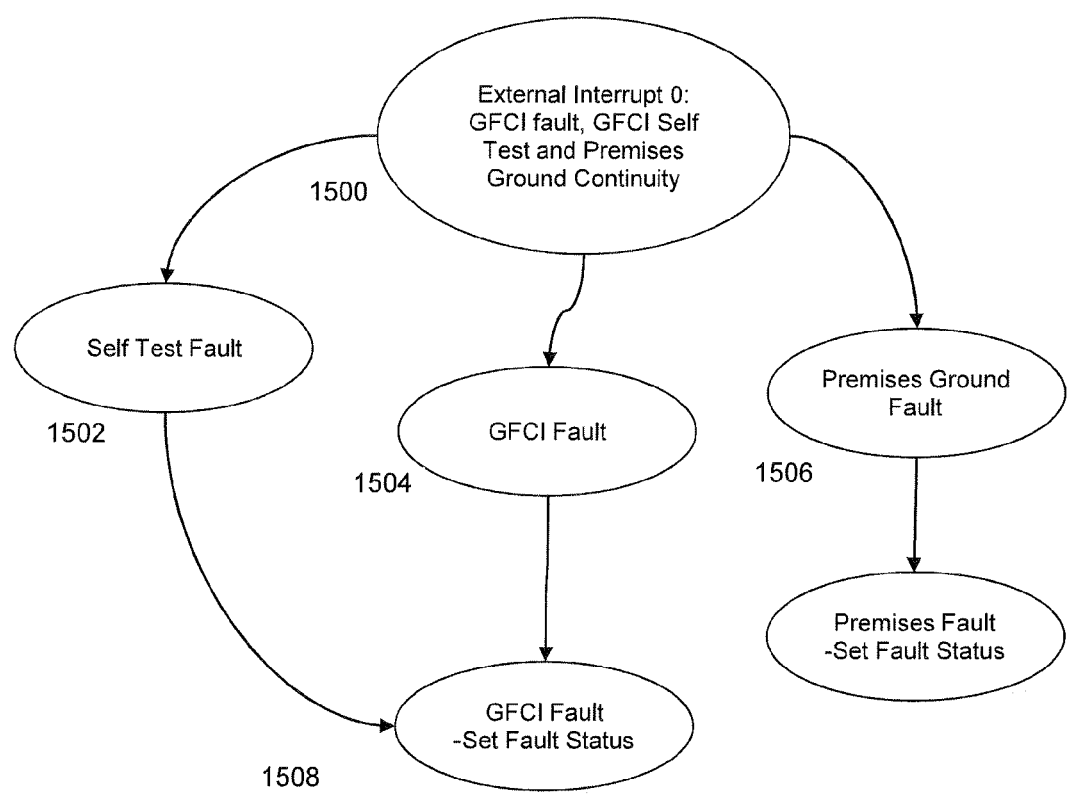
FIG. 20 is a state diagram illustrating processing relating to miscellaneous timer interrupts in accordance with embodiments of the present invention.

Referring to FIG. 20, yet another type of interrupt is disclosed. In this embodiment, external interrupt 1500 may be generated in response to three different events. Self test interrupt 1502 occurs immediately before a circuit interrupter (relay) 130 closure signal is generated. During interrupt 1502, processor 126 generates an output signal to activate self test 1502 (150.) If the various GFCI components included in the self-test (as described herein) are not functional, then processor 126 enters a fault state. Accordingly, fault indicator 170 emits a visible or audible signal and the circuit interrupter remains in the tripped state. The interrupt is then repeated periodically to self-test the GFCI. Upon passing the self test, the circuit interrupter is reset. In one embodiment, the periodicity is about every fifteen seconds. As noted above, self testing may be scheduled when power is applied to the charging station, when the electric vehicle is plugged into the charging station to receive power from the charging station, or at a predetermined time during the charging cycle.

In step 1504, the GFCI interrupt is not related to self-test. Interrupt 1540 occurs whenever there is a true ground fault condition, a simulated fault condition that is activated by a test button, a phase-to-ground ground fault condition, a grounded neutral fault condition, or the like. The manner in which processor 126 distinguishes these various conditions from a self-test event is via a self-test flag. This flag is only activated during self test. Indicator 170 emits a visible or audible signal and circuit interrupter (relay) 130 is tripped in response to interrupt 1504. At this point, processor waits approximately fifteen seconds before resetting the circuit interrupter and turning the fault indicator OFF. If the fault condition has not been removed, the fault is detected, the fault indicator 170 turns back ON and the circuit interrupter trips again. However, this time the fault indicator may indicate in a different pattern or continue to emit a visible or audible signal even if a subsequent reset attempt proves successful. After a predetermined number of failed reset attempts the circuit interrupter can be reset only by way of manual intervention in the manner previously described.

Premises ground fault 1506 refers to an interrupt signal that occurs when there is a ground discontinuity in the path from the electrical distribution system to the charging station. This fault shares the GFCI status line but generates a ground fault state and activates fault indicator 172 as well as opens the circuit interrupter (relay). If the fault continues in the tripped state, the fault will be classified as a ground discontinuity fault. A ground discontinuity indicator, if provided, is activated instead of the ground fault indicator. The circuit interrupter remains open until the premise grounding problem is corrected. There is also the possibility of a ground discontinuity to the electric vehicle but this fault is handled by way of the control pilot signal. Indicator 170 may be energized to indicate this condition. On the other hand, if the fault condition is resolved when the circuit interrupter trips, the fault state remains classified as a ground fault 1508. Unlike premise ground fault 1506, the circuit interrupter automatically recloses after a predetermined period of time, in the manner previously described.

In another embodiment, the premise ground fault 1506 has its own input line to processor 126 and so does not share the READ GFCI STATE line. This allows the line-to-ground fault and the upstream continuity fault conditions to be read independently.

Figure 21:
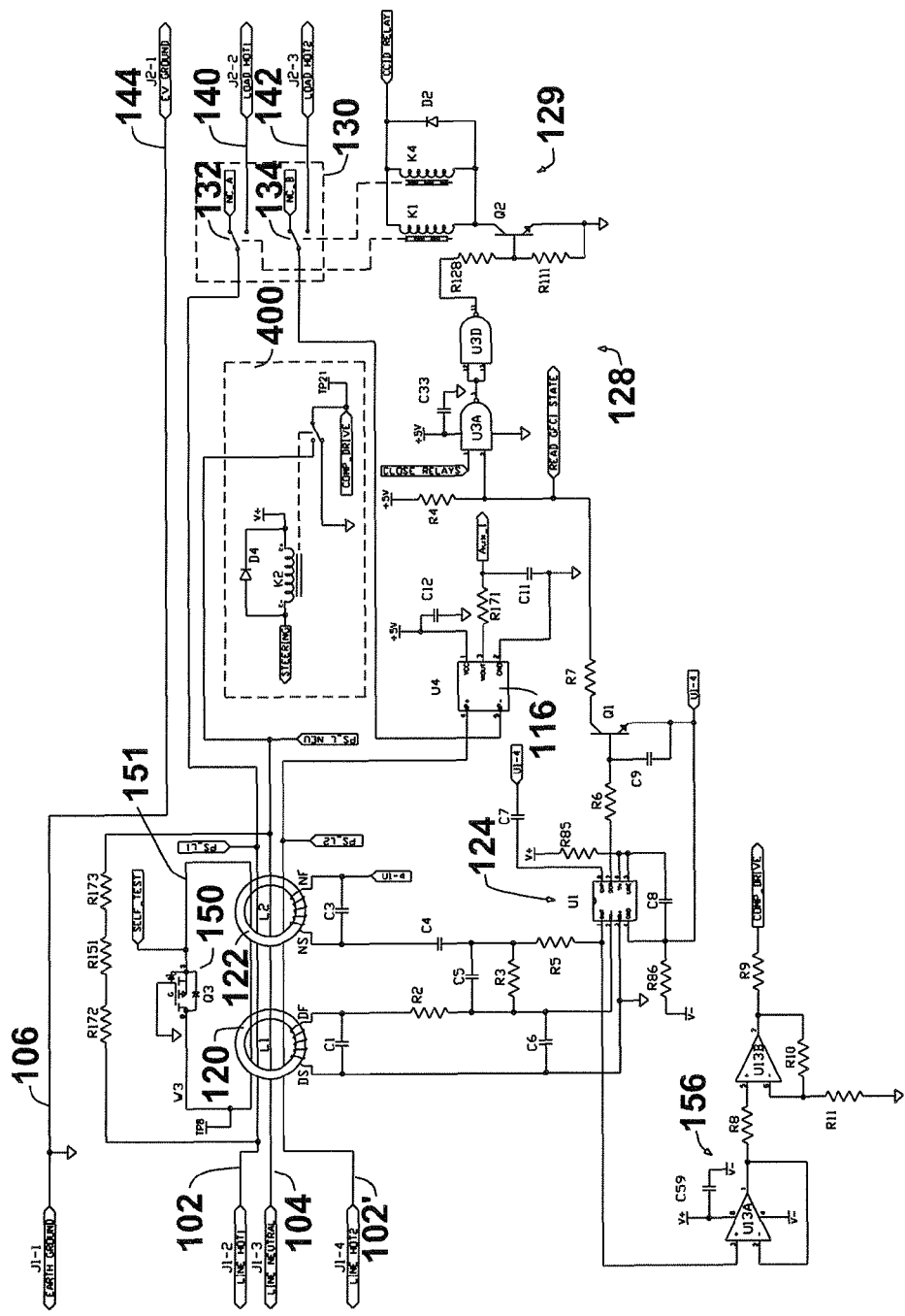
FIG. 21 is a schematic diagram of a cancellation circuit in accordance with yet another alternate embodiment of the present invention.

As embodied herein and depicted in FIG. 21, another embodiment of the cancellation circuit 156 is disclosed. This cancellation circuit embodiment is similar to the one shown in FIG. 7 because it is configured as a split phase electrical distribution system. However, it is readily adaptable to single phase and multi-phase electrical distribution systems. In this embodiment, the GFCI detector 124 includes transconductance amplifier U1 which is coupled to differential transformer 120. The cancellation circuit 156 includes amplifiers U13A, U13B and resistor R9. Amplifier U13A of the cancellation circuit 156 receives its input signal from the output signal port of GFCI detector 124. Amplifier U13A provides signal to output amplifier U13B. The output amplifier U13B is connected to resistor R9 (COMP_DRIVE). The cancelation current (COMP_DRIVE) is directed into the neutral conductor by way of neutral conductor coupling circuit 400 (COMP DRIVE).

GFCI detector 124 also provides a fault detect signal that trips relay drive 128 via transistor Q1. The trip relay 128 signals trip actuator 129 to trip circuit interrupter 130 in response to a ground fault condition.

Figure 22:
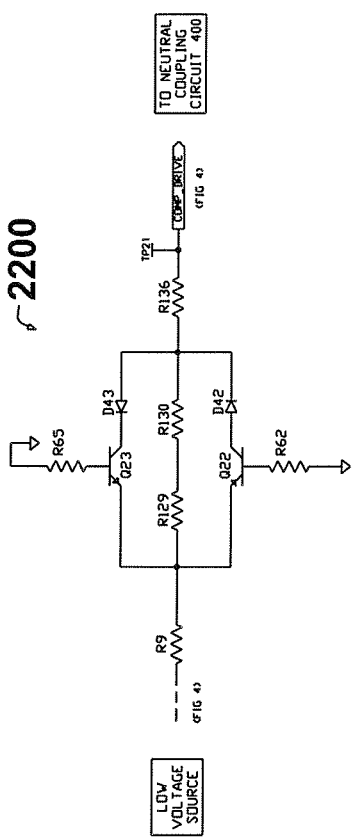
FIG. 22 is a schematic diagram of a tri-state buffer employed in the cancellation circuit in accordance with embodiments of the present invention.

Referring to FIG. 22, a tri-state buffer 2200 is depicted. The purpose of this buffer is to protect the cancellation circuit from over-voltage conditions that can arise on the neutral conductor. Although the drawing indicates that the tri-state buffer is configured to be incorporated in FIG. 4, those skilled in the art will recognize that this buffer may be employed in conjunction with the other cancellation circuit embodiments of the present invention. Output signals from amplifier U13 drive bias transistor 22 or transistor Q23 into conduction depending on the polarity of the output signal such that buffer 2200 introduces little or no coupling impedance between resistor R9 and resistor R136. However, when there is an overvoltage condition at the output of the buffer of the neutral circuit 400, transistors (Q22, Q23) are not biased into conduction. Also, diodes (D42, 43) prevent reverse currents from conducting through the transistors. Consequently there is a relatively high impedance (R129, R130) that serves to protect amplifier U13 from a back-fed overvoltage conditions. In one embodiment the total resistance of resistors (R129, R130) is 60 k-Ohms.

Figure 23:
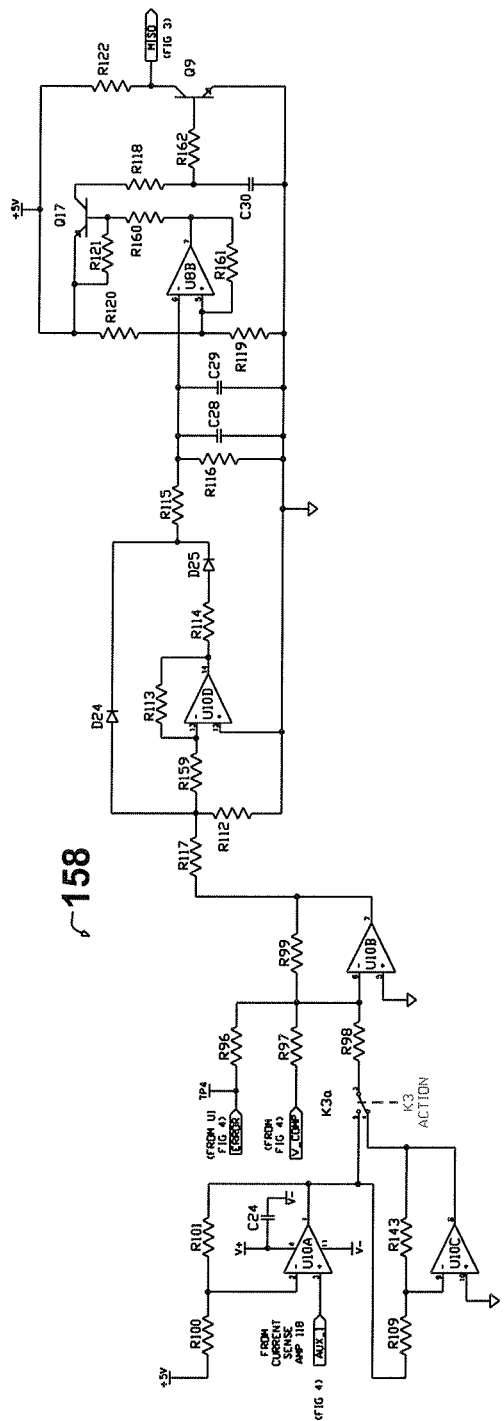
FIG. 23 is a schematic diagram of a ground continuity monitor in accordance with another embodiment of the present invention.

Referring to FIG. 23 an alternate ground continuity monitor is shown. In particular, FIG. 23 is a modification of the ground continuity monitor depicted in FIG. 9. Again, please note that the voltage at V_COMP is comprised of at least three components. These three components are functions of the ground fault leakage current; the voltage drop (IR) in the neutral conductor due to the load current, and the background current generated by background circuit R172, R151, and R173. Like FIG. 9, the present embodiment employs V_COMP as the input signal used to detect a discontinuity in the line ground conductor. FIG. 23 is a modification of FIG. 9 in that it subtracts the components in V_COMP related to the voltage drop (IR) in the neutral conductor and the voltage due to the background current. Thus, the only voltage component remaining in V_COMP is due to the impedance of the line ground conductor (i.e., Rgnd).

In particular, V_COMP is provided to the ground continuity circuit 158 by resistor R97. Also, the background component and the ground fault leakage current component are provided to the ground continuity circuit 158 by the ERROR pin. Finally, the signal corresponding to the load current input is provided by the AUX I pin which is also coupled to the output of the current sense amplifier 116/118 depicted in FIG. 4. The signal from amplifier 118 is proportional to the load current. Thus, when the charging station is in a charge cycle, the AUX I signal can also be quite large. Note that the AUX I signal propagates through resistor R98 which scales the voltage signal (i.e., the output of amplifier U10B) based on an assumed average value of the lumped impedance of the neutral conductor, which in reality, is unknown because it changes from installation to installation. Each of these signals are combined at the input of amplifier U10B whose output voltage is in accordance with the following equation:

$$V_{Rgnd} = V\_COMP - V_{IR} - (V_{Background+} V_{ground\ fault\ leakage}) \quad \text{(Equation 6)}$$

Thus, $V_{Rgnd}$ is directed into the next stage of ground continuity monitor 158, which is comprised of inverting amplifier U10D. Diodes D24 and D25 provide a fully rectified signal to an accumulator circuit that includes resistor R116 and capacitors C28 and C29. The accumulator is configured to store the average DC voltage of the full wave rectified output of amplifier U10D. The output of the accumulator is provided to the negative input of comparator U8B. The positive input of comparator U8B is fixed at a reference value that is indicative of the impedance threshold of the line ground conductor. Thus, if the accumulator value exceeds the reference value, the output of comparator U8B will be driven LOW such that Q17 is turned ON. When transistor Q17 is turned ON, transistor Q9 will be turned ON in response thereto, to thereby signal a ground continuity fault. The digital output of Q9 is provided to processor 126 via pin MISO.

The embodiment of FIG. 23 addresses a concern that a very high IR drop in the neutral conductor could be misinterpreted by the ground continuity monitor 158 as a ground discontinuity fault and cause circuit interrupter 130 to nuisance trip. To substantially obviate the problem, the ground continuity monitor 158 subtracts the large IR voltage drop in the neutral conductor that may occur during an electric vehicle charging cycle. The embodiment of FIG. 23 also addresses a concern that a ground fault current could also be misinterpreted as a ground discontinuity fault. As noted above, the voltage due to this fault signal is also subtracted at the input of amplifier U10B to substantially eliminate the risk of a false ground discontinuity result due to this voltage component. As a result, only the ground discontinuity signal ($V_{Rgnd}$) is provided from amplifier U10B.

Figure 24:
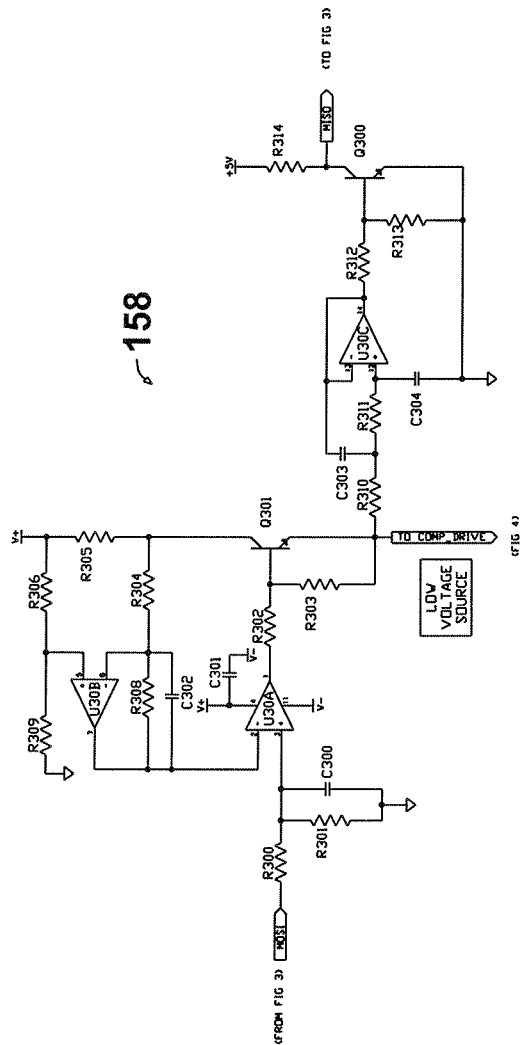
FIG. 24 is a schematic diagram of a ground continuity monitor in accordance with yet another embodiment of the present invention.

Referring to FIG. 24, another embodiment of a ground continuity monitor 158 is shown. This embodiment is configured to test ground continuity by using a relatively large amount of test current vis á vis the ground continuity monitor embodiments previously described herein. This greater magnitude allows the ground continuity monitor to detect and respond to a lower value of ground resistance, e.g. 20 Ohms in the line ground conductor. In one embodiment, the test current amplitude has a value within a range of about 100 mA to 1 A. However, the present embodiment is designed such that the higher currents are not detected by an upstream GFCI and cause it to nuisance trip.

First, the test signal is chosen to be a pure DC current with little or no ripple (an upstream GFCI detects differential current using a transformer so is insensitive to DC differential current.) The DC test current signal must not become modulated by the AC voltage drop in the neutral conductor. The DC current needs to be gradually initiated and gradually terminated so as not create a transient condition having AC components. The test signal must remain relatively steady even though there is an AC voltage source (the IR drop in the neutral conductor). This last consideration is achieved by providing the test current via a current source. Finally, the test signal must be relatively stable for DC voltage drops (at least) up to the trip threshold value of the ground continuity monitor. Otherwise an AC component could be added into the test current. This final consideration is addressed by driving the current source from a suitably high DC voltage source. Thus, in one implementation of this embodiment, the current source in ground continuity monitor 158 is supplied by a 15 VDC source from power supply 108 whereas the DC voltage drop corresponding to the trip threshold is only 2 VDC.

With the above criteria in mind, ground continuity monitor 158 works as follows. Processor 126 provides a pulse width modulated square wave via the MOSI pin to resistor R300. The square wave signal starts out with a relatively low duty cycle that linearly increases over an interval of about one second to a predetermined steady value that also endures for about 1 second. Afterwards, output signal MOSI gradually returns the duty cycle over another 1 second interval to the relatively low duty cycle. The RC input circuit (R301, C300) is a low pass filter that provides a DC average of the square wave input to the positive input of amplifier U30A. Thus, as the duty cycle of the square wave is changed, the DC average voltage will vary from 0 VDC to a maximum DC voltage and back down again to provide a "ramped" pulse. The filtered output is a signal pulse that includes a lead-in "up-ramp" portion, a steady region, and a trailing "down-ramp" portion. The pulse is provided to the input of amplifier U30A. Amplifiers (U30A, U30B) and transistor Q301 actively convert this voltage to an output test current provided on the COMP_DRIVE pin. The shape of the test current is proportional to the voltage signal, i.e., it is a ramped current pulse. Thus, the output current also has a smooth lead-in ramp, steady portion, and trailing ramp. Since the lead-in and trailing ramps of the test current are gradual, there are no transient effects that would cause an upstream GFCI to nuisance trip. The voltage drop in the wire loop is detected by a low pass filter circuit comprised of amplifier U30C and network (R310, C303, R311, and C304.) If the voltage drop exceeds a predetermined value, transistor Q300 turns ON to signify a ground discontinuity fault. The transistor Q300 output is carried by pin MISO which alerts processor 126 to the fault condition. One feature of this embodiment relates to the fact that processor 126 can determine when the ground continuity test current is in its steady state region by comparing the test current to the duty cycle of the input signal on MOSI pin. Thus, it knows when to read the MISO pin and avoids any false readings due to electrical instability. In an alternate embodiment, processor 126 requests a second reading to take place to make sure that the grounding circuit is electrically stable.

All references, including publications, patent applications, and patents, cited herein are hereby incorporated by reference to the same extent as if each reference were individually and specifically indicated to be incorporated by reference and were set forth in its entirety herein.

Those of ordinary skill in the art will understand that the embodiment of FIG. 24 may be employed in conjunction with the other ground continuity embodiments disclosed herein. As noted above, the embodiment of FIG. 24 directs a relatively high current signal into a current path that includes the line ground conductor to detect line ground impedances as low as approximately 20 Ohms. Of course, it may be deemed impractical from a power consumption standpoint to employ the high amperage test signal provided by the instant embodiment on a continual basis. Thus, if one uses the embodiment of FIG. 24 is conjunction with one of the other embodiments described herein, one obtains the best of both worlds. The high amperage test may be employed upon initialization, and the relatively low current ground continuity test performed thereafter on a continual basis to ensure that ground continuity has been maintained.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A protective device configured to be coupled between an AC power source and an electrical load, the AC power source including at least one hot conductor and a ground conductor connected to earth ground, the device comprising:
    an input device configured to be coupled to the AC power source, the input device comprising a plurality of line contacts including at least one hot line contact configured to be coupled to the at least one hot conductor and a line-side ground contact configured to be coupled to the ground conductor;
    an output device including a plurality of load contacts configured to be coupled to the electrical load, the plurality of load contacts including at least one hot load contact and a load-side ground contact, the output device being configured to provide the electrical load with AC electric power received via the input device from the AC power source;

a ground continuity monitor coupled to the ground conductor, the ground continuity monitor being configured to detect a ground discontinuity condition in the ground conductor, wherein the ground conductor is substantially isolated from the electrical load during at least one period of time during which the ground continuity monitor is configured to detect a ground discontinuity, the ground conductor being subsequently connected to the electrical load upon failing to detect a ground discontinuity during the at least one period of time;

a circuit interrupter mechanism coupled to the ground continuity monitor, the circuit interrupter mechanism being configured to interrupt electrical continuity between the at least one hot line contact and the at least one hot load contact in a tripped state and establish electrical continuity between the at least one hot line contact and the at least one hot load contact in a reset state; and a self-test circuit coupled to the ground continuity monitor and configured to perform a simulated ground continuity test that simulates the ground discontinuity condition, the self-test circuit providing a test failure signal when the ground continuity monitor fails to provide an output signal in response to the simulated ground continuity test, the circuit interrupter mechanism being configured to trip in response to the test failure signal.

2. The device of claim 1, wherein the simulated ground continuity test is performed from time-to-time when the circuit interrupter mechanism is in the reset state and the source of electrical power is coupled to the electrical load.

3. The device of claim 1, wherein the ground continuity monitor detects the ground discontinuity condition by propagating both a continuous test current and a recurring test current through the ground conductor.

4. The device of claim 1, further including a conditioning circuit configured to propagate a conditioning signal via the ground conductor in response to a ground fault condition, the ground continuity monitor being disabled by the self-test circuit to prevent the ground continuity monitor from interpreting the conditioning signal as the ground discontinuity condition.

5. The device of claim 4, wherein the conditioning signal includes a signal component that is proportional to a ground fault current or a simulated ground fault current.

6. The device of claim 4, wherein the conditioning signal includes a signal component that is configured to substantially null a current component being propagated in the ground conductor.

7. The device of claim 6, wherein the plurality of line contacts includes a neutral conductor coupled to the AC power source, the current component being a function of a voltage drop in the neutral conductor.

8. The device of claim 4, wherein the conditioning signal is propagated at a time when the simulated ground continuity test is not being performed.

9. The device of claim 4, wherein the self-test circuit performs a test configured to determine whether the conditioning circuit is in an end-of-life state.

10. The device of claim 4, further comprising a ground fault detector configured to detect a ground fault condition via an output signal provided by the conditioning circuit.

11. The device of claim 10, wherein the self-test circuit is configured to conduct a simulated ground fault test or a simulated grounded neutral test and provide an end-of-life alarm if the ground fault detector fails to respond to the self-test within a predetermined period of time or within a predetermined number of self-test attempts.

12. The device of claim 10, wherein the ground fault condition is sensed by monitoring a differential signal.

13. The device of claim 1, further comprising at least one electrical test contact coupled to the circuit interrupter mechanism, the self-test circuit being configured to detect a welded contact condition in the circuit interrupter mechanism when there is not a predetermined voltage between the at least one electrical test contact and a reference potential when the circuit interrupter is in the tripped state.

14. The device of claim 13, wherein the at least one test contact includes a set of test contacts, one test contact of the set of test contacts being at the reference potential.

15. The device of claim 1, wherein the circuit interrupter includes a set of electrical interrupting contacts between the plurality of line contacts and the plurality of load contacts, the set of electrical contacts include a hot interrupting contact arrangement between a hot line contact and a hot load contact and a neutral interrupting contact arrangement between a neutral line contact and a neutral load contact, and wherein the device further comprises a first set of electrical test contacts coupled to the hot interrupting contact arrangement and a second set of electrical test contacts coupled to the neutral interrupting contact arrangement.

16. The device of claim 15, wherein the self-test circuit is configured to interrogate a contact of the first set of electrical contacts to determine if the hot interrupting contact arrangement is welded.

17. The device of claim 16, wherein the self-test circuit is configured to monitor a voltage between the first set of electrical contacts and the second set of electrical contacts for the presence of a weld indication voltage.

18. The device of claim 16, wherein the first set of electrical test contacts are coupled to the line hot conductor in the tripped state if the hot contact arrangement is not welded.

19. The device of claim 15, wherein the self-test circuit is configured to interrogate a contact of the second set of electrical contacts to determine if the neutral interrupting contact arrangement is welded.

20. The device of claim 19, wherein the self-test circuit is configured to monitor the second set of electrical contacts for the presence of a weld indication voltage therebetween.

21. The device of claim 20, wherein the second set of electrical test contacts are coupled to the line neutral contact in the tripped state if the neutral contact arrangement is not welded.

22. The device of claim 1, wherein the self-test circuit permits the circuit interrupter to enter the reset state when an end of life condition is not detected.

23. The device of claim 1, wherein the self-test circuit is configured to detect that at least a portion of circuit interrupter mechanism is welded without the circuit interrupter mechanism being in a tripped state.

24. The device of claim 1, wherein the self-test circuit is configured to detect that at least a portion of circuit interrupter mechanism is welded when the circuit interrupter mechanism is in a tripped state, the tripped state being maintained if a welded condition is detected.

25. The device of claim 1, wherein the input device comprises an electrical connector that includes the plurality of line contacts therein.

26. The device of claim 25, wherein the electrical connector is disposed at an end of an electrical cable assembly.

27. The device of claim 1, wherein the output device comprises an electrical connector that includes the plurality of load contacts therein.

28. The device of claim 27, wherein the electrical connector is disposed at an end of an electrical cable assembly.

29. The device of claim 1, wherein the self-test circuit is configured to initiate the simulated ground continuity test when a predetermined period of time has elapsed after a predetermined system event.

30. The device of claim 29, wherein the predetermined system event includes energizing the protective device via the AC power source.

31. The device of claim 29, wherein the predetermined system event includes coupling the load to the ground conductor.

32. The device of claim 1, wherein the self-test performs the simulated ground continuity test as an initial pass-fail test, the outcome of the pass-fail test being employed by the self-test circuit as an initial determination of protective device operability.

33. The device of claim 32, wherein the protective device operability is determined by performing a self-test selected from a group of self-tests including the simulated ground continuity test, a ground fault self-test, a grounded neutral fault self-test, an arc fault self-test, or a welded contact self-test.

34. The device of claim 1, further comprising a reverse polarity detection circuit that allows the ground continuity monitor to detect a ground discontinuity condition in the ground conductor even when there is a reverse polarity condition.

35. A protective device configured to be coupled between an AC power source and an electrical load, the AC power source including at least one hot conductor and a ground conductor connected to earth ground, the device comprising:
- an input device configured to be coupled to the AC power source, the input device including a plurality of line contacts including at least one hot line contact configured to be coupled to the at least one hot conductor and a line-side ground contact configured to be coupled to the ground conductor;
- an output device including a plurality of load contacts configured to be coupled to the electrical load, the plurality of load contacts including at least one hot load contact and a load-side ground contact, the output device being configured to provide the electrical load with AC electric power received via the input device from the AC power source;
- at least one fault detection circuit coupled between the input device and the output device, the at least one fault detection circuit including a ground continuity monitor coupled to the ground conductor, the ground continuity monitor being configured to detect a ground discontinuity condition in the ground conductor;
- a circuit interrupter mechanism coupled to the at least one fault detection circuit, the circuit interrupter mechanism configured to interrupt electrical continuity between the at least one hot line contact and the at least one hot load contact in a tripped state and establish electrical continuity between the at least one hot line contact and the at least one hot load contact in a reset state; and
- a self-test circuit coupled to the ground continuity monitor, the self-test circuit being configured to perform a simulated ground continuity test and provide a test failure signal if the ground continuity monitor fails to respond to the simulated ground continuity test, the circuit interrupter mechanism being configured to trip in response to the test failure signal.

36. The device of claim 35, wherein simulated ground continuity test is performed from time-to-time when the circuit interrupter mechanism is in the reset state and the source of electrical power is coupled to the electrical load.

37. The device of claim 35, wherein the ground continuity monitor detects the ground discontinuity condition by propagating both a continuous test current and a recurring test current through the ground conductor.

38. The device of claim 35, wherein the at least one fault detection circuit includes a ground fault detector configured to detect a ground fault condition.

39. The device of claim 38, wherein the self-test circuit is configured to conduct a simulated ground fault test or a simulated grounded neutral test, the self-test circuit being further configured to provide an end-of-life alarm if the ground fault detector or the ground continuity monitor fail to respond to the self-test within a predetermined period of time or within a predetermined number of self-test attempts.

40. The device of claim 39, wherein the simulated ground fault test includes providing a simulated grounded neutral fault condition.

41. The device of claim 39, wherein the simulated ground fault test is employed by the self-test circuit to determine whether the ground continuity monitor or the ground fault detector are in an end-of-life state.

42. The device of claim 39, wherein the self-test circuit is configured to determine whether the circuit interrupter mechanism has failed due to a welded contact condition in the circuit interrupter mechanism before performing a self-test of the at least one fault detection circuit.

43. A protective device configured to be coupled between an AC power source and an electrical load, the AC power source including at least one hot conductor, a neutral conductor and a ground conductor connected to earth ground, the device comprising:
- an input device configured to be coupled to the AC power source, the input device comprising a plurality of line contacts including at least one hot line contact configured to be coupled to the at least one hot conductor, a line neutral contact configured to be coupled to the neutral conductor, and a line-side ground contact configured to be coupled to the ground conductor;
- an output device including a plurality of load contacts configured to be coupled to the electrical load, the plurality of load contacts including at least one hot load contact, a neutral load contact and a load-side ground contact, the output device being configured to provide the electrical load with AC electric power received via the input device from the AC power source;
- a ground continuity monitor coupled to the ground conductor, the ground continuity monitor including a continuity monitoring circuit formed by at least a portion of the ground conductor and at least a portion of the neutral conductor, the ground continuity monitor being configured to propagate a monitor signal in the continuity monitoring circuit, the ground continuity monitor being configured to detect a ground discontinuity condition in the ground conductor by monitoring at least one monitor signal parameter;
- a circuit interrupter mechanism coupled to the ground continuity monitor, the circuit interrupter mechanism being configured to interrupt electrical continuity between the at least one hot line contact and the at least one hot load contact in a tripped state and establish electrical continuity between the at least one hot line contact and the at least one hot load contact in a reset state; and a self-test circuit coupled to the ground continuity monitor, the self-test circuit being configured to generate a simulated monitor signal parameter indicative of a simulated ground continuity fault, the self-test circuit providing a test failure signal when the ground continuity monitor fails to detect the simulated monitor signal parameter.

44. The device of claim 43, wherein the circuit interrupter mechanism is tripped in response to the test failure signal.

45. The device of claim 43, wherein the monitor signal is comprised of a continuous test current and a recurring test current.

* * * * *

UNITED STATES PATENT AND TRADEMARK OFFICE
CERTIFICATE OF CORRECTION

PATENT NO. : 9,948,087 B2
APPLICATION NO. : 13/793135
DATED : April 17, 2018
INVENTOR(S) : Haines et al.

Page 1 of 1

It is certified that error appears in the above-identified patent and that said Letters Patent is hereby corrected as shown below:

In the Claims

Column 58, Line 55, Claim 23 insert --the-- between "of" and "circuit"
Column 58, Line 59, Claim 24 insert --the-- between "of" and "circuit"

Signed and Sealed this
Eighteenth Day of September, 2018

Andrei Iancu
*Director of the United States Patent and Trademark Office*